(12) United States Patent
Takekida

(10) Patent No.: US 11,744,067 B2
(45) Date of Patent: Aug. 29, 2023

(54) SEMICONDUCTOR MEMORY DEVICE

(71) Applicant: KIOXIA CORPORATION, Tokyo (JP)

(72) Inventor: Hideto Takekida, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 531 days.

(21) Appl. No.: 16/794,022

(22) Filed: Feb. 18, 2020

(65) Prior Publication Data

US 2021/0091100 A1 Mar. 25, 2021

(30) Foreign Application Priority Data

Sep. 20, 2019 (JP) .................................. 2019-171693

(51) Int. Cl.
*G11C 16/08* (2006.01)
*H10B 41/35* (2023.01)
*H01L 25/065* (2023.01)
*H10B 41/20* (2023.01)

(52) U.S. Cl.
CPC ............ *H10B 41/35* (2023.02); *G11C 16/08* (2013.01); *H01L 25/0657* (2013.01); *H10B 41/20* (2023.02)

(58) Field of Classification Search
USPC ........................................................ 257/372
See application file for complete search history.

(56) References Cited

U.S. PATENT DOCUMENTS

| | | | |
|---|---|---|---|
| 8,969,945 B2 | 3/2015 | Kito | |
| 9,905,514 B2 | 2/2018 | Tanzawa | |
| 9,953,992 B1 | 4/2018 | Ogawa | |
| 10,269,817 B2 | 4/2019 | Ogawa | |
| 10,297,578 B2 | 5/2019 | Tagami et al. | |
| 10,373,970 B2 | 8/2019 | Lee | |
| 10,446,575 B2 | 10/2019 | Kim | |
| 2017/0256551 A1 | 9/2017 | Lee | |
| 2017/0294383 A1 | 10/2017 | Tanzawa | |
| 2018/0145029 A1 | 5/2018 | Tanzawa | |
| 2018/0261575 A1* | 9/2018 | Tagami | H10B 41/10 |
| 2018/0350825 A1 | 12/2018 | Ogawa | |
| 2019/0139977 A1 | 5/2019 | Lee | |
| 2019/0139978 A1 | 5/2019 | Kim | |
| 2019/0287995 A1 | 9/2019 | Oike | |
| 2021/0057336 A1 | 2/2021 | Shao | |
| 2021/0134827 A1 | 5/2021 | Iwai | |
| 2021/0143169 A1 | 5/2021 | Lee | |

FOREIGN PATENT DOCUMENTS

| | | | | |
|---|---|---|---|---|
| JP | 2004253730 A | * | 9/2004 | ......... G11C 11/4125 |
| JP | 2015159287 A | * | 9/2015 | ......... H01L 31/0201 |
| JP | 2018148071 A | | 9/2018 | |

* cited by examiner

*Primary Examiner* — Hrayr A Sayadian
(74) *Attorney, Agent, or Firm* — Kim & Stewart LLP

(57) ABSTRACT

According to one embodiment, a semiconductor memory device includes a first cell region including a plurality of memory cells, a second cell region including a plurality of memory cells, a connection region between the first cell region and the second cell region, and a row decoder for propagating a voltage to word lines in the first and second cell regions via the connection region.

20 Claims, 55 Drawing Sheets

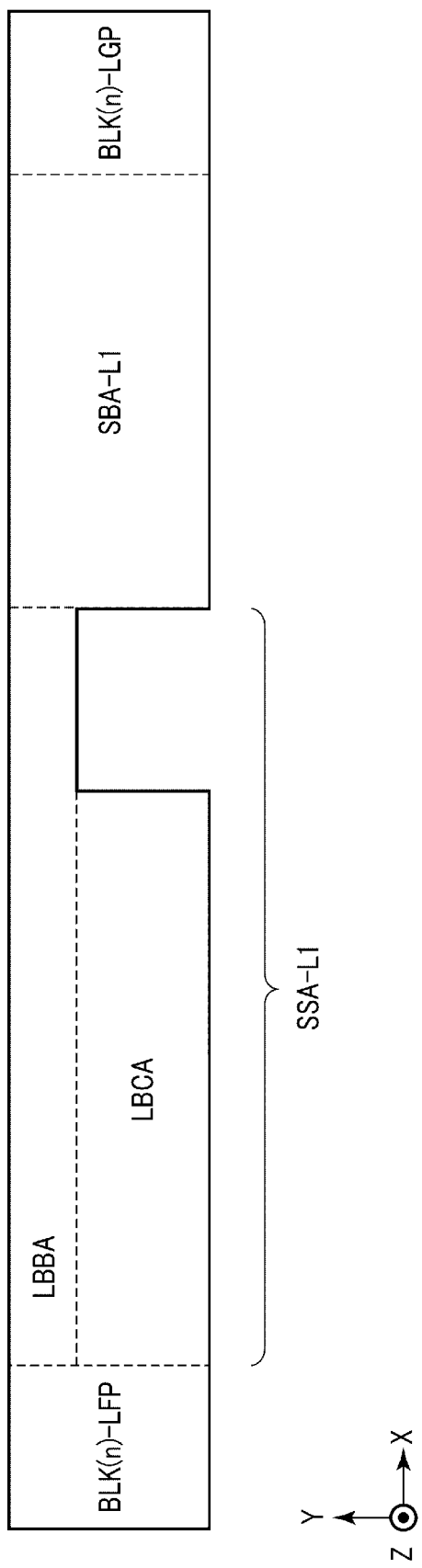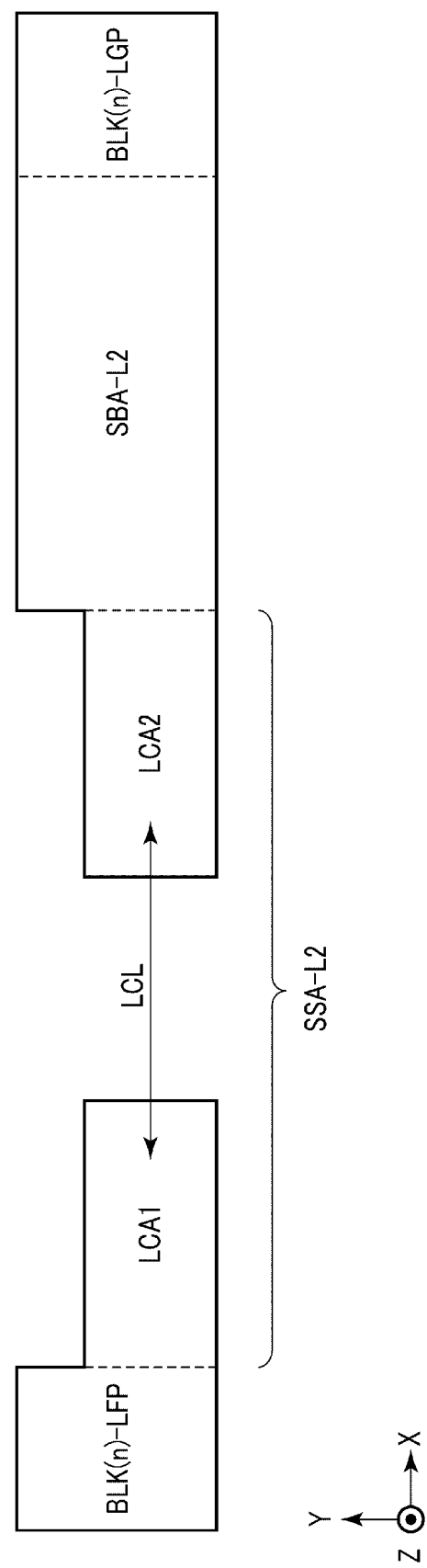

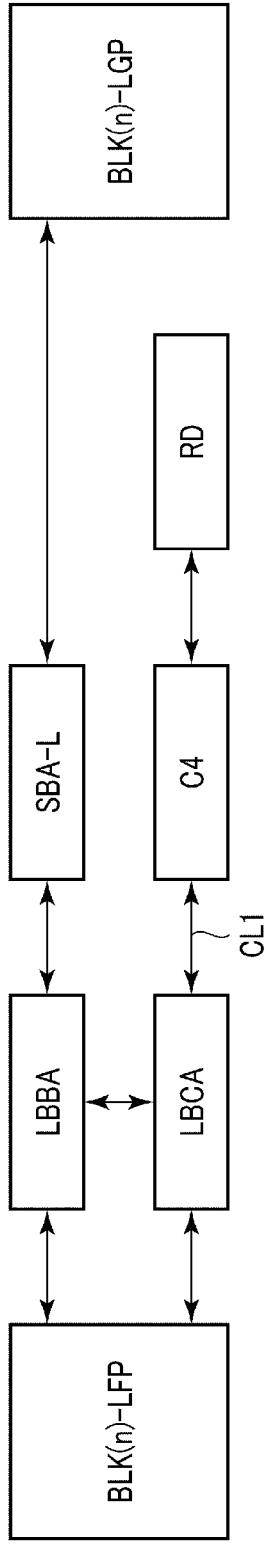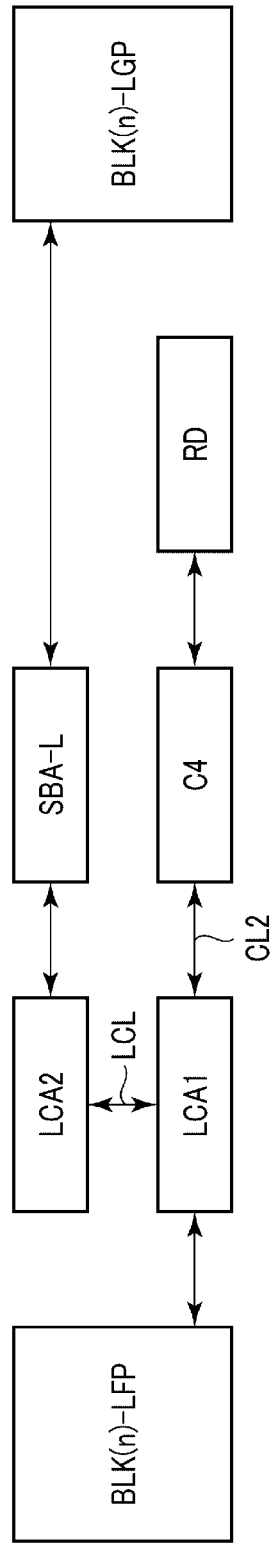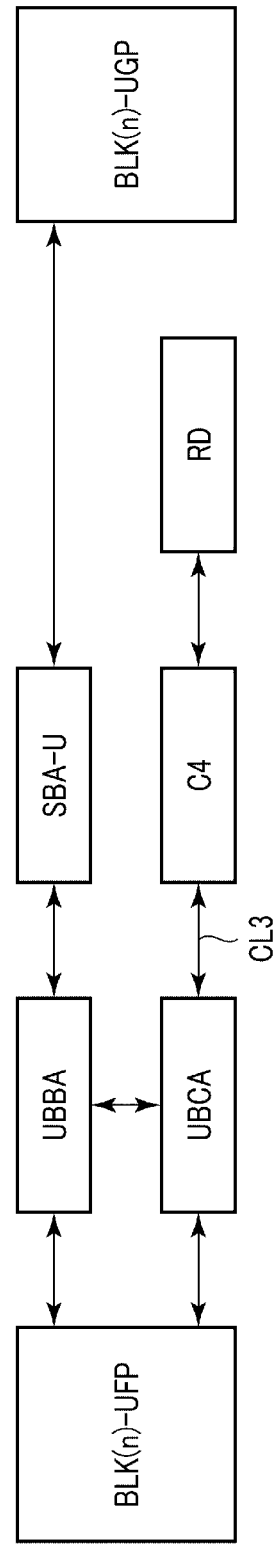

FIG. 36
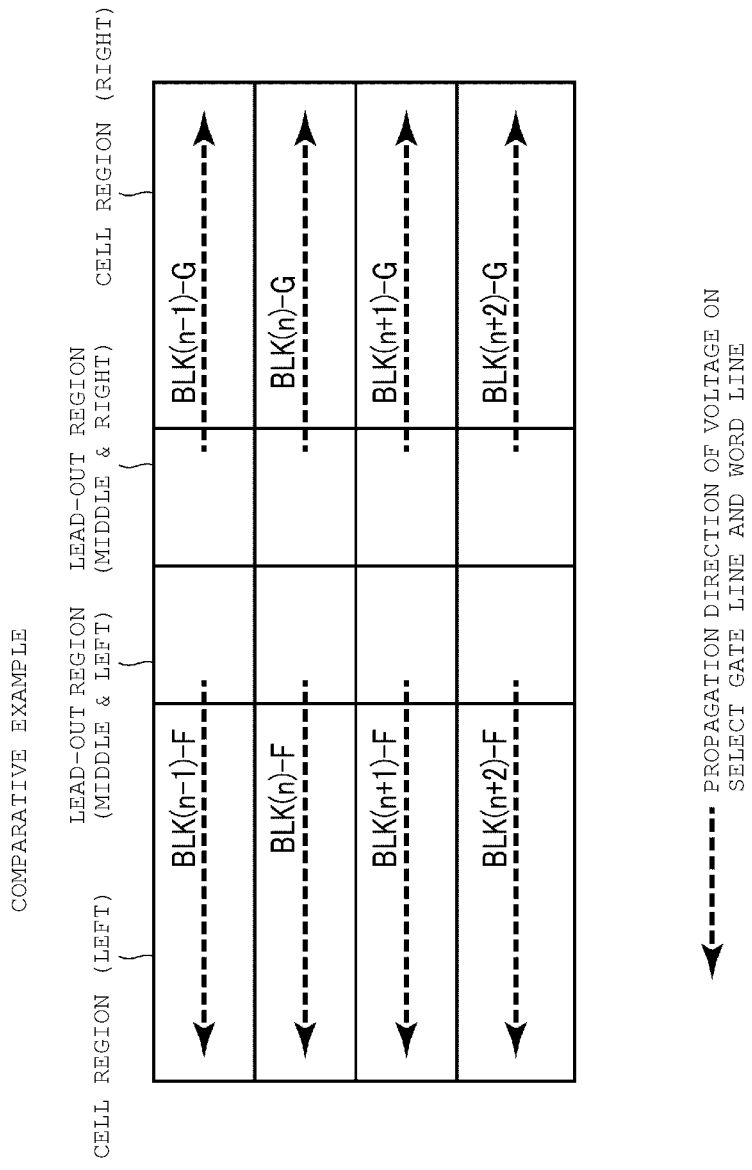
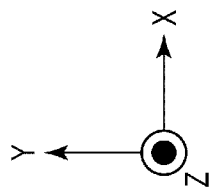

FIG. 38
FIRST EMBODIMENT
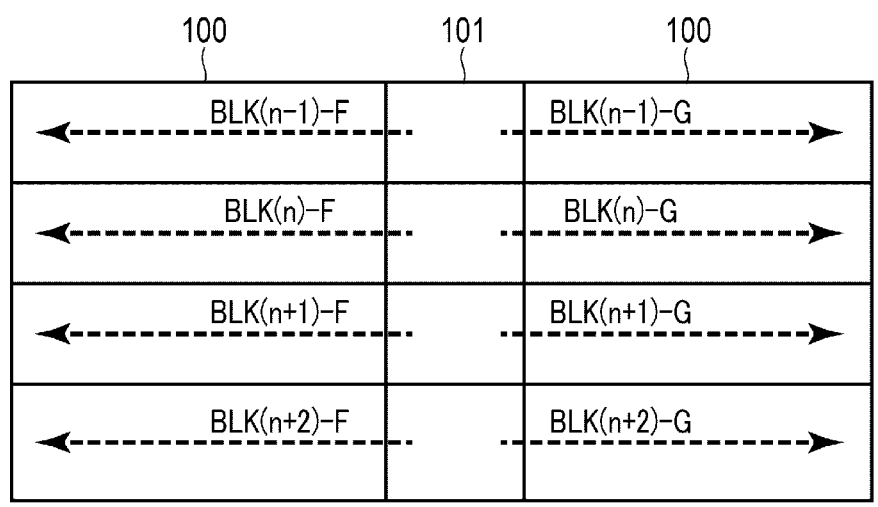
◀------ PROPAGATION DIRECTION OF VOLTAGE ON
         SELECT GATE LINE AND WORD LINE
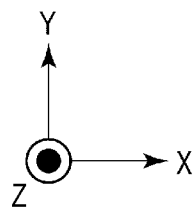

FIG. 39
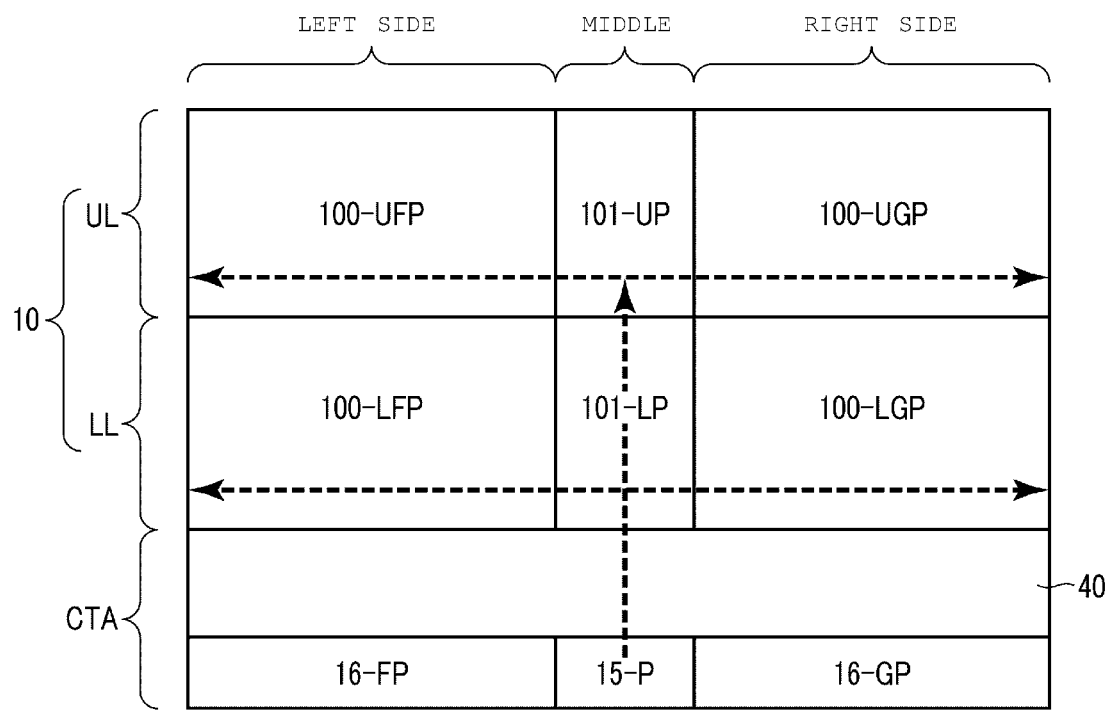
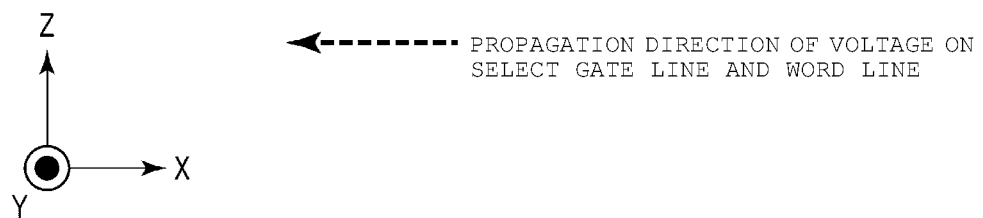

SEMICONDUCTOR MEMORY DEVICE

CROSS-REFERENCE TO RELATED APPLICATION

This application is based upon and claims the benefit of priority from Japanese Patent Application No. 2019-171693, filed Sep. 20, 2019, the entire contents of which are incorporated herein by reference.

FIELD

Embodiments described herein relate generally to a semiconductor memory device.

BACKGROUND

A NAND flash memory capable of storing data in a nonvolatile manner is known.

DESCRIPTION OF THE DRAWINGS

FIG. 9 illustrates a layout example of the connection region (lower) in a first lower layer.

FIG. 10 illustrates a layout example of the connection region (lower) in a second lower layer.

FIG. 14 is a block diagram illustrating connections of respective constitutional elements in the first lower layer.

FIG. 15 is a block diagram illustrating connections of respective constitutional elements in the second lower layer.

FIG. 16 is a block diagram illustrating connections of respective constitutional elements in the first upper layer.

FIG. 36 is another diagram illustrating the propagation direction of the voltage to the cell region according to the comparative example.

FIG. 38 is a diagram illustrating a propagation direction of a voltage to the cell region according to the first embodiment.

FIG. 39 is a diagram illustrating the propagation direction of the voltage to the cell region according to the first embodiment.

DETAILED DESCRIPTION

Figure 1:
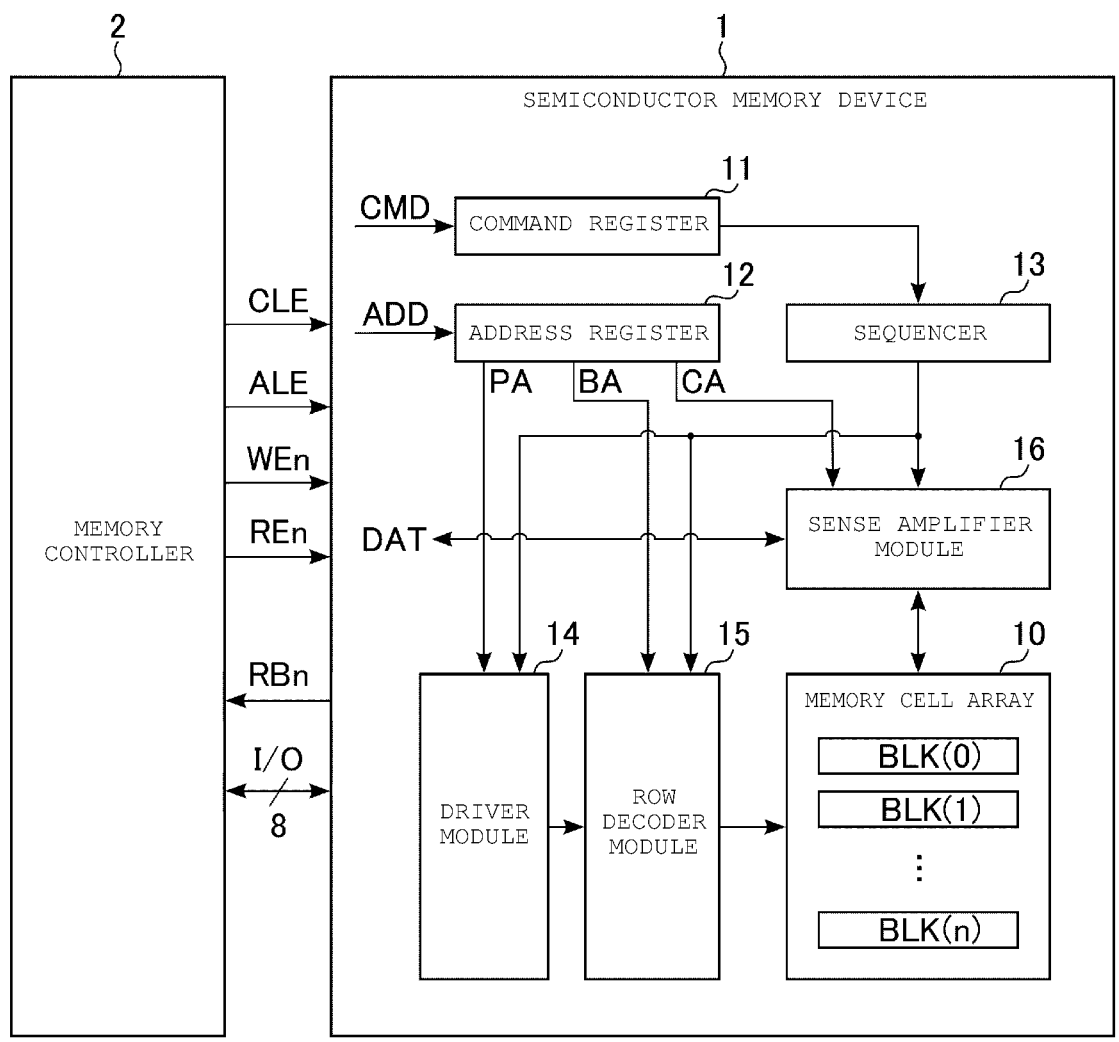
FIG. 1 is a block diagram illustrating an example of a configuration of a semiconductor memory device according to a first embodiment.

In general, according to one embodiment, a semiconductor memory device includes a first cell region having a plurality of memory cells, a second cell region having a plurality of memory cells, a connection region between the first cell region and the second cell region, and a row decoder for propagating a voltage to word lines of the first and second cell regions via the connection region.

Hereinafter, certain example embodiments of the present disclosure will be described with reference to the accompanying drawings. Embodiments provide an apparatus and a method incorporating the technical concepts of the present disclosure. The provided drawings are schematic and/or conceptual, and the dimensions and proportions of respective portions depicted therein are not necessarily the same as the actual values thereof in actual implementations of the technical concepts of the present disclosure. The technical concept(s) of the present disclosure is not necessarily limited to the depicted shapes, structures, arrangements, and the like of the elements/aspects as depicted in the drawings.

In the following description, elements and/or aspects having substantially the same functions and configurations as each other are denoted using the same reference labels. When a number is appended after letters of a reference label, the notation indicates the so-labeled element corresponds to a particular instance of the element type for which multiple instances may be included as described. In such cases, the appended numerals are used to distinguish between elements having a similar configuration. If it is not necessary to distinguish between elements of the same type, then each of such element can be referenced by the reference label including only the characters without inclusion of appended numerals.

1. First Embodiment

In the following, a semiconductor memory device 1 according to a first embodiment will be described.

1-1. Overall Configuration of Semiconductor Memory Device 1

1-1-1. Configuration Example

FIG. 1 illustrates a configuration example of the semiconductor memory device 1 according to the first embodiment. The semiconductor memory device 1 is a NAND flash memory capable of storing data in a nonvolatile manner, and is controlled by an external memory controller 2. Communication between the semiconductor memory device 1 and the memory controller 2 supports, for example, the NAND interface standard.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK(0) to BLK(n) (where n is an integer of 1 or more). The block BLK is a set of a plurality of memory cells capable of storing data in a nonvolatile manner, and is used as a data erase unit, for example. The memory cell array 10 is provided with a plurality of bit lines and a plurality of word lines. Each memory cell is associated with, for example, one bit line and one word line.

The command register 11 stores a command CMD received by the semiconductor memory device 1 from the memory controller 2. The command CMD includes an instruction for causing the sequencer 13 to execute a read operation, a write operation, an erasing operation, and the like, for example.

The address register 12 stores address information ADD received by the semiconductor memory device 1 from the memory controller 2. The address information ADD includes, for example, a block address BAdd, a page address PAdd, and a column address CAdd. For example, the block address BAdd, the page address PAdd, and the column address CAdd are used for selecting the block BLK, the word line, and the bit line, respectively.

The sequencer 13 controls the operation of the entire semiconductor memory device 1. For example, the sequencer 13 controls the driver module 14, the row decoder module 15, the sense amplifier module 16 and the like based on the command CMD stored in the command register 11, and executes a read operation, a write operation, an erasing operation, and the like.

The driver module 14 generates a voltage used in a read operation, a write operation, an erasing operation, and the like. The driver module 14 applies a generated voltage to a signal line corresponding to a selected word line based on, for example, the page address PAdd stored in the address register 12.

The row decoder module 15 includes a plurality of row decoders RD. The row decoder RD selects one block BLK in the corresponding memory cell array 10 based on the block address BAdd stored in the address register 12. Then, the row decoder RD transfers, for example, a voltage applied to the signal line corresponding to the selected word line to a selected word line in the selected block BLK.

In the write operation, the sense amplifier module 16 applies a desired voltage to each bit line according to the write data DAT received from the memory controller 2. In the read operation, the sense amplifier module 16 determines data stored in the memory cell based on the voltage of the bit line, and transfers the determination result to the memory controller 2 as read data DAT.

The semiconductor memory device 1 and the memory controller 2 described above may constitute one semiconductor device by a combination thereof. Examples of such a semiconductor device include a memory card such as an SD™ card and a solid state drive (SSD).

1-1-2. Circuit Configuration of Memory Cell Array

Figure 2:
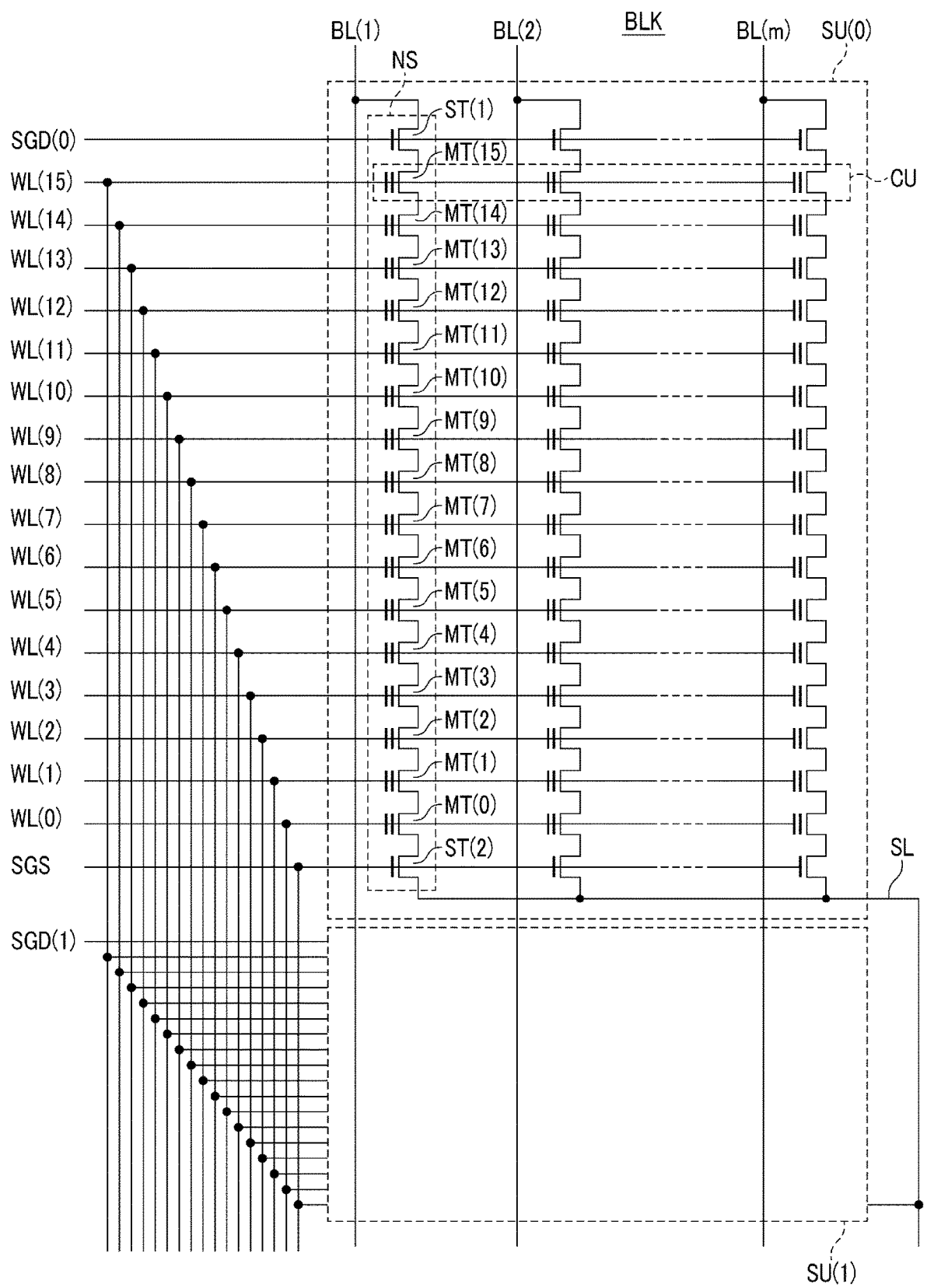
FIG. 2 is a circuit diagram illustrating an example of a circuit configuration of a memory cell array in the semiconductor memory device according to the first embodiment.

In FIG. 2, an example of a circuit configuration of the memory cell array 10 in the semiconductor memory device 1 according to the first embodiment illustrated, one block BLK is extracted from a plurality of blocks BLK in the memory cell array 10. As illustrated in FIG. 2, the block BLK includes a plurality of string units SU(0) to SU(k) (where k is an integer of 1 or more).

Each string unit SU includes a plurality of NAND strings NS respectively associated with the bit lines BL(0) to BL(m) (where m is an integer of 1 or more). Each NAND string NS includes, for example, memory cell transistors MT(0) to MT(15) and select transistors ST(1) and ST(2). The memory cell transistor MT includes a control gate and a charge storage layer, and stores data in a nonvolatile manner. Each of the select transistors ST(1) and ST(2) is used for selection of the string unit SU during various operations.

In each NAND string NS, the memory cell transistors MT (0) to MT(15) are connected in series. The drain of the select transistor ST(1) is connected to an associated bit line BL, and the source of the select transistor ST(1) is connected one ends of the memory cell transistors MT(0) to MT (15) connected in series. The drain of the select transistor ST(2) is connected to the other ends of the memory cell transistors MT (0) to MT(15) connected in series. The source of the select transistor ST(2) is connected to a source line SL.

In the same block BLK, control gates of the memory cell transistors MT (0) to MT(15) are commonly connected to word lines WL(0) to WL(7), respectively. The gates of the select transistors ST(1) in string units SU(0) to SU(k) are commonly connected to select gate lines SGD(0) to SGD(k), respectively. The gates of the select transistor ST(2) are commonly connected to a select gate line SGS.

In a circuit configuration of the memory cell array 10 described above, the bit line BL is shared by the NAND strings NS to which the same column address is assigned in each string unit SU. For example, the source line SL is shared among a plurality of blocks BLK.

A set of a plurality of memory cell transistors MT connected to a common word line WL in one string unit SU is denoted as a cell unit CU, for example. For example, a storage capacity of the cell unit CU including the memory cell transistors MT each storing 1-bit data is defined as "1-page data". The cell unit CU may have a storage capacity of 2-page data or more depending on the number of bits of data stored in the memory cell transistor MT.

The memory cell array 10 in the semiconductor memory device 1 according to the first embodiment is not limited to the circuit configuration described above. For example, the memory cell array 10 may be designed with any number of memory cell transistors MT and select transistors ST(1) and ST(2) in each NAND string NS. The memory cell array 10 may be designed with any number of string units SU in each block BLK.

1-2. Layout of Semiconductor Memory Device

The layout of the semiconductor memory device 1 will be described below.

In the drawings referred to below, the Y-direction corresponds to the extending direction of the bit line BL, the X-direction corresponds to the extending direction of the word line WL, and the Z-direction corresponds to a vertical direction with respect to a front surface of a semiconductor substrate 20 on which the semiconductor memory device 1 is formed. In the plan view, hatching is appropriately added to make the drawing easy to view. The hatching added to the plan view is not necessarily indicative of the material and/or characteristics of the constitutional element to which the hatching has been added.

1-2-1. Outline of Layout of Semiconductor Memory Device

Figure 3:
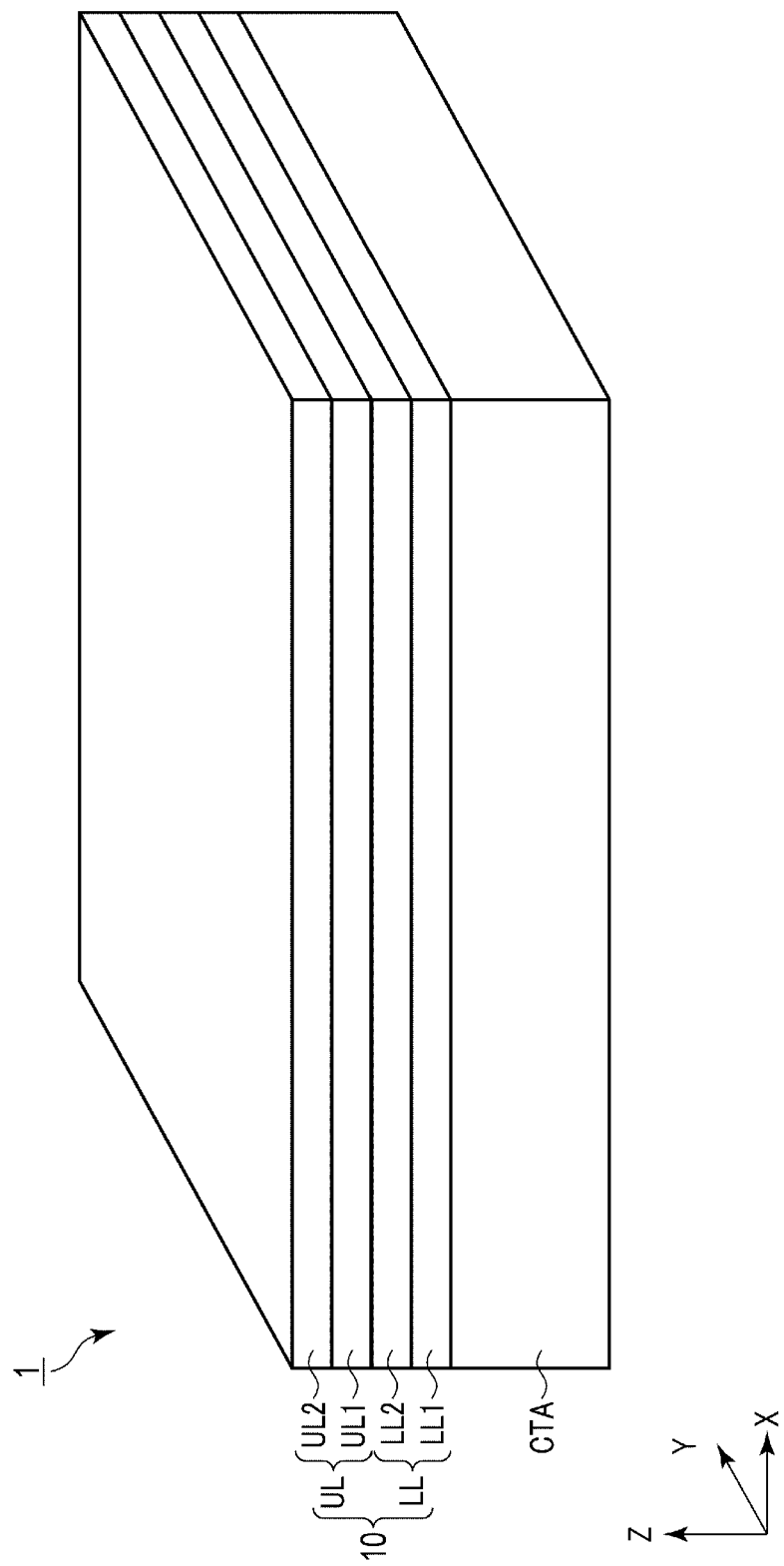
FIG. 3 is a simplified view of a layout of the semiconductor memory device in the Z-direction.

An outline of the layout of the semiconductor memory device 1 will be described with reference to FIG. 3. FIG. 3 is a bird's eye view that is simply illustrated for easy understanding of the layout of the semiconductor memory device 1 in the Z-direction.

As illustrated in FIG. 3, the semiconductor memory device 1 includes a circuit region CTA including the command register 11, the address register 12, the sequencer 13, the driver module 14, the row decoder module 15, and the sense amplifier module 16, and the memory cell array 10 provided on a circuit region CTA in the Z-direction. The memory cell array 10 includes a lower layer LL and an upper layer UL provided on the lower layer LL in the Z-direction. The lower layer LL includes a first lower layer LL1 and a second lower layer LL2 provided on the first lower layer LL1 in the Z-direction. Similarly, the upper layer UL includes a first upper layer UL1 and a second upper layer UL2 provided on the first upper layer UL1 in the Z-direction. Details of the first lower layer LL1, the second lower layer LL2, the first upper layer UL1, and the second upper layer UL2 will be described later.

1-2-2. Memory Cell Array Layout

1-2-2-1. Overview

Next, a layout focusing on a plane composed of the X-direction and the Y-direction of the memory cell array 10 will be described.

Figure 4:
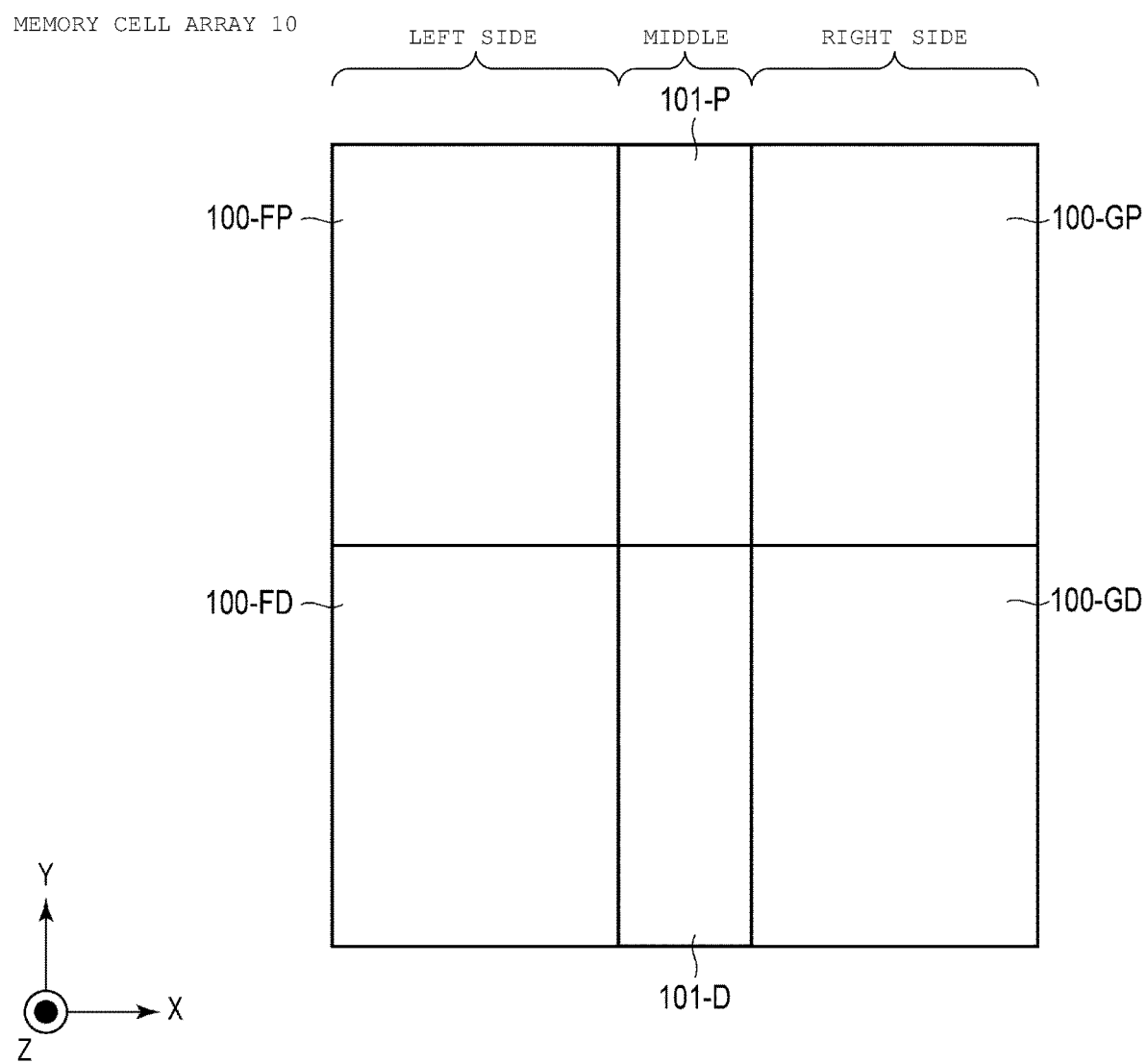
FIG. 4 illustrates a planar layout example of the memory cell array.

FIG. 4 illustrates a planar layout example of the memory cell array 10. For simplicity, FIG. 4 illustrates a rough layout including the first lower layer LL1, the second lower layer LL2, the first upper layer UL1, and the second upper layer UL2.

As illustrated in FIG. 4, the memory cell array 10 roughly includes a plurality of cell regions 100 and a plurality of connection regions 101. The cell region 100 is a region including the plurality of blocks BLK described above. The connection region 101 connects the blocks BLK of the cell region 100 sandwiching the connection region 101, and propagates a voltage from the row decoder module 15 to the select gate line and the word line of the block BLK.

As illustrated in FIG. 4, a plurality of cell regions 100, which are roughly located on the left side and the right side with respect to the paper surface of FIG. 4, are present. The connection region 101 is located between the left cell region 100 and the right cell region 100. That is, the connection region 101 is located in the middle of the memory cell array 10 in the X-direction. As illustrated in FIG. 4, the left cell region 100, the right cell region 100, and the connection region 101 sandwiched between the left and right cell regions 100 may be collectively described as "plane". For example, the semiconductor memory device 1 may include a plurality of planes, and may be controlled independently for each plane or in parallel.

Hereinafter, a layout example of the cell region 100 and the connection region 101 will be described.

Specifically, on the paper surface of FIG. 4, the cell regions 100 are located at four locations of upper left, upper right, lower left, and lower right. The expressions of "upper left", "upper right", "lower left", and "lower right" are expressions based on the paper surface of FIG. 4.

For convenience, the cell regions 100 located at the upper left, upper right, lower left, and lower right in the memory cell array 10 are respectively expressed as a cell region (upper left) 100-FP, a cell region (upper right) 100-GP, and a cell region (lower left) 100-FD, a cell region (lower right) 100-GD. When the four cell regions are not distinguished, the cell regions are simply expressed as cell regions 100.

The cell region (upper left) 100-FP and the cell region (lower left) 100-FD may share the bit line BL. Similarly, the cell region (upper right) 100-GP and the cell region (lower right) 100-GD may share the bit line BL.

As illustrated in FIG. 4, two connection regions 101 are present. The first connection region 101 is provided between the cell region (upper left) 100-FP and the cell region (upper right) 100-GP, and connects (short-circuits) the cell regions 100-FP and 100-GP. The second connection region 101 is provided between the cell region (lower left) 100-FD and the cell region (lower right) 100-GD, and connects (short-circuits) the cell regions 100-FD and 100-GD.

For convenience, the connection region 101 provided between the cell region (upper left) 100-FP and the cell region (upper right) 100-GP is denoted as a connection region (upper) 101-P. The connection region 101 provided between the cell region (lower left) 100-FD and the cell region (lower right) 100-GD is denoted as a connection region (lower) 101-D. When the two connection regions are not distinguished from each other, the connection regions are simply is denoted as the connection region 101.

1-2-2-2. Outline of Layout Relating to Lower Layer LL

Figure 5:
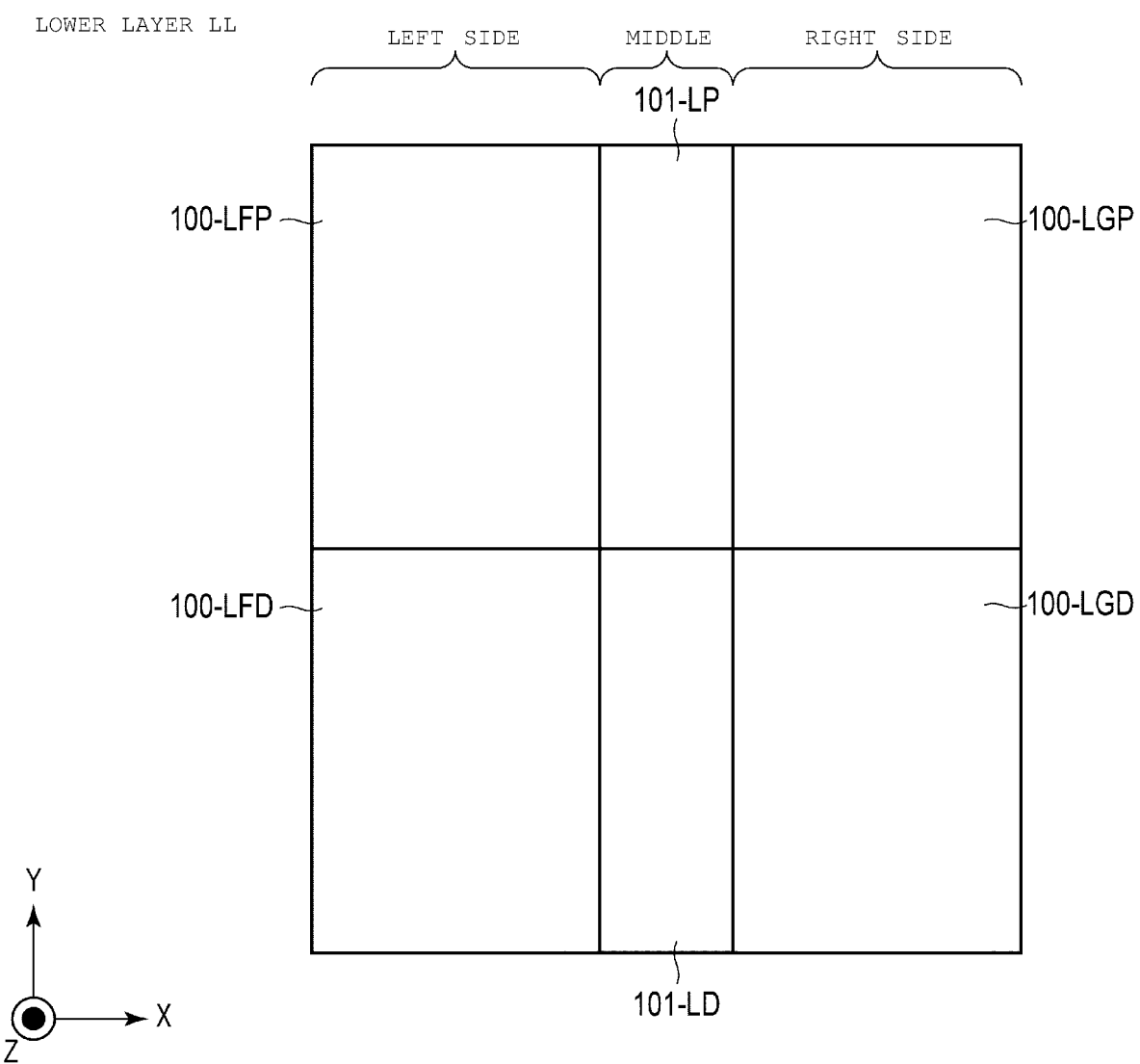
FIG. 5 illustrates a layout example relating to a lower layer of the memory cell array.

Next, an outline of the layout relating to the lower layer LL of the memory cell array 10 will be described with reference to FIG. 5. FIG. 5 illustrates a layout example relating to the lower layer LL of the memory cell array 10.

As illustrated in FIG. 5, the lower layer LL roughly includes the cell region 100 and the connection region 101. Hereinafter, the cell region 100 in the lower layer LL may be described as a cell region (lower). When the connection region 101 in the lower layer LL is illustrated, the connection region 101 may be described as a connection region (lower) 101.

Specifically, on the paper surface of FIG. 5, the cell regions (lower) 100 are located at four locations of upper left, upper right, lower left, and lower right. When the cell region (lower) 100 is illustrated, the expressions of "upper left", "upper right", "lower left", and "lower right" are expressions based on the paper surface of FIG. 5.

For convenience, the cell regions (lower) 100 located in the upper left, upper right, lower left, and lower right in the lower layer LL are denoted as a cell region (lower & upper left) 100-LFP, a cell region (lower & upper right) 100-LGP, a cell region (lower & lower left) 100-LFD, and a cell region (lower & lower right) 100-LGD, respectively.

As illustrated in FIG. 5, two connection regions (lower) 101 are present. The first connection region (lower) 101 is provided between the cell region (lower & upper left) 100-LFP and the cell region (lower & upper right) 100-LGP, and connects (short-circuits) the cell regions 100-LFP and 100-LGP. The second connection region (lower) 101 is provided between the cell region (lower & lower left) 100-LFD and the cell region (lower & lower right) 100-LGD, and connects (short-circuits) the cell regions 100-LFD and 100-LGD.

For convenience, the connection region (lower) 101 provided between the cell region (lower & upper left) 100-LFP and the cell region (lower & upper right) 100-LGP is denoted as a connection region (lower & upper) 101-LP. The connection region (lower) 101 provided between the cell region (lower & lower left) 100-LFD and the cell region (lower & lower right) 100-LGD is denoted as a connection region (lower & lower) 101-LD.

1-2-2-3. Outline of Layout Relating to Upper Layer UL

Figure 6:
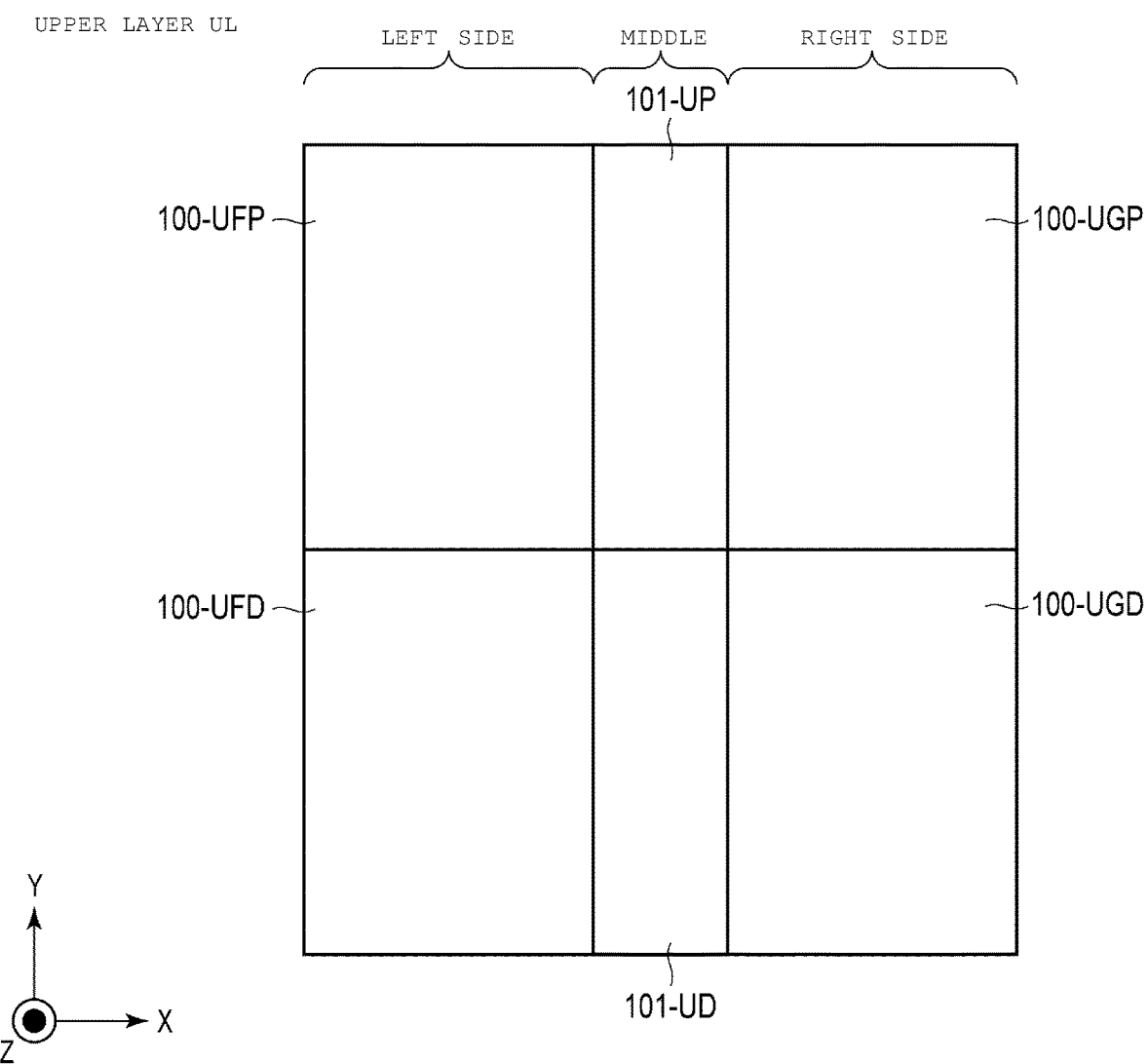
FIG. 6 illustrates a layout example relating to an upper layer of the memory cell array.

Next, an outline of a layout relating to the upper layer UL of the memory cell array 10 will be described with reference to FIG. 6. FIG. 6 illustrates a layout example relating to the upper layer UL of the memory cell array 10.

As illustrated in FIG. 6, the upper layer UL roughly includes the cell region 100 and a connection region (upper) 101. Hereinafter, when the cell region 100 in the upper layer UL is illustrated, the cell region 100 may be described as a cell region (upper). When the connection region 101 in the upper layer UL is illustrated, the connection region 101 may be described as a connection region (upper) 101.

Specifically, on the paper surface of FIG. 6, the cell regions (upper) 100 are located at four locations of upper left, upper right, lower left, and lower right. When the cell region (upper) 100 is illustrated, the expressions such as upper left, upper right, lower left, and lower right are expressions based on the paper surface of FIG. 6.

For convenience, the cell regions (upper) 100 located in the upper left, upper right, lower left, and lower right in the upper layer UL are denoted as a cell region (upper & upper left) 100-UFP, a cell region (upper & upper right) 100-UGP, and a cell region (upper & lower left) 100-UFD, and a cell region (upper & lower right) 100-UGD, respectively.

The cell region (upper & upper left) 100-UFP and the cell region (upper & lower left) 100-UFD may share the bit line BL. Similarly, the cell region (upper & upper right) 100-UGP and the cell region (upper & lower right) 100-UGD may share the bit line BL.

As illustrated in FIG. 6, two connection regions (upper) 101 are present. The first connection region (upper) 101 is provided between the cell region (upper & upper left) 100-UFP and the cell region (upper & upper right) 100-UGP, and connects (short-circuits) the cell regions 100-UFP and 100-UGP. The second connection region (upper) 101 is provided between the cell region (upper & lower left) 100-UFD and the cell region (upper & lower right) 100-UGD, and connects (short-circuits) the cell regions 100-UFD and 100-UGD.

For convenience, the connection region (upper & upper) 101-UP provided between the cell region (upper & upper left) 100-UFP and the cell region (upper & upper right) 100-UGP is denoted as a connection region (upper & upper) 101-UP. The connection region (upper & lower) 101-LD provided between the cell region (upper & lower left) 100-UFD and the cell region (upper & lower right) 100-UGD is denoted as a connection region (upper & lower) 101-LD.

1-2-2-4. Relationship Between Lower Layer LL and Upper Layer UL

Figure 7:
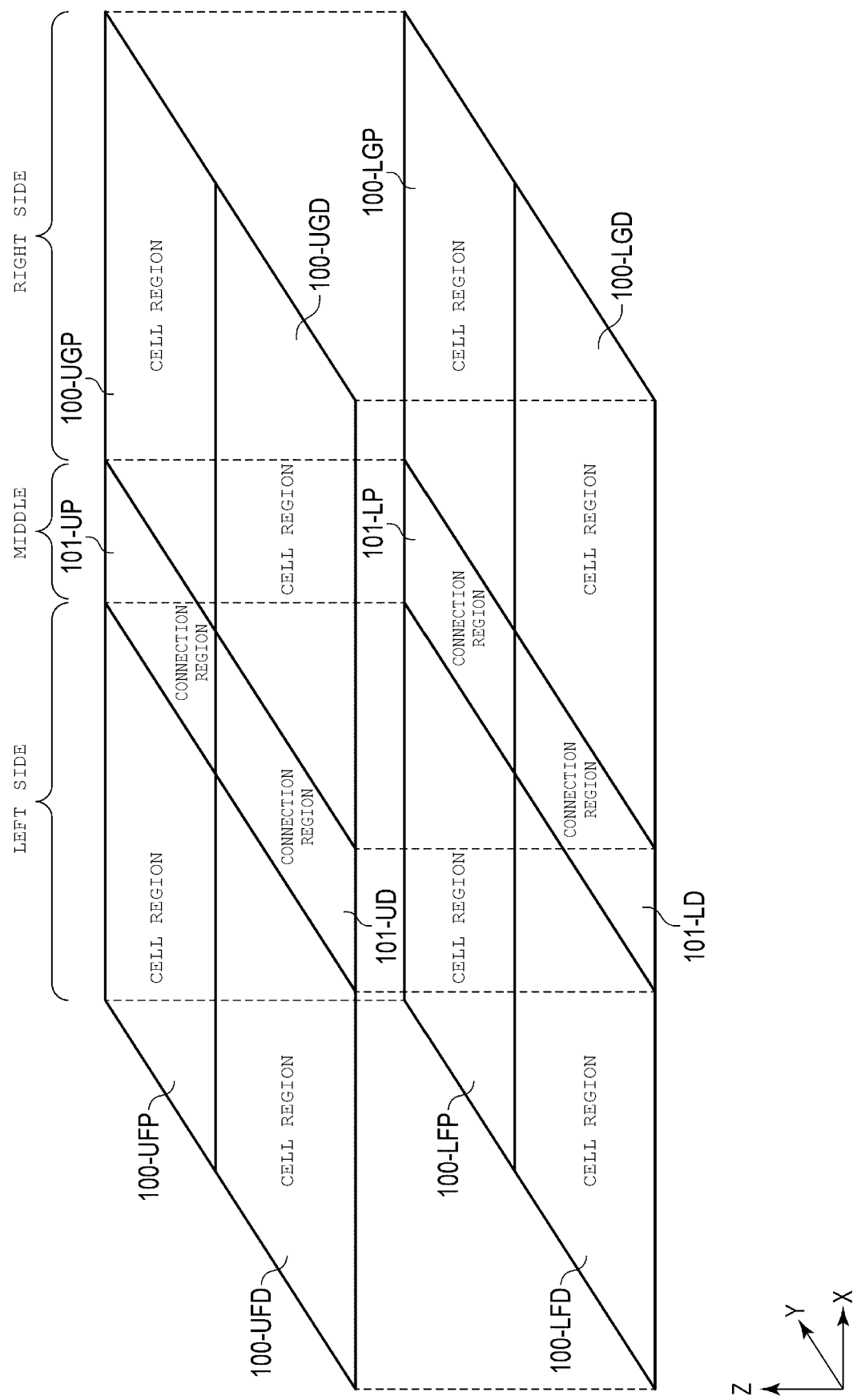
FIG. 7 illustrates a relationship between the lower layer and the upper layer.

Here, as illustrated in FIG. 7, a relationship between the lower layer LL and the upper layer UL will be described. FIG. 7 illustrates the relationship between the lower layer LL and the upper layer UL.

As illustrated in FIG. 7, in the Z-direction, the cell region (upper & lower left) 100-UFD is provided above the cell region (lower & lower left) 100-LFD and connected thereto. The cell region (lower & lower left) 100-LFD and cell region (upper & lower left) 100-UFD become the cell region (lower left) 100-FD.

In the Z-direction, the cell region (upper & lower right) 100-UGD is provided above the cell region (lower & lower right) 100-LGD and connected thereto. The cell region (lower & lower right) 100-LGD and cell region (upper & lower right) 100-UGD become the cell region (lower right) 100-GD.

In the Z-direction, the connection region (upper & lower) 101-UD is located above the connection region (lower & lower) 101-LD. The connection region (lower & lower) 101-LD and connection region (upper & lower) 101-UD become the connection region (lower) 101-D.

Furthermore, in the Z-direction, the cell region (upper & upper left) 100-UFP is provided above the cell region (lower & upper left) 100-LFP and connected thereto. The cell region (lower & upper left) 100-LFP and the cell region (upper & upper left) 100-UFP become the cell region (upper left) 100-FP.

In the Z-direction, the cell region (upper & upper right) 100-UGP is provided above the cell region (lower & upper right) 100-LGP and connected thereto. The cell region (lower & upper right) 100-LGP and the cell region (upper & upper right) 100-UGP become the cell region (upper right) 100-GP.

In the Z-direction, the connection region (upper & upper) 101-UP is located above the connection region (lower & upper) 101-LP. The connection region (lower & upper) 101-LP and the connection region (upper & upper) 101-UP become the connection region (upper) 101-P.

As described above, the connection region (upper) 101 is located above the connection region (lower) 101. That is, the connection region 101 is located in the middle of the memory cell array 10 in the X-direction.

1-2-2-5. Outline of Cell Region (Lower) and Connection Region (Lower)

Figure 8:
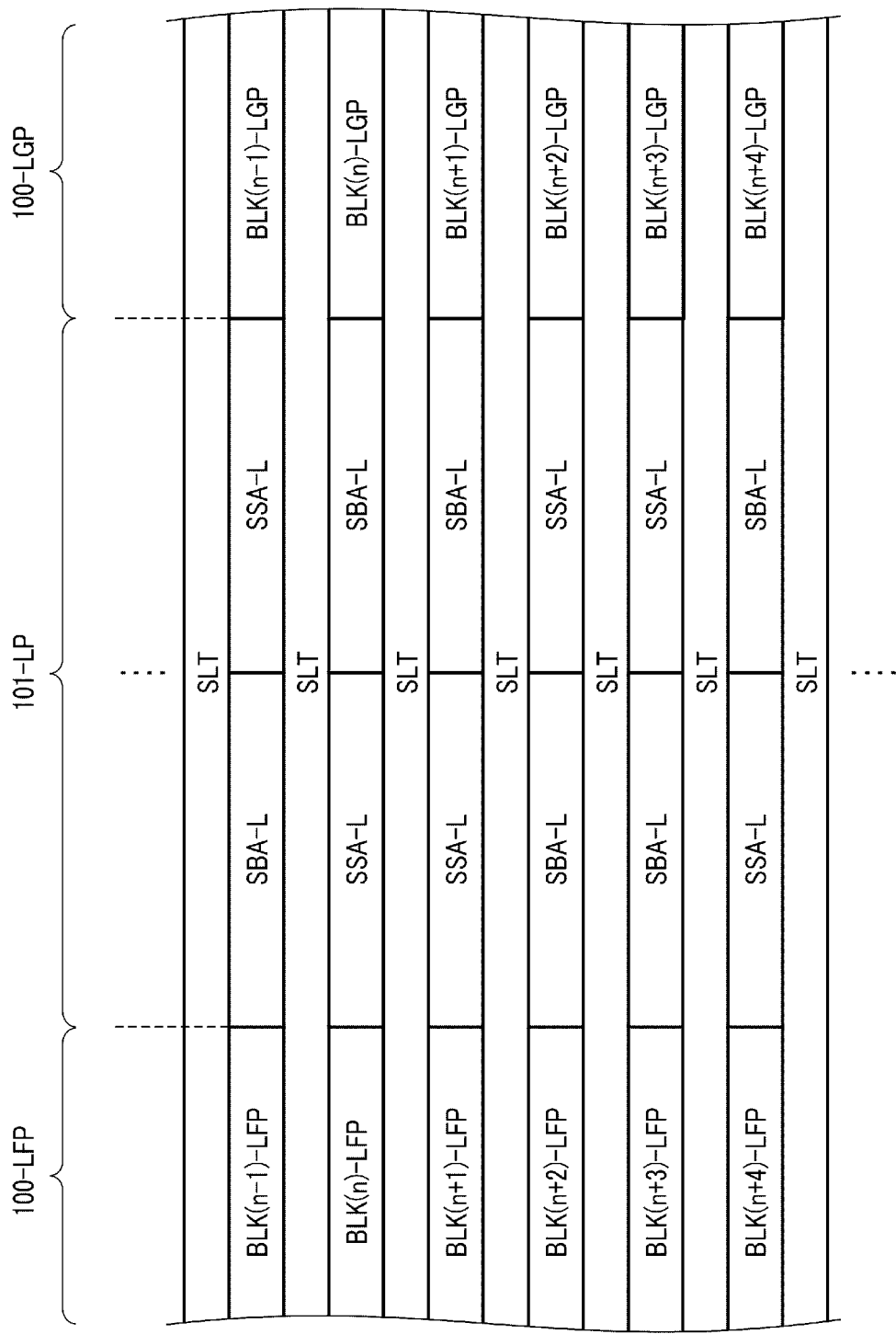
FIG. 8 illustrates a layout example of a connection region (lower) and cell regions (lower) sandwiching the connection region (lower).

Next, a rough layout of the connection region (lower) 101 and the cell region (lower) 100 sandwiching the connection region (lower) 101 will be described with reference to FIG. 8. FIG. 8 illustrates a layout example of the connection region (lower) 101 and the cell region (lower) 100 sandwiching the connection region (lower) 101.

Specifically, in FIG. 8, a part of the cell region (lower & upper left) 100-LFP, the cell region (lower & upper right) 100-LGP, and the lower connection region (lower & upper) 101-LP is illustrated.

As illustrated in FIG. 8, the cell region (lower & upper left) 100-LFP and the cell region (lower & upper right) 100-LGP each include a plurality of blocks BLK. In the Y-direction, the plurality of blocks BLK are divided by slits SLT extending in the X-direction.

For convenience, a block BLK(v) (where v is any integer) belonging to the cell region (lower & upper left) 100-LFP is denoted as a block (lower & upper left) BLK(v)-LFP. The block BLK(v) belonging to the cell region (lower & upper right) 100-LGP is denoted as a block (lower & upper right) BLK(v)-LGP.

As illustrated in FIG. 8, the connection region (lower & upper) 101-LP includes a set of a staircase region (lower) SSA-L and a subway region (lower) SBA-L for each block.

In the staircase region (lower) SSA-L, end portions of the select gate line SGS and the word lines WL(0) to WL(7) are provided in a staircase shape in which steps are formed in the X-direction in this order. In other words, each of the select gate line SGS and the word lines WL(0) to WL(7) includes a terrace portion (also described as a staircase, a staircase portion, a drawer portion, a terrace, or a terrace part) that does not overlap the lower wiring layer (conductor layer) at the end portion, in the staircase region (lower) SSA-L. A contact plug CC (see FIG. 26) is formed on each terrace portion. Such a staircase region may be described as a lead-out region.

Functions of the subway region (lower) SBA-L are roughly divided into two functions.

The first function is to connect the staircase region (lower) SSA-L and the row decoder module 15. Specifically, in the subway region (lower) SBA-L, a contact plug C4 (see FIG. 26) for connecting the row decoder module 15 formed below the connection region (lower) 101 in the Z-direction and the contact plug CC is formed. However, the contact plug C4 penetrates through the subway region (upper) SBA-U provided on the subway region (lower) SBAL in the Z-direction, and is exposed on the subway region (upper) SBA-U. For that reason, in order to connect the contact plug C4 and the contact plug CC, the contact plug CC needs to be connected to the contact plug C4 exposed on the subway region (upper) SBA-U provided on the subway region (lower) SBA-L. The contact plugs CC and C4 are made of a conductive material, and for example, a metal material such as tungsten (W) or titanium nitride (TiN) may be used.

The second function is to connect blocks BLK adjacent in the X-direction. Specifically, the block (lower & upper left) BLK(n−1)-LFP of the cell region (lower & upper left) 100-LFP and the block (lower & upper right) BLK(n−1)-LGP of the cell region (lower & upper right) 100-LGP are connected by the staircase region (lower) SSA-L and the subway region (lower) SBA-L provided therebetween. With this configuration, the block (lower & upper left) BLK(n−1)-LFP of the cell region (lower & upper left) 100-LFP and the block (lower & upper right) BLK(n−1)-LGP of the cell region (lower & upper right) 100-LGP can be controlled simultaneously.

In FIG. 8, specifically, the cell region (lower & upper left) 100-LFP, the cell region (lower & upper right) 100-LGP, and the connection region (lower & upper) 101-LP are described, but the same applies to the case of the cell region (lower & lower left) 100-LFD, cell region (lower & lower right) 100-LGD, and connection region (lower & lower) 101-LD.

1-2-2-6. Connection Region in Lower Layer

Next, the connection region (lower) 101 in the lower layer LL will be described with reference to FIGS. 9 and 10. In FIGS. 9 and 10, the block (lower & upper left) BLK(n)-LFP, the block (lower & upper right) BLK(n)-LGP, the staircase region (lower) SSA-L for the block (lower & upper left) BLK(n)-LFP and block (lower & upper right) BLK(n)-LGP, and the subway region (lower) SBA-L are illustrated.

For convenience, the staircase region (lower) SSA-L in the first lower layer LL1 is denoted as a staircase region (first lower) SSA-L1. Similarly, the subway region (lower) SBA-L in the first lower layer LL1 is denoted as a subway region (first lower) SBA-L1.

For convenience, the staircase region (lower) SSA-L in the second lower layer LL2 is denoted as a staircase region (second lower) SSA-L2. Similarly, the subway region (lower) SBA-L in the second lower layer LL2 is denoted as a subway region (second lower) SBA-L2.

As illustrated in FIG. 9, in the first lower layer LL1, the staircase region (first lower) SSA-L1 includes a lower bridge region LBBA and a lower subway connection region LBCA.

The lower bridge region LBBA is provided with wirings that connect (or is also described to as short-circuit) select gate lines SGS and word lines WL(0) to WL(4) in the block (lower & upper left) BLK(n)-LFP and the block (lower & upper right) BLK(n)-LGP.

The subway region (first lower) SBA-L1 connects the select gate line SGS and the word lines WL(0) to WL(4) in the block (lower & upper left) BLK(n)-LFP and the block (lower & upper right) BLK(n)-LGP via the lower bridge region LBBA.

The lower subway connection region LBCA includes, for example, terrace portions relating to the select gate line SGS and the word lines WL(0) to WL(4), and contact plugs CC are provided in the respective terrace portions.

As illustrated in FIG. 10, the second lower layer LL2 does not include the lower bridge region LBBA.

In the second lower layer LL2, the staircase region (second lower) SSA-L2 includes a first lower connectable region LCA1 and a second lower connectable region LCA2.

The first lower connectable region LCA1 includes, for example, terrace portions relating to the word lines WL(5) to WL(7) of the block (lower & upper left) BLK(n)-LFP, and contact plugs CC are provided in the respective terrace portions.

The second lower connectable region LCA2 includes, for example, terrace portions relating to the word lines WL(5) to WL(7) of the block (lower & upper right) BLK(n)-LGP. Contact plugs CB are respectively provided on the terrace portions of the first lower connectable region LCA1 and the terrace portion of the second lower connectable region LCA2. On the contact plug CB, the wirings LCL that respectively connect the word lines WL(5) to WL(7) in the block (lower & upper left) BLK(n)-LFP and the block (lower & upper right) BLK(n)-LGP are provided.

1-2-2-7. Outline of Cell Region (Upper) and Connection Region (Upper)

Next, a rough layout of the connection region (upper) 101 and the cell region (upper) 100 sandwiching the connection region (upper) 101 will be described.

Figure 11:
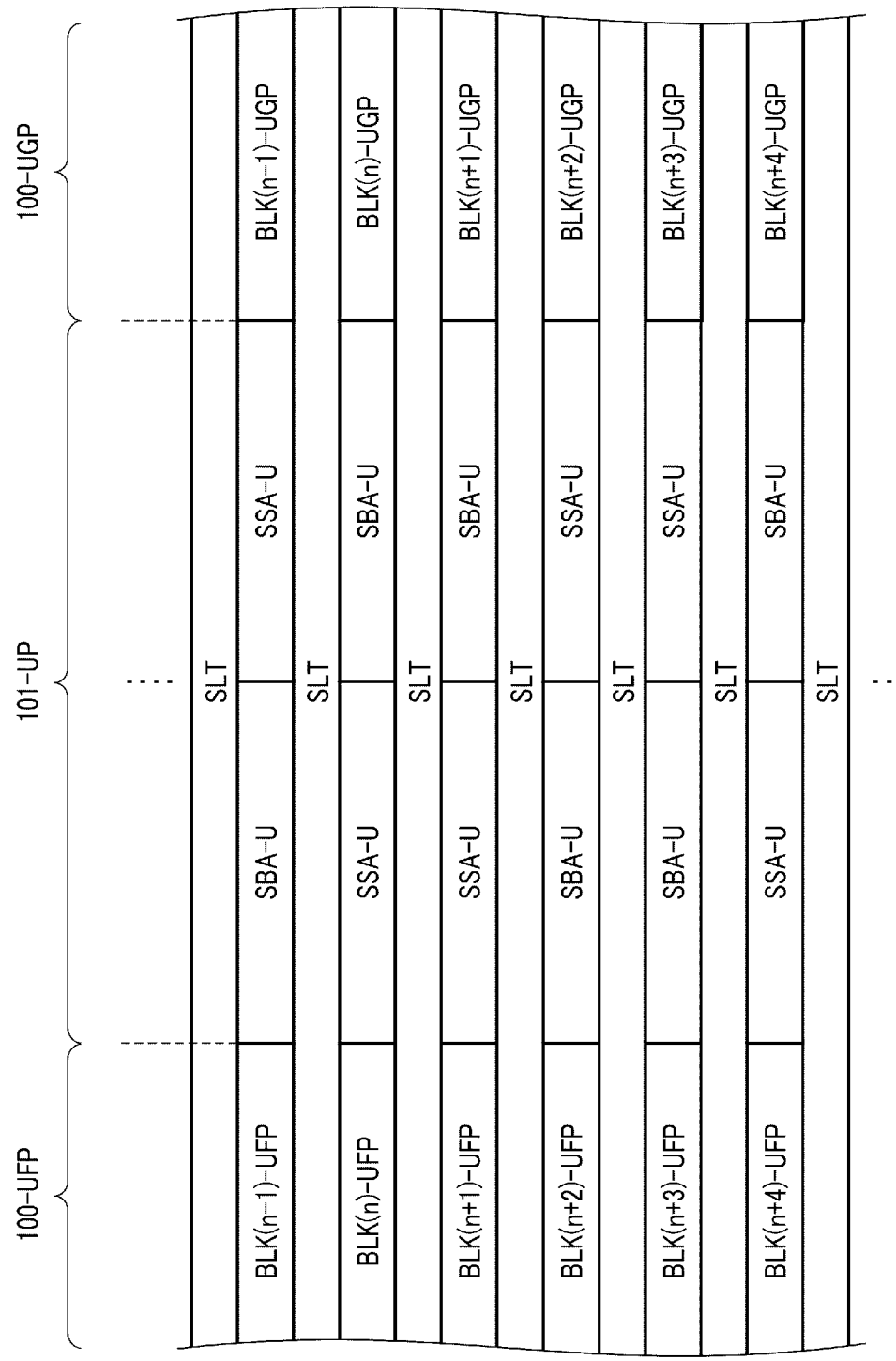
FIG. 11 illustrates a layout example of a connection region (upper) and cell regions (upper) sandwiching the connection region (upper).

In FIG. 11, specifically, a part of the cell region (upper & upper left) 100-UFP, the cell region (upper & upper right) 100-UGP, and the connection region (upper & upper) 101-UP is illustrated.

As illustrated in FIG. 11, the cell region (upper & upper left) 100-UFP and the cell region (upper & upper right) 100-UGP each include a plurality of blocks BLK. In the Y-direction, the plurality of blocks BLK are divided by slits SLT extending in the X-direction.

For convenience, the block BLK(v) belonging to the cell region (upper & upper left) 100-UFP is denoted as a block (upper & upper left) BLK(v)-UFP. The block BLK(v) belonging to the cell region (upper & upper right) 100-UGP is denoted as a block (upper & upper right) BLK(v)-UGP.

As illustrated in FIG. 11, the connection region (upper & upper) 101-UP includes a set of a staircase region (upper) SSA-U and a subway region (upper) SBA-U for each block.

In the staircase region (upper) SSA-U, end portions of the word lines WL(8) to WL(15) and the select gate line SGD are provided in a staircase shape in which steps are formed in this order in the X-direction. In other words, in the staircase region (upper) SSA-U, each of the word lines WL(8) to WL(15) and the select gate line SGD includes a terrace portion that does not overlap the lower wiring layer (conductor layer) at the end portion. A contact plug CC is formed on each terrace portion.

Functions of the subway region (upper) SBA-U are roughly divided into two functions. The first function is to connect the staircase region (upper) SSA-U and the row decoder module 15. Specifically, in the subway region (upper) SBA-U, a contact plug C4 for connecting the row decoder module 15 formed below the connection region (lower) 101 in the Z-direction and the contact plug CC is formed. The upper ends of the contact plug CC and the contact plug C4 are connected by a wiring layer. The contact plugs CC and C4 are made of a conductive material, and for example, a metal material such as tungsten (W) or titanium nitride (TiN) may be used. The second function is to connect blocks BLK adjacent in the X-direction.

Specifically, the block BLK(n−1)-UFP of the cell region (upper & upper left) 100-UFP and the block BLK(n−1)-UGP of the cell region (upper & upper right) 100-UGP are connected by the staircase region (upper) SSA-U and the subway region (upper) SBA-U provided therebetween. With this configuration, the block BLK(n−1)-UFP of the cell region (upper & upper left) 100-UFP and the block BLK(n−1)-UGP of the cell region (upper & upper right) 100-UGP can be controlled simultaneously.

The blocks BLK illustrated in FIGS. 8 and 11 are located at the same coordinates in the plane composed of the X-direction and the Y-direction. That is, the block BLK(n−1) illustrated in FIG. 11 is located above the block BLK(n−1) illustrated in FIG. 8 in the Z-direction. The same applies to the other blocks BLK.

The staircase region (lower) SSA-L illustrated in FIG. 8 and the staircase region (upper) SSA-U illustrated in FIG. 11 are located at the same coordinates in the plane composed of the X-direction and the Y-direction. That is, the staircase region (upper) SSA-U illustrated in FIG. 11 is located above the staircase region (lower) SSA-L illustrated in FIG. 8 in the Z-direction. The same applies to the other staircase regions (lower) SSA-L and staircase regions (upper) SSA-U. For simplicity, the staircase region (lower) SSA-L and the staircase region (upper) SSA-U may be collectively described as a staircase region SSA.

The subway region (lower) SBA-L illustrated in FIG. 8 and the subway region (upper) SBA-U illustrated in FIG. 11 are located at the same coordinates in the plane composed of the X-direction and the Y-direction. That is, the subway region (upper) SBA-U illustrated in FIG. 11 is located above the subway region (lower) SBA-L illustrated in FIG. 8 in the Z-direction. The same applies to the other subway regions (lower) SBA-L and the subway regions (upper) SBA-U. For simplicity, the subway region (lower) SBA-L and the subway region (upper) SBA-U may be collectively described as a subway region SBA.

In FIG. 11, specifically, the cell region (upper & upper left) 100-UFP, the cell region (upper & upper right) 100-UGP, and the connection region (upper & upper) 101-UP are described, but the same applies to the case of the cell region (upper & lower left) 100-UFD, the cell region (upper & lower right) 100-UGD, and the connection region (upper & lower) 101-UD.

1-2-2-8. Connection Region in Upper Layer

Figure 12:
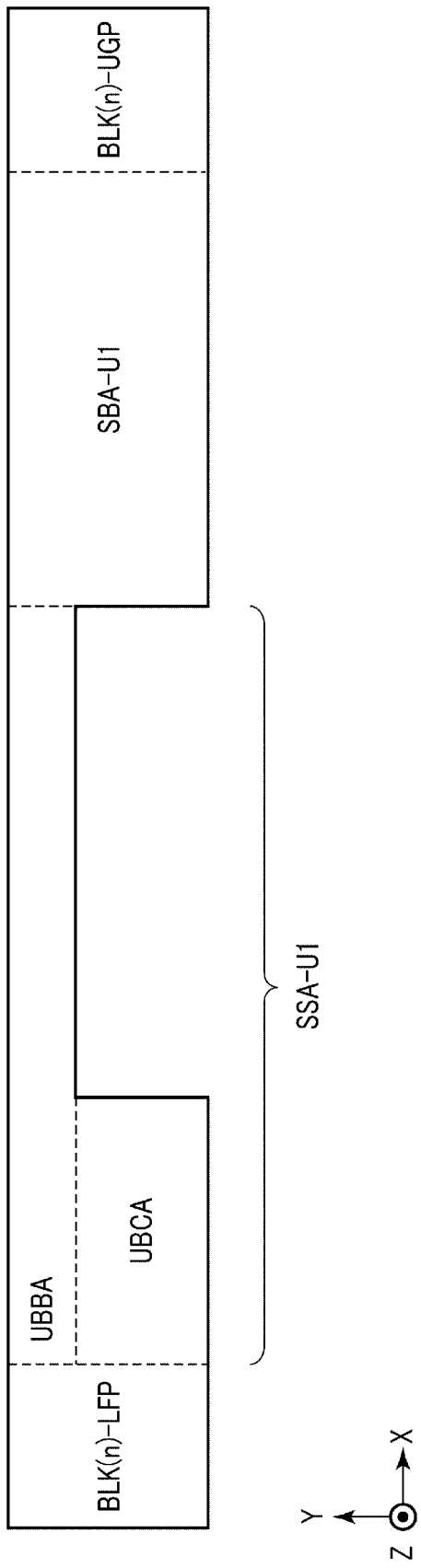
FIG. 12 illustrates a layout example of the connection region (upper) in a first upper layer.
Figure 13:
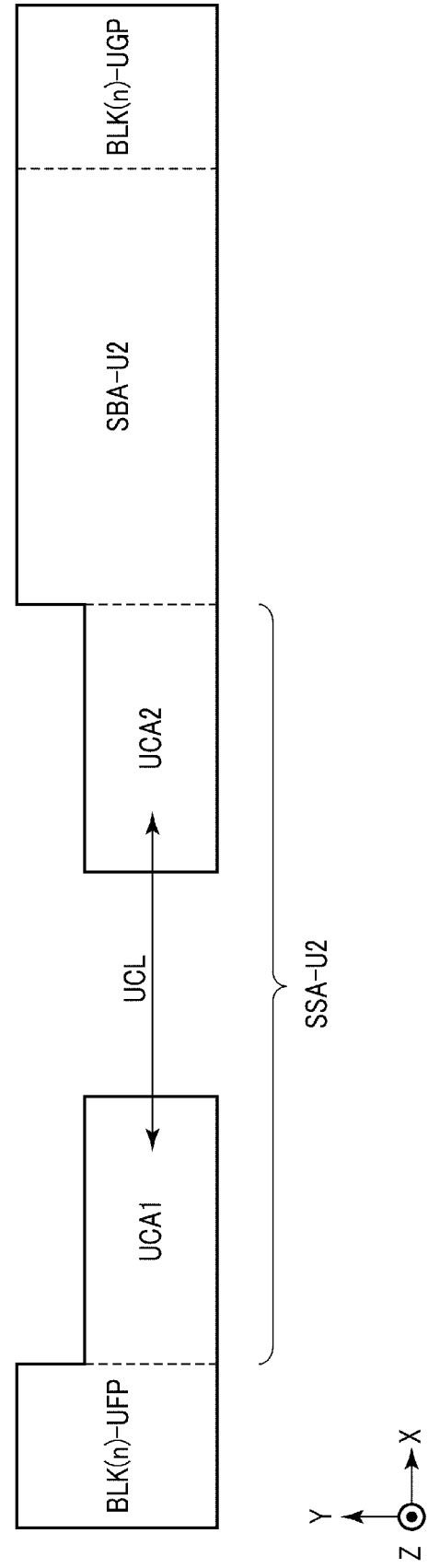
FIG. 13 illustrates a layout example of the connection region (upper) in a second upper layer.

Next, the connection region (upper) 101 will be described with reference to FIGS. 12 and 13. In FIGS. 12 and 13, the block (upper & upper left) BLK(n)-UFP, the block (upper & upper right) BLK(n)-UGP, the block (upper & upper left) BLK(n)-UFP, and the staircase region (upper) SSA-U relating to the block (upper & upper right) BLK(n)-UGP, and the subway region (upper) SBA-U are illustrated.

For convenience, the staircase region (upper) SSA-U in the first upper layer UL1 is denoted as a staircase region (first upper) SSA-U1. Similarly, the subway region (upper) SBA-U in the first upper layer UL1 is denoted as a subway region (first upper) SBA-U1.

For convenience, the staircase region (upper) SSA-U in the second upper layer UL2 is denoted as a staircase region (second upper) SSA-U2. Similarly, the subway region (upper) SBA-U in the second upper layer UL2 is denoted as a subway region (second upper) SBA-U2.

As illustrated in FIG. 12, in the first upper layer UL1, the staircase region (first upper) SSA-U1 includes an upper bridge region UBBA and an upper subway connection region UBCA.

The upper bridge region UBBA is provided with wirings that connect the word lines WL(8) to WL(12) in the block (upper & upper left) BLK(n)-UFP and the block (upper & upper right) BLK(n)-UGP.

The subway region (first upper) SBA-U1 connects the word lines WL(8) to WL(12) in the block (upper & upper left) BLK(n)-UFP and the block (upper & upper right) BLK(n)-UGP via the upper bridge region UBBA.

The upper subway connection region UBCA includes, for example, terrace portions relating to the word lines WL(8) to WL(12), and contact plugs CC are provided in the respective terrace portions.

As illustrated in FIG. 13, the second upper layer UL2 does not include the upper bridge region UBBA.

In the second upper layer UL2, the staircase region (second upper) SSA-U2 includes a first upper connectable region UCA1 and a second upper connectable region UCA2.

The first upper connectable region UCA1 includes, for example, terrace portions relating to the word lines WL(13) to WL(15) of the block (upper & upper left) BLK(n)-UFP and the select gate line SGD, and contact plugs CC are provided in the respective terrace portions.

The second upper connectable region UCA2 includes, for example, terrace portions relating to the word lines WL(13) to WL(15) of the block (upper & upper right) BLK(n)-UGP and the select gate line SGD. Contact plugs CB are respectively provided on the terrace portion of the first upper connectable region UCA1 and the terrace portion of the second upper connectable region UCA2. On the contact plug CB, the wirings UCL that respectively connect the word lines WL(13) to WL(15) in the block (upper & upper left) BLK(n)-UFP and the block (upper & upper right) BLK(n)-UGP and the select gate line SGD are provided.

1-2-2-9. Connection Relationship in Lower Layer

As described above, in the first lower layer LL1 and the second lower layer LL2, the connection method of the block (lower & upper left) BLK(n)-LFP and the block (lower & upper right) BLK(n)-LGP is different. A connection method of the block (lower & upper left) BLK(n)-LFP and the block (lower & upper right) BLK(n)-LGP, a connection method of the block (lower & upper left) BLK(n)-LFP and the row decoder RD of the row decoder module 15, and a connection method of the block (lower & upper right) BLK(n)-LGP and the row decoder RD of the row decoder module 15 in the first lower layer LL1 and the second lower layer LL2, will be schematically described.

FIG. 14 is a block diagram illustrating connections of the respective constitutional elements in the first lower layer LL1. As illustrated in FIG. 14, in the first lower layer LL1, the select gate line SGS and the word lines WL(0) to WL(4) in the block (lower & upper left) BLK(n)-LFP and the block (lower & upper right) BLK(n)-LGP are connected via a lower bridge region LBBA and the subway region (lower) SBA-L.

The select gate line SGS and the word lines WL(0) to WL(4) in the block (lower & upper left) BLK(n)-LFP are connected to the row decoder RD for the block BLK(n) via the lower subway connection region LBCA, the first contact wiring CL1 connecting the lower subway connection region LBCA and the contact plug C4, and the contact plug C4. Hereinafter, the row decoder RD for the block BLK(v) is denoted as a RD(BLK(v)).

The select gate line SGS and word lines WL(0) to WL(4) in the block (lower & upper right) BLK(n)-LGP are connected to the row decoder RD(BLK(n)) for the block BLK(n) via the subway region (lower) SBA-L, the lower bridge region LBBA, and the lower subway connection region LBCA, the first contact wiring CL1, and the contact plug C4.

FIG. 15 is a block diagram illustrating connections of the respective constitutional elements in the second lower layer LL2. Next, as illustrated in FIG. 15, in the second lower layer LL2, the word lines WL(5) to WL(7) in the block (lower & upper left) BLK(n)-LFP and the block (lower & upper right) BLK(n)-LGP) are connected via the first lower connectable region LCA1, the lower connection wiring LCL that connects the first lower connectable region LCA1 and the second lower connectable region LCA2, and the second lower connectable region LCA2.

The word lines WL(5) to WL(7) in the block (lower & upper left) BLK(n)-LFP are connected to the row decoder RD(BLK(n)) for the block BLK(n) via the first lower connectable region LCA1, a second contact wiring CL2 that connects the first lower connectable region LCA1 and the contact plug C4, and the contact plug C4.

The word lines WL(5) to WL(7) in the block (lower & upper right) BLK(n)-LGP are connected to the row decoder RD(BLK(n)) for the block BLK(n) via the subway region (lower) SBA-L, the second lower connectable region LCA2, the lower connection wiring LCL, the first lower connectable region LCA1, the second contact wiring CL2, and the contact plug C4.

1-2-2-10. Connection Relationship in Upper Layer

As described above, in the first upper layer UL1 and the second upper layer UL2, the connection method of the block (upper & upper left) BLK(n)-UFP and the block (upper & upper right) BLK(n)-UGP is different. Connections of respective constitutional elements in the first upper layer UL1 and the second upper layer UL2 will be schematically described.

FIG. 16 is a block diagram illustrating connections of the respective constitutional elements in the first upper layer UL1. As illustrated in FIG. 16, in the first upper layer UL1, the word lines WL(8) to WL(12) in the block (upper & upper left) BLK(n)-UFP and the block (upper & upper right) BLK(n)-UGP are connected via an upper bridge region UBBA and the subway region (upper) SBA-U.

The word lines WL(8) to WL(12) in the block (upper & upper left) BLK(n)-UFP are connected to the row decoder RD(BLK(n)) for the block BLK(n) via the upper subway connection region UBCA, the third contact wiring CL3 connecting the upper subway connection region UBCA and the contact plug C4, and the contact plug C4.

The word lines WL(8) to WL(12) in the block (upper & upper right) BLK(n)-UGP are connected to the row decoder RD (BLK(n)) for the block BLK(n) via the subway region (upper) SBA-U, the upper bridge region UBBA, the upper subway connection region UBCA, the third contact wiring CL3, and the contact plug C4.

Figure 17:
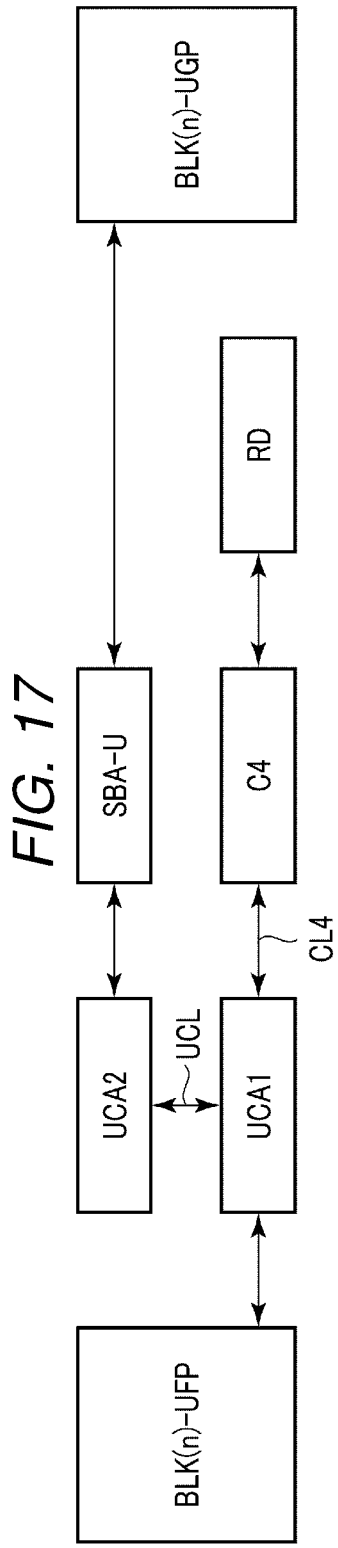
FIG. 17 is a block diagram illustrating connections of respective constitutional elements in the second upper layer.

FIG. 17 is a block diagram illustrating connections of respective constitutional elements in the second upper layer UL2. Next, as illustrated in FIG. 17, in the second upper layer UL2, the word lines WL(13) to WL(15) in the block (upper & upper left) BLK(n)-UFP and the block (upper & upper right) BLK(n)-UGP and the select gate line SGD are connected via the first upper connectable region UCA1, the upper connection wiring UCL that connects the first upper connectable region UCA1 and the second upper connectable region UCA2, and second upper connectable region UCA2.

The word lines WL(13) to WL(15) in the block (upper & upper left) BLK(n)-UFP and the select gate line SGD are connected to the row decoder RD(BLK(n)) for the block BLK(n) via the first upper connectable region UCA1, the fourth contact wiring CL4 connecting the first upper connectable region UCA1 and the contact plug C4, and the contact plug C4.

The word lines WL(13) to WL(15) in the block (upper & upper right) BLK(n)-UGP and the select gate line SGD are connected to the row decoder RD(BLK(n)) for the block BLK(n) via the subway region (upper) SBA-U, the second upper connectable region UCA2, the upper connection wiring UCL, the first upper connectable region UCA1, the fourth contact wiring CL4, and the contact plug C4.

When the first contact wiring CL1, the second contact wiring CL2, the third contact wiring CL3, and the fourth contact wiring CL4 are not distinguished, these contact wirings are simply referred to as a contact wiring CL.

1-2-2-11. Relationship Between Connection Region (Lower) and Connection Region (Upper)

Figure 18:
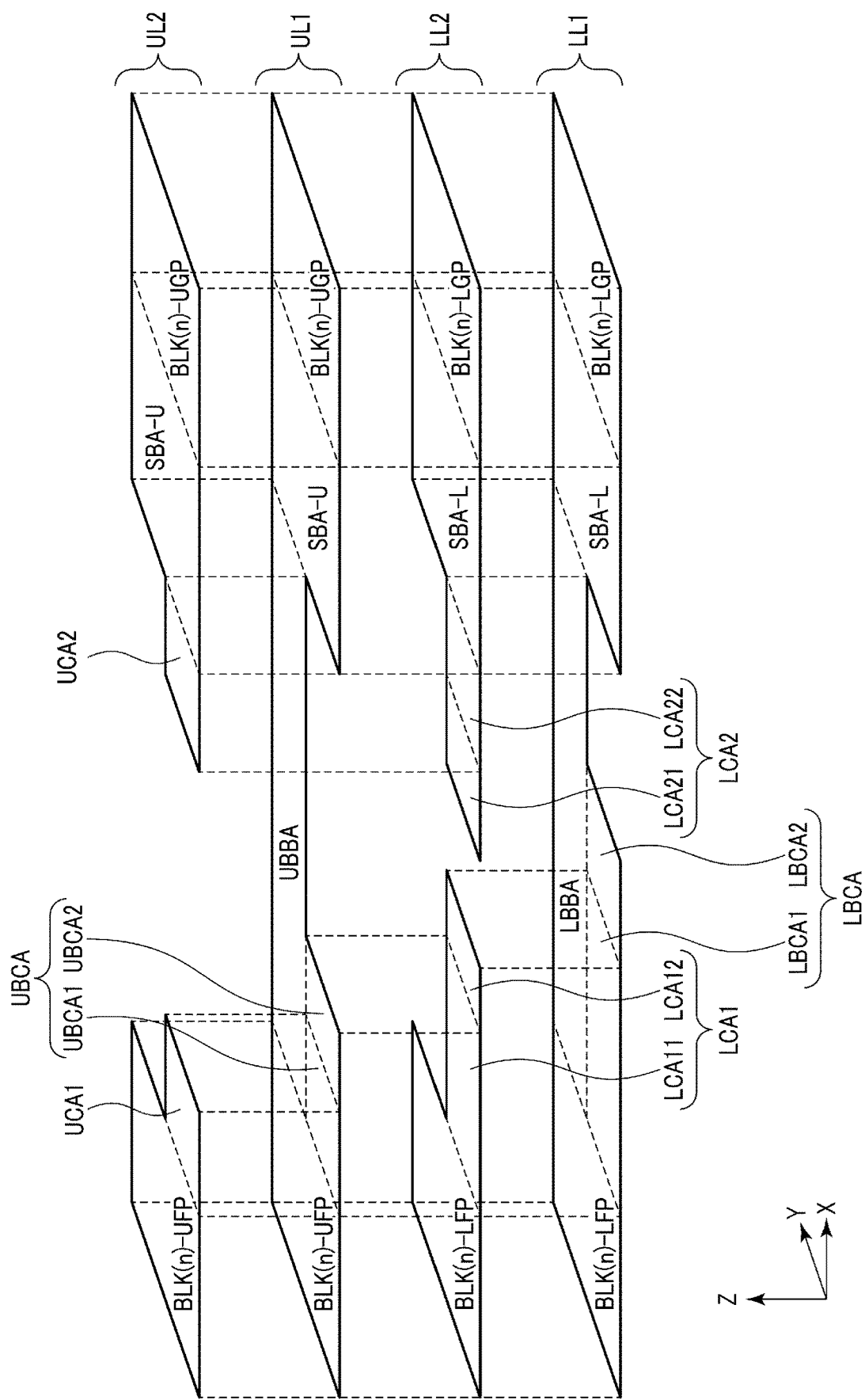
FIG. 18 is a diagram illustrating a relationship between the connection region (lower) and the connection region (upper).

Here, the relationship between connection region (lower) 101 and connection region (upper) 101 will be described with reference to FIG. 18. In FIG. 18, the staircase region (lower) SSA-L and the subway region (lower) SBA-L for the block (lower & upper left) BLK(n)-UFP, the block (lower & upper right) BLK(n)-UGP, the block (lower & upper left) BLK(n)-UFP, and the block (lower & upper right) BLK(n)-UGP and the staircase region (upper) SSA-U and the subway region (upper) SBA-U for the block (upper & upper left) BLK(n)-UFP, the block (upper & upper right) BLK(n)-UGP, the block (upper & upper left) BLK(n)-UFP, and the block (upper & upper right) BLK(n)-UGP are illustrated.

As illustrated in FIG. 18, the lower subway connection region LBCA of the first lower layer LL1 includes regions LBCA1 and LBCA2. The region LBCA1 is covered with the first lower connectable region LCA1 in the Z-direction. On the other hand, the region LBCA2 is not covered with the first lower connectable region LCA1 in the Z-direction. For that reason, a staircase in which the contact plug CC is provided is formed in the region LBCA2.

The first lower connectable region LCA1 of the second lower layer LL2 includes regions LCA11 and LCA12. The region LCA11 is covered with the upper subway connection region UBCA in the Z-direction. On the other hand, the region LCA12 is not covered with the upper subway connection region UBCA in the Z-direction. For that reason, a staircase in which the contact plug CC is provided is formed in the region LCA12.

The second lower connectable region LCA2 of the second lower layer LL2 includes regions LCA21 and LCA22. The region LCA21 is covered with the second upper connectable region UCA2 in the Z-direction. On the other hand, the region LCA22 is not covered with the second upper connectable region UCA2 in the Z-direction. For that reason, a staircase in which the contact plug CC is provided is formed in the region LCA22.

The upper subway connection region UBCA of the first upper layer UL1 includes regions UBCA1 and UBCA2. The region UBCA1 is covered with the first upper connectable region UCA1 in the Z-direction. On the other hand, the region UBCA2 is not covered with the first upper connectable region UCA1 in the Z-direction. For that reason, a staircase in which the contact plug CC is provided is formed in the region UBCA2.

As described above, a part of the upper subway connection region UBCA is provided with the first upper connectable region UCA1 above the Z-direction, but is not provided above other portions. For that reason, the wiring may be connected from the upper subway connection region UBCA to the subway region.

A part of the first lower connectable region LCA1 is provided with the upper subway connection region UBCA above the Z-direction, but is not provided above other portions. For that reason, the wiring may be connected from the first lower connectable region LCA1 to the subway region.

A part of the lower subway connection region LBCA is provided with the first lower connectable region LCA1 above the Z-direction, but is not provided above other parts. For that reason, the wiring may be connected from the lower subway connection region LBCA to the subway region.

A part of the second lower connectable region LCA2 is provided with the second upper connectable region UCA2 above the Z-direction, but is not provided above other portions. For that reason, the wiring may be connected from the second lower connectable region LCA2 to the subway region.

1-2-3. Circuit Area Layout

1-2-3-1. Overview

Figure 19:
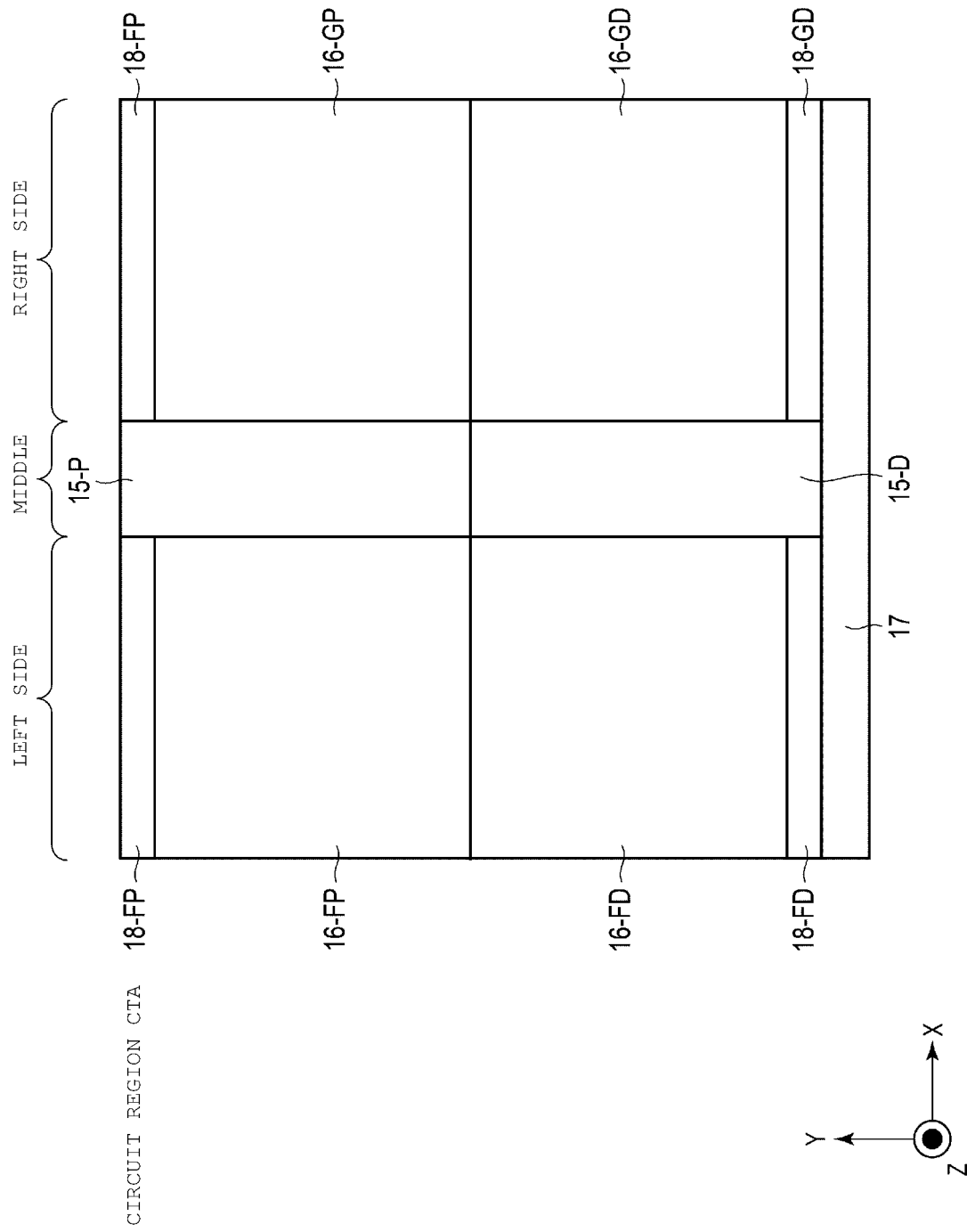
FIG. 19 illustrates a planar layout example of a circuit region.

With reference to FIG. 19, a layout focusing on a plane of the circuit region CTA in the X and Y-directions will be described.

As illustrated in FIG. 19, in the circuit region CTA, the sense amplifier module 16 is divided into four.

Specifically, on the paper surface of FIG. 19, the sense amplifier modules 16 are located at four locations of upper left, upper right, lower left, and lower right. The expressions of "upper left", "upper right", "lower left", and "lower right" are expressions based on the paper surface of FIG. 19.

For convenience, the sense amplifier modules 16 located at the upper left, upper right, lower left, and lower right in the circuit region CTA are denoted as a sense amplifier module (upper left) 16-FP, a sense amplifier module (upper right) 16-GP, a sense amplifier module (lower left) 16-FD, and a sense amplifier module (lower right) 16-GD, respectively. When the four sense amplifier modules are not distinguished, the sense amplifier modules are simply denoted as the sense amplifier module 16.

As illustrated in FIG. 19, in the Z-direction, the sense amplifier module (upper left) 16-FP is provided below the cell region (upper & upper left) 100-UFP and the cell region (lower & upper left) 100-LFP. The sense amplifier module (upper left) 16-FP is connected to the cell region (upper & upper left) 100-UFP and the bit line BL for the cell region (lower & upper left) 100-LFP via a second peripheral circuit (upper left) 18-FP provided on one side of the sense amplifier module (upper left) 16-FP.

As illustrated in FIG. 19, in the Z-direction, the sense amplifier module (upper right) 16-GP is provided below the cell region (upper & upper right) 100-UGP and the cell region (lower & upper right) 100-LGP. The sense amplifier module (upper right) 16-GP is connected to the cell region (upper & upper right) 100-UGP and the bit line BL for the cell region (lower & upper right) 100-LGP via a second peripheral circuit (upper right) 18-GP provided on one side of the sense amplifier module (upper right) 16-GP.

As illustrated in FIG. 19, in the Z-direction, the sense amplifier module (lower left) 16-FD is provided below the cell region (upper & lower left) 100-UFD and the cell region (lower & lower left) 100-LFD. The sense amplifier module (lower left) 16-FD is connected to the cell region (upper & lower left) 100-UFD and the bit line BL for the cell region (lower & lower left) 100-LFD via a second peripheral circuit (lower left) 18-FD provided on one side of the sense amplifier module (lower left) 16-FD.

As illustrated in FIG. 19, in the Z-direction, the sense amplifier module (lower right) 16-GD is provided below the cell region (upper & lower right) 100-UGD and the cell region (lower & lower right) 100-LGD. The sense amplifier module (lower right) 16-GD is connected to the cell region (upper & lower right) 100-UGD and the bit line BL for the cell region (lower & lower right) 100-LGD via a second peripheral circuit (upper right) 18-GD provided on one side of the sense amplifier module (lower right) 16-GD.

As illustrated in FIG. 19, the row decoder module (upper) 15-P is sandwiched between the sense amplifier module (upper left) 16-FP and the sense amplifier module (upper right) 16-GP in the X-direction. The row decoder module (lower) 15-D is sandwiched between the sense amplifier module (lower left) 16-FD and the sense amplifier module (lower right) 16-GD in the X-direction.

As illustrated in FIG. 19, a first peripheral circuit 17 is provided on one side of the circuit region CTA.

The first peripheral circuit 17 and the second peripheral circuit 18 appropriately include the command register 11, the address register 12, the sequencer 13, and the driver module 14.

1-2-3-2. Relationship Between Row Decoder and Block

Next, the relationship between the row decoder and the block will be described with reference to FIG. 20.

Figure 20:
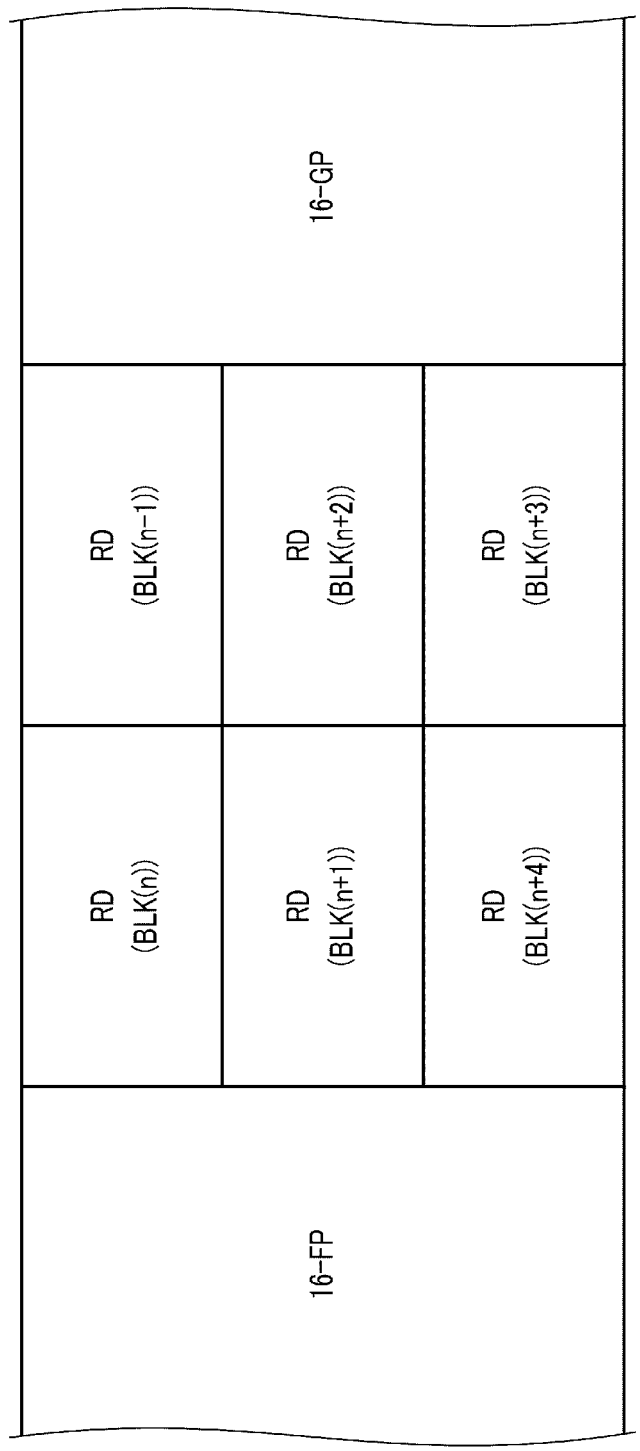
FIG. 20 illustrates a layout example of a part of a row decoder module and a part of a sense amplifier module.

FIG. 20 illustrates a part of the row decoder module 15 and a part of the sense amplifier module 16 in the circuit region CTA. In particular, FIG. 20 illustrates a part of the sense amplifier module (upper left) 16-FP, the sense amplifier module (upper right) 16-GP, and the row decoder module (upper) 15-P.

As illustrated in FIG. 20, the row decoder module 15 includes the row decoder RD for each block BLK. As illustrated in FIG. 20, two row decoders RD are provided along the X-direction and a plurality of row decoders RD are provided along the Y-direction.

1-2-3-3. Relationship Between Row Decoder Module and Connection Region in Memory Cell Array Next, with reference to FIG. 21, the relationship between the row decoder module 15 in the circuit region CTA and the connection region 101 in the memory cell array 10 will be described.

Figure 21:
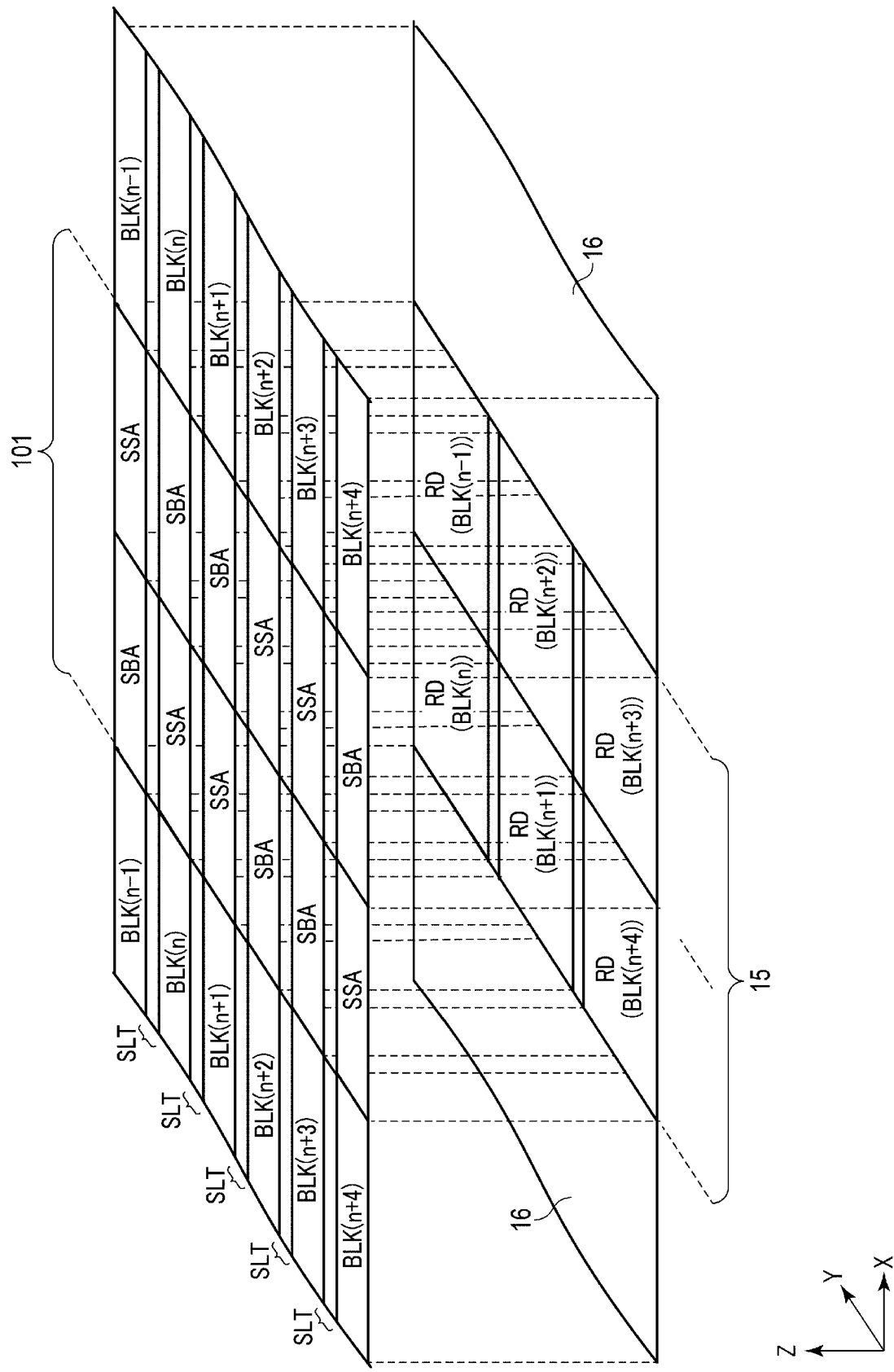
FIG. 21 illustrates a relationship between the row decoder module in the circuit region and the connection region in the memory cell array.

FIG. 21 illustrates the same contents as in FIG. 20 relating to the circuit region CTA. In FIG. 21, for simplicity, the memory cell array 10 is illustrated without distinction between the lower layer LL and the upper layer UL.

As illustrated in FIG. 21, the connection region 101 is provided above the row decoder module 15 in the Z-direction. More specifically, a staircase region and a subway region for the block BLK(n−1) are provided above the row decoder RD(BLK(n−1)) for the block BLK(n−1) in the Z-direction. The row decoder RD (BLK(n−1)) for the block BLK(n−1) is connected to the block BLK(n−1) of the memory cell array 10 via the staircase region and the subway region for the block BLK(n−1).

Other row decoder modules 15, staircase regions, and subway regions are also provided corresponding to the blocks BLK of the memory cell array 10.

1-2-4. Structure of Memory Cell Array 1-2-4-1. Planar Layout of Memory Cell Array With reference to FIG. 22, an example of a planar layout of the memory cell array 10 in the semiconductor memory device 1 according to the first embodiment will be described.

Figure 22:
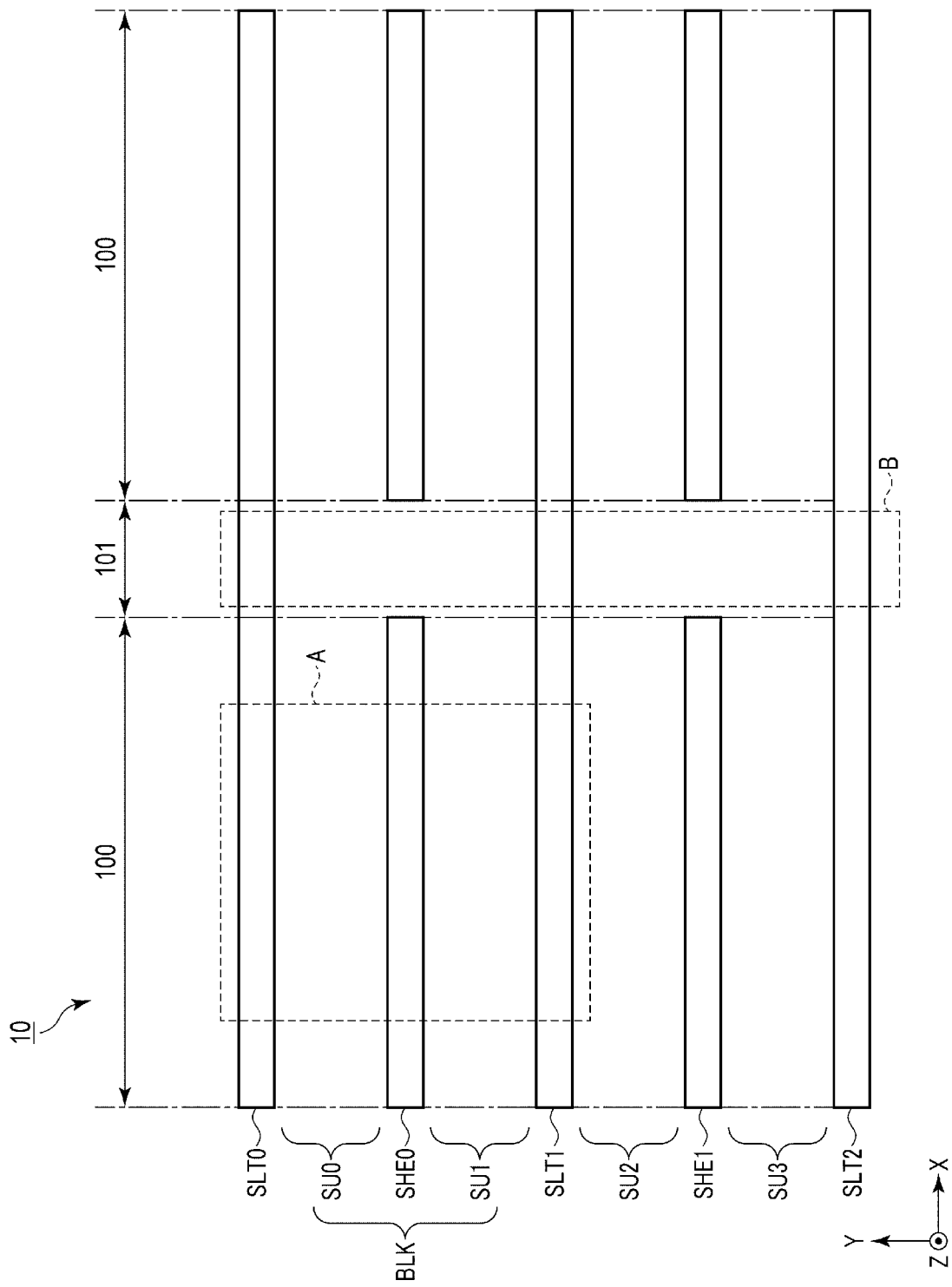
FIG. 22 illustrates a planar layout example of the memory cell array in the semiconductor memory device according to the first embodiment.

FIG. 22 is an example of a planar layout of the memory cell array 10 in the semiconductor memory device 1 according to the first embodiment, and illustrates an extracted region corresponding to two blocks BLK (that is, string units SU0 to SU3).

As illustrated in FIG. 22, in the planar layout of the memory cell array 10, for example, two cell regions 100 are connected via the connection region 101 in the X-direction. The memory cell array 10 also includes a plurality of slits SLT (SLT0 to SLT2 in FIG. 22) and a plurality of slits SHE (SHE0 and SHE1).

The plurality of slits SLT are provided so as to extend along the X-direction and are arranged in the Y-direction, respectively. The slit SLT crosses the cell region 100 and the connection region 101 in the X-direction.

For example, one slit SHE is located between the adjacent slits SLT. The slit SHE is provided so as to extend along the X-direction and crosses the cell region 100 in the X-direction.

Specifically, the slit SLT divides a plurality of wiring layers respectively corresponding to, for example, the word lines WL(0) to WL(15), the select gate line SGD, and the select gate line SGS. The slit SHE divides the wiring layer corresponding to the select gate line SGD.

Each of the slit SLT and the slit SHE has a structure in which an insulating member is embedded in a groove.

In the planar layout of the memory cell array 10 described above, each of the regions partitioned by the slits SLT and SHE in the cell region 100 corresponds to one string unit SU. That is, in this example, the string units SU0 to SU3 each extending in the X-direction are arranged in the Y-direction.

Specifically, a plurality of NAND strings NS provided in a region between the slit SLT0 and the slit SHE0 in the Y-direction are set as the string unit SU0. A plurality of NAND strings NS provided in a region between the slit SHE0 and the slit SLT1 in the Y-direction are set as the string unit SU1. The string units SU0 and SU1 provided in the region between the slit SLT0 and the slit SLT1 are denoted as a block BLK, for example. Similarly, a plurality of NAND strings NS provided in a region between the slit SLT1 and the slit SHE1 in the Y-direction are set as the string unit SU2. A plurality of NAND strings NS provided in a region between the slit SHE1 and the slit SLT2 in the Y-direction are set as the string unit SU3. The string units SU2 and SU3 provided in the region between the slits SLT1 and SLT2 are denoted as a block BLK.

The planar layout of the memory cell array 10 described above may be designed with any number of slits SHE located between adjacent slits SLT. The number of string units SU between two adjacent slits SLT changes based on the number of slits SHE located between two adjacent slits SLT.

1-2-4-2. Structure of Memory Cell Array 10 in Cell Region CA

Next, a planar layout of the memory cell array 10 in the cell region 100 of the semiconductor memory device 1 according to the first embodiment will be described.

Figure 23:
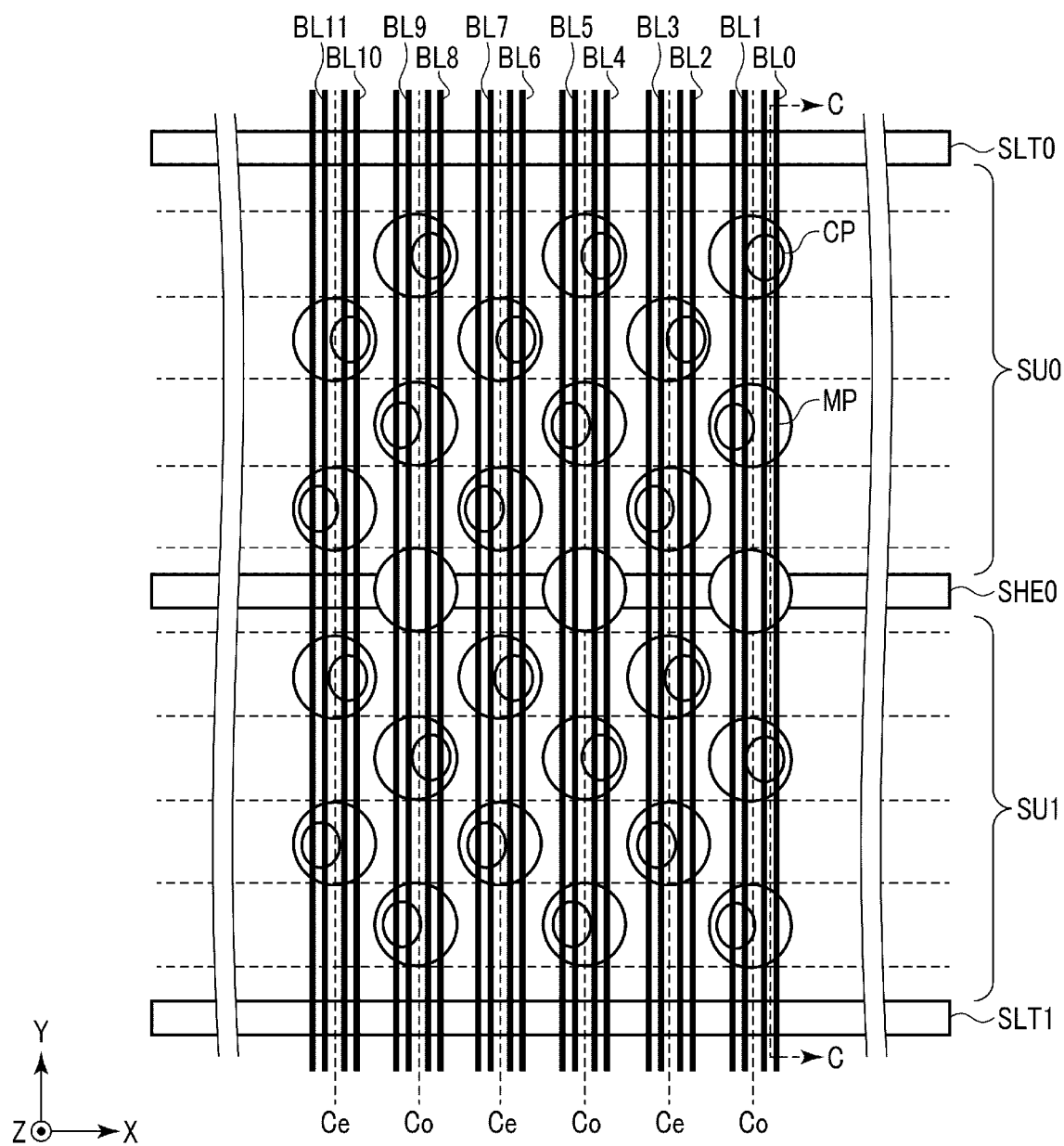
FIG. 23 illustrates an example of a planar layout of the memory cell array in a cell region of the semiconductor memory device according to the first embodiment.

FIG. 23 is an example of a planar layout of the memory cell array 10 in the cell region 100 of the semiconductor memory device 1 according to the first embodiment, and illustrates an extracted region (A in FIG. 22) corresponding to the string units SU0 and SU1.

As illustrated in FIG. 23, in the cell region 100, the memory cell array 10 further includes a plurality of memory pillars MP, a plurality of contact plugs CP, and a plurality of bit lines BL.

Each of the memory pillars MP functions as one NAND string NS, for example.

The plurality of memory pillars MP are provided along a plurality of "columns" and "rows".

The "columns" in which the plurality of memory pillars MP are arranged extend in the Y-direction, and roughly includes even-numbered columns Ce and odd-numbered columns Co. The even-numbered columns Ce and the odd-numbered columns Co are alternately provided in the X-direction, in the X-direction.

For example, as illustrated in FIG. 23, between the slits SLT in the string units SU0 and SU1, four memory pillars MP are provided in the even-numbered column Ce, and five memory pillars MP are provided in the odd-numbered column Co. The number of memory pillars MP is not limited thereto.

The "rows" in which a plurality of memory pillars MP are arranged extend in the X-direction, and a plurality of rows (for example, 9 rows in this example) are provided in the Y-direction between the slits SLT.

Each row is provided with the memory pillars MP corresponding to either the even-numbered columns Ce or the odd-numbered columns Co.

The plurality of memory pillars MP provided in adjacent even-numbered columns Ce and odd-numbered columns Co may be described as being staggered in the Y-direction.

The memory pillar MP located so as to overlap the slit SHE does not function as the NAND string NS but is handled as a dummy NAND string NS.

The plurality of bit lines BL extend in the Y-direction and are arranged in the X-direction, respectively. Each bit line BL is located so as to overlap at least one memory pillar MP for each string unit SU. In this example, two bit lines BL overlap each memory pillar MP. A contact plug CP is provided between one bit line BL of the plurality of bit lines BL overlapping the memory pillar MP and the memory pillar MP. Each memory pillar MP is electrically connected to the corresponding bit line BL via the contact plug CP.

As described above, the memory pillar MP that overlaps the slit SHE is a dummy. For that reason, the contact plug CP between the memory pillar MP and the bit line BL that overlaps the slit SHE is omitted. The number and layout of the memory pillars MP, the slits SHE and the like between the adjacent slits SLT are not limited to the configuration described with reference to FIG. 23, and may be changed as appropriate.

1-2-4-3. Cross-Sectional Structure in Cell Region of Memory Cell Array

Next, an example of a cross-sectional structure in the cell region 100 of the memory cell array 10 in the semiconductor memory device 1 according to the first embodiment will be described with reference to FIG. 24.

Figure 24:
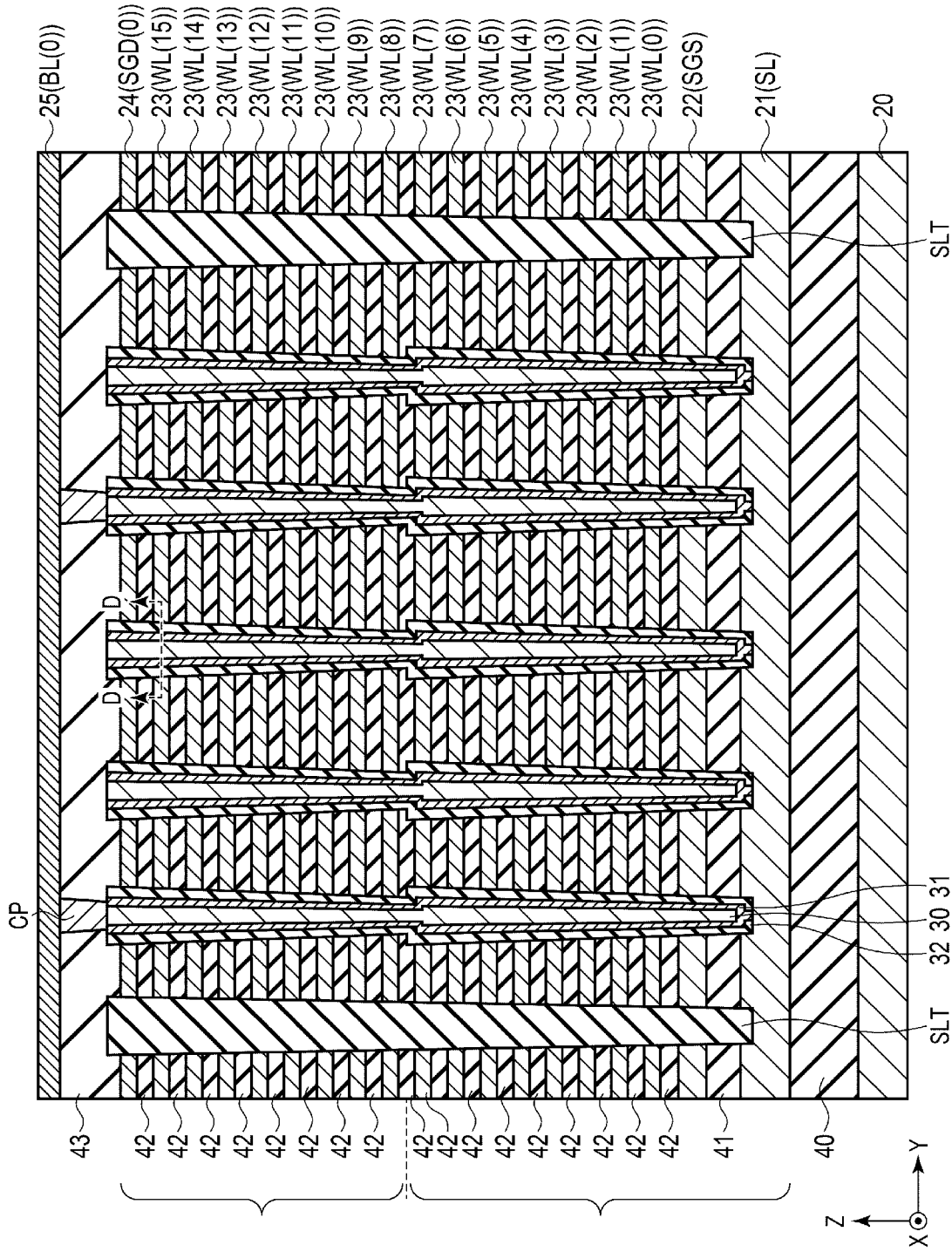
FIG. 24 is a cross-sectional view taken along line C-C of FIG. 23, and illustrates an example of a cross-sectional structure in the cell region of the memory cell array in the semiconductor memory device according to the first embodiment.

FIG. 24 is a cross-sectional view taken along line C-C of FIG. 23, and illustrates an example of a cross-sectional structure in the cell region 100 of the memory cell array 10 in the semiconductor memory device 1 according to the first embodiment. As illustrated in FIG. 24, the memory cell array 10 further includes conductor layers 21-25. The conductor layers 21 to 25 are provided above the semiconductor substrate 20.

Specifically, the conductor layer 21 is provided above the semiconductor substrate 20 via an insulator layer 40. The insulator layer 40 between the semiconductor substrate 20 and the conductor layer 21 may be provided with a circuit corresponding to, for example, the row decoder module 15, the sense amplifier module 16, or the like. For example, the conductor layer 21 is formed in a plate shape extending along the XY plane, and is used as the source line SL. The conductor layer 21 contains, for example, silicon (Si).

The conductor layer 22 is provided above the conductor layer 21 with an insulator layer 41 interposed therebetween. For example, the conductor layer 22 is formed in a plate shape extending along the XY plane, and is used as the select gate line SGS. The conductor layer 22 contains, for example, silicon.

Insulator layers 42 and the conductor layers 23 are alternately stacked above the conductor layers 22. The conductor layer 23 is formed, for example, in a plate shape spreading along the XY plane. For example, the plurality of stacked conductor layers 23 correspond to the word lines WL(0) to WL(15) in order from the semiconductor substrate 20 side. The conductor layer 23 contains, for example, tungsten (W).

The conductor layer 24 is stacked above the uppermost conductor layer 23 with the insulator layer 42 interposed therebetween. For example, the conductor layer 24 is formed in a plate shape spreading along the XY plane. For example, the conductor layer 24 corresponds to the select gate line SGD. The conductor layer 24 contains, for example, tungsten.

The conductor layer 25 is provided above the uppermost conductor layer 24 with an insulator layer 43 interposed therebetween. The conductor layer 25 is formed, for example, in a line shape extending along the Y-direction, and is used as the bit line BL. The conductor layer 25 contains, for example, copper (Cu).

The plurality of conductor layers 23 may be described as a stacked body.

Each of the memory pillars MP is provided extending along the Z-direction and penetrates the conductor layers 22 to 24. Each of the memory pillars MP is formed inside a memory hole MH.

The memory hole MH penetrates the conductor layers 22 to 24, and the bottom thereof is in contact with the conductor layer 21.

Each of the memory pillars MP includes a core member 30, a semiconductor layer 31, and a stacked film 32, for example.

Specifically, the core member 30 is provided extending along the Z-direction. For example, the upper end of the core member 30 is in an upper layer than the uppermost conductor layer 24, and the lower end of the core member 30 is in a layer in which the conductor layer 21 is provided. The semiconductor layer 31 includes, for example, a portion that covers the side surface and the bottom surface of the core member 30 and a columnar shape portion that extends in the Z-direction at the bottom of the core member 30. For example, the bottom of the columnar portion of the semiconductor layer 31 is in the layer provided with the conductor layer 21. The stacked film 32 covers the side surface and the bottom surface of the semiconductor layer 31 except for the portion where the columnar portion of the semiconductor layer 31 is provided. For example, the bottom of the columnar portion of the stacked film 32 is in the layer provided with the conductor layer 21. The core member 30 includes an insulator such as silicon oxide ($SiO_2$). The semiconductor layer 31 contains, for example, silicon.

A columnar contact plug CP is provided on the upper surface of the semiconductor layer 31 in the memory pillar MP. In the illustrated region, contact plugs CP corresponding to two memory pillars MP among the five memory pillars MP are displayed. The contact plug CP in each region is connected to the memory pillar MP that does not overlap the slit SHE in the region.

One conductor layer 25, that is, one bit line BL is in contact with the upper surface of the contact plug CP. One contact plug CP is connected to one conductor layer 25 in respective space (string unit) partitioned by the slits SLT and SHE and the memory pillar MP in contact with the slit SHE.

The slit SLT is formed in, for example, a plate shape that extends along the XZ plane, and divides the conductor layers 22 to 24. The upper end of the slit SLT is in a layer between the uppermost conductor layer 24 and the conductor layer 25. The lower end of the slit SLT is, for example, in a layer provided with the conductor layer 21. The slit SLT includes an insulator such as silicon oxide.

The slit SHE is formed, for example, in a plate shape extending along the XZ plane, and divides the stacked conductor layers 24. The upper end of the slit SHE is in a layer between the conductor layer 24 and the conductor layer 25. The lower end of the slit SHE is in a layer between the uppermost conductor layer 23 and the conductor layer 24, for example. The slit SHE includes an insulator such as silicon oxide. For example, the upper end of the slit SHE and the upper end of the memory pillar MP are aligned. Without being limited thereto, the upper end of the memory pillar MP and the upper ends of the slits SLT and SHE do not need to be aligned.

In the embodiment, a range extending from the source line SL to the word line WL(7) is defined as the lower layer LL.

A range extending from the word line WL(8) to the select gate line SGD is defined as the upper layer UL.

1-2-4-4. Cross-Sectional Structure of Memory Pillar MP of Memory Cell Array 10

Figure 25:
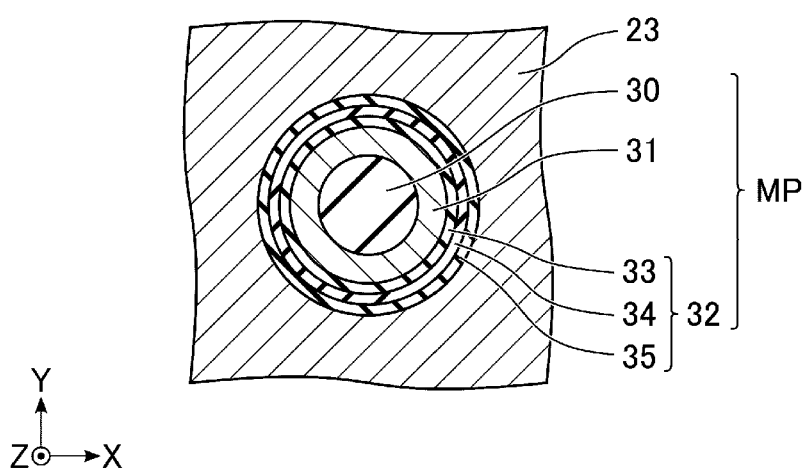
FIG. 25 is a cross-sectional view taken along line D-D of FIG. 24, and illustrates an example of a cross-sectional structure of a memory pillar in the semiconductor memory device according to the first embodiment.

FIG. 25 is a cross-sectional view taken along line D-D of FIG. 24, and illustrates an example of a cross-sectional structure of the memory pillar MP in the semiconductor memory device 1 according to the first embodiment. More specifically, FIG. 25 illustrates a cross-sectional structure of the memory pillar MP in a layer parallel to the front surface of the semiconductor substrate 20 and including the conductor layer 23.

As illustrated in FIG. 25, in the layer including the conductor layer 23, the core member 30 is provided in the middle of the memory pillar MP, for example. The semiconductor layer 31 surrounds the side surface of the core member 30. The stacked film 32 surrounds the side surface of the semiconductor layer 31. The stacked film 32 includes, for example, a tunnel insulating film 33, an insulating film 34, and a block insulating film 35.

The tunnel insulating film 33 surrounds the side surface of the semiconductor layer 31. The insulating film 34 surrounds the side surface of the tunnel insulating film 33. The block insulating film 35 surrounds the side surface of the insulating film 34. The conductor layer 23 surrounds the side surface of the block insulating film 35. Each of the tunnel insulating film 33 and the block insulating film 35 contains, for example, silicon oxide. The insulating film 34 contains, for example, silicon nitride (SiN).

In the structure of the memory pillar MP described above, a portion where the memory pillar MP and the conductor layer 22 intersect functions as the select transistor ST2. A portion where the memory pillar MP and the conductor layer 23 intersect functions as the memory cell transistor MT. A portion where the memory pillar MP and the conductor layer 24 intersect functions as the select transistor ST1.

That is, the semiconductor layer 31 is used as a channel for each of the memory cell transistors MT0 to MT7 and the select transistors ST1 and ST2. The insulating film 34 is used as a charge storage layer of the memory cell transistor MT. With this configuration, each of the memory pillars MP functions as one NAND string NS.

1-2-4-5. Structure of Connection Region

Next, the structure of the connection region 101 of the semiconductor memory device 1 according to the first embodiment will be described.

Figure 26:
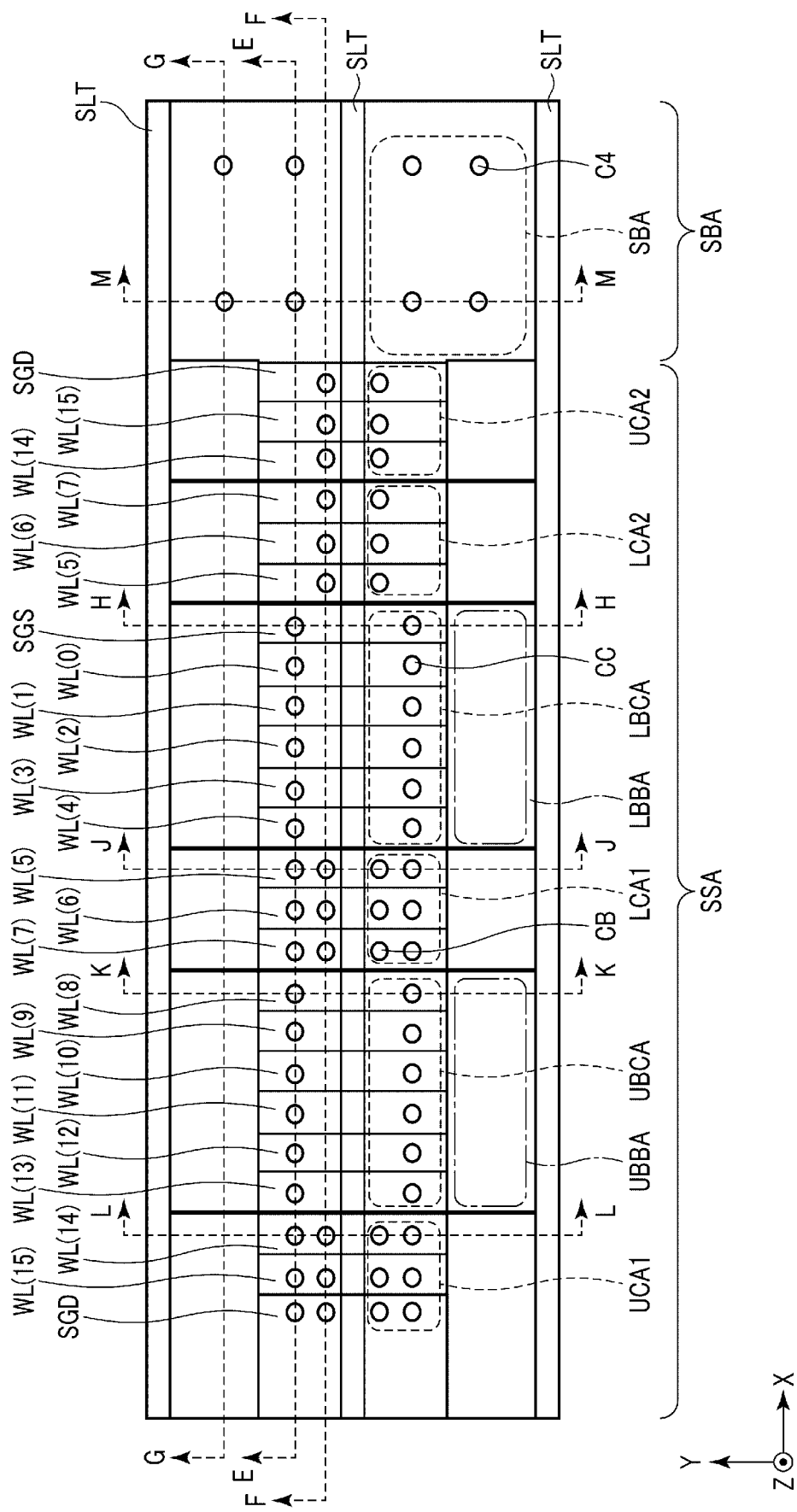
FIG. 26 is an example of a planar layout of the connection region of the semiconductor memory device according to the first embodiment, and illustrates extracted two connection regions (B in FIG. 22) that are adjacent in the Y-direction.

FIG. 26 is an example of a planar layout of the connection region 101 of the semiconductor memory device 1 according to the first embodiment, and illustrates extracted two connection regions 101 (B in FIG. 22) adjacent in the Y-direction. More specifically, FIG. 26 illustrates a staircase region and a subway region provided between the block BLK(n) and the block BLK(n−1) illustrated in FIGS. 8 and 11.

Figure 27:
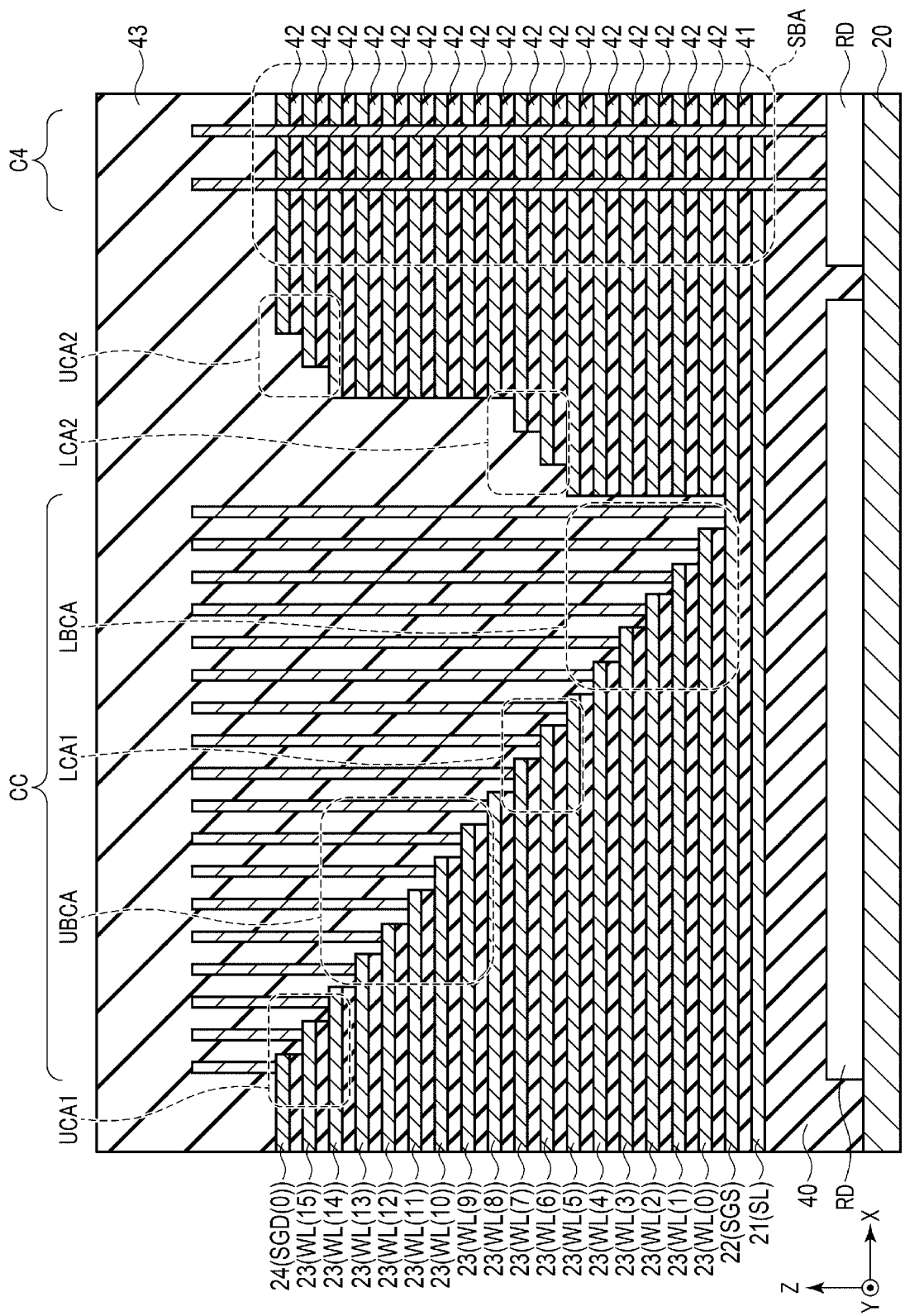
FIG. 27 is a cross-sectional view taken along line E-E of FIG. 26, and illustrates an example of a cross-sectional structure of a subway connection region and a staircase region.

FIG. 27 is a cross-sectional view taken along line E-E of FIG. 26, and illustrates an example of a cross-sectional structure of the subway connection region and the staircase region. More specifically, FIG. 27 illustrates the contact plug CC provided in the staircase region.

Figure 28:
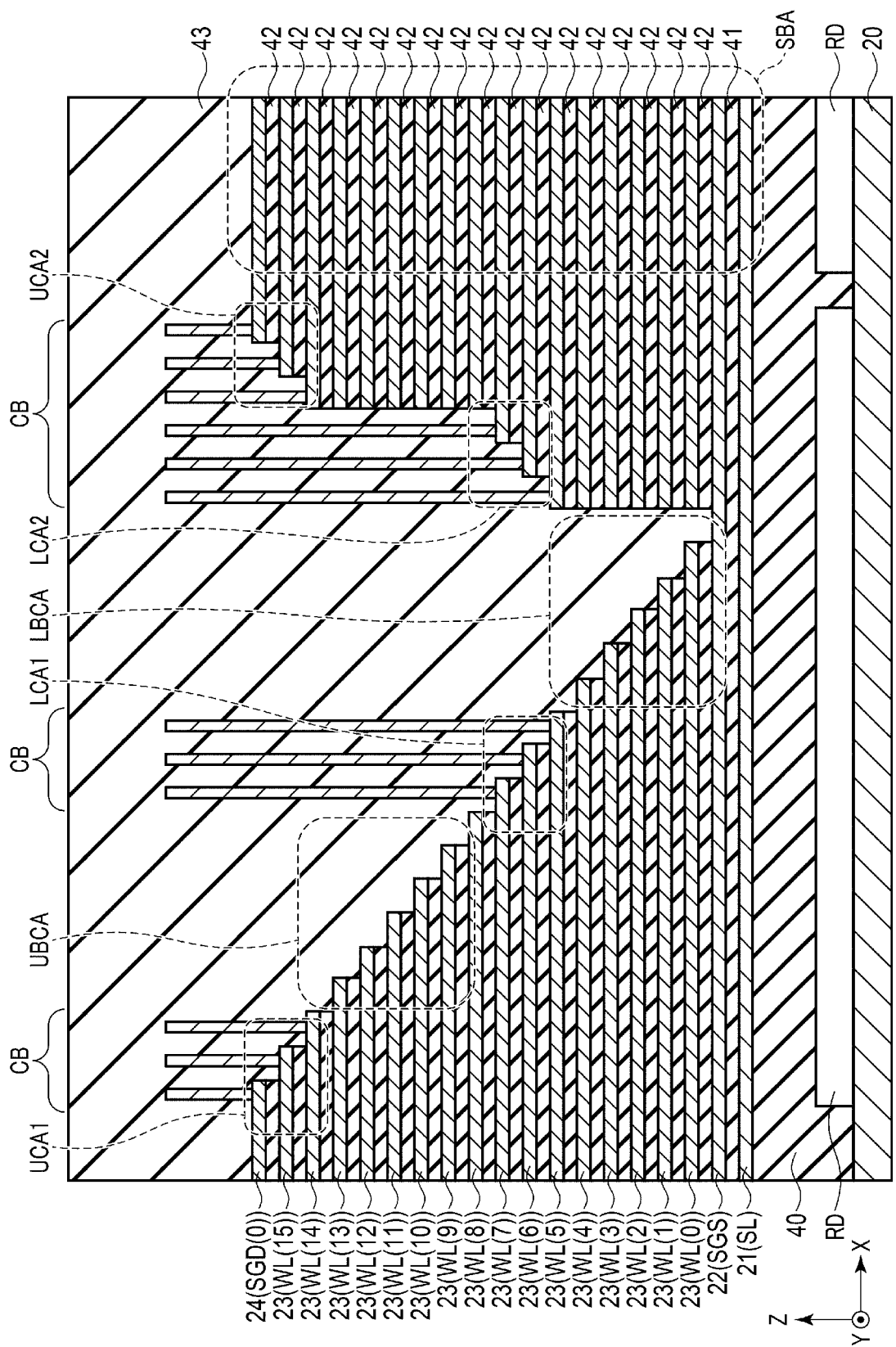
FIG. 28 is a cross-sectional view taken along line F-F of FIG. 26, and illustrates another example of the cross-sectional structure of the subway connection region and the staircase region.

FIG. 28 is a cross-sectional view taken along line F-F of FIG. 26, and illustrates an example of a cross-sectional structure of the subway connection region and the staircase region. More specifically, FIG. 28 illustrates the contact plug CB provided in the staircase region.

Figure 29:
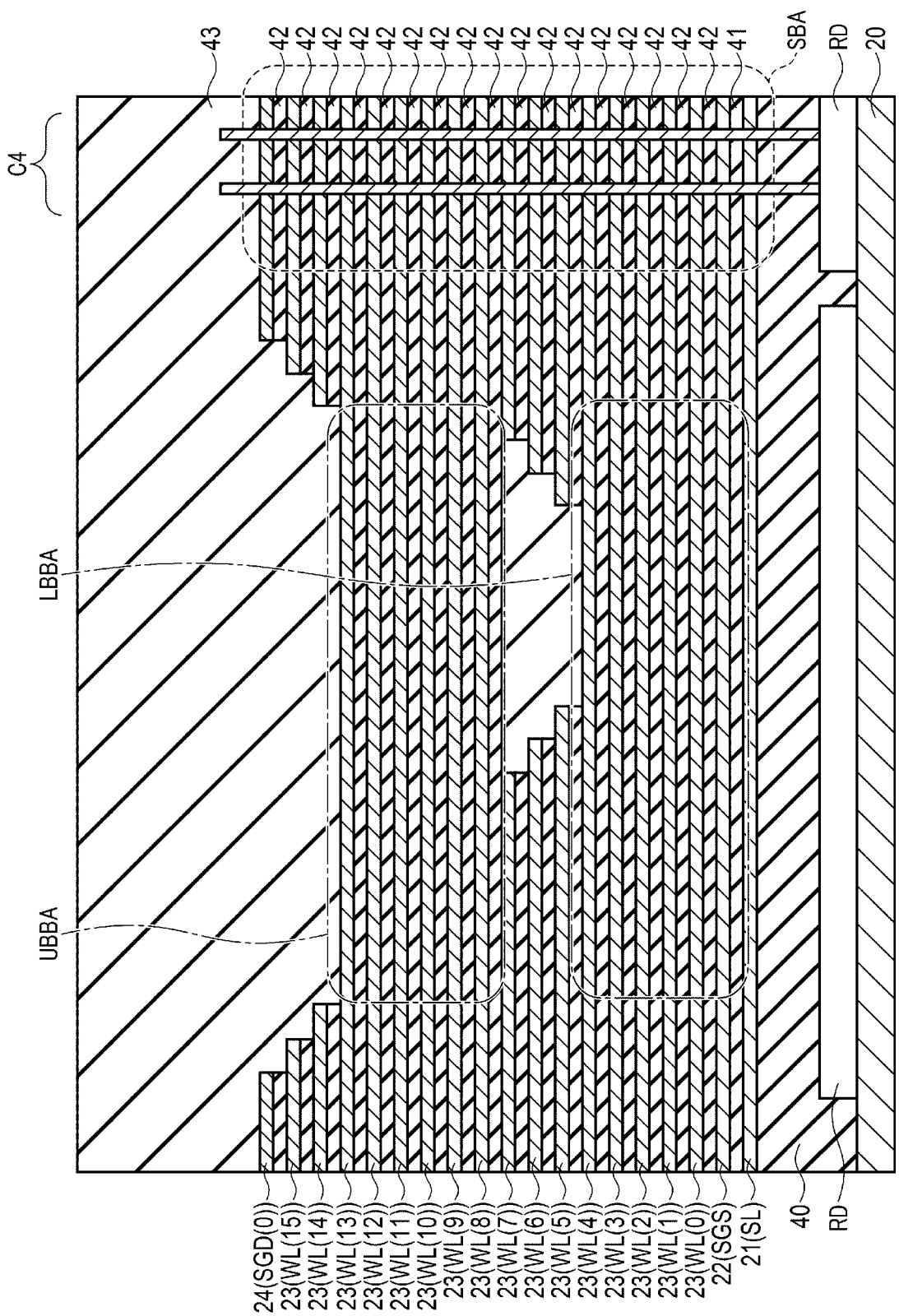
FIG. 29 is a cross-sectional view taken along line G-G in FIG. 26, and illustrates another example of the cross-sectional structure of the subway connection region and the staircase region.

FIG. 29 is a cross-sectional view taken along line G-G in FIG. 26, and illustrates an example of a cross-sectional structure of the subway connection region and the staircase region. More specifically, FIG. 29 illustrates the lower bridge region LBBA, the upper bridge region UBBA, and the subway region.

Figure 30:
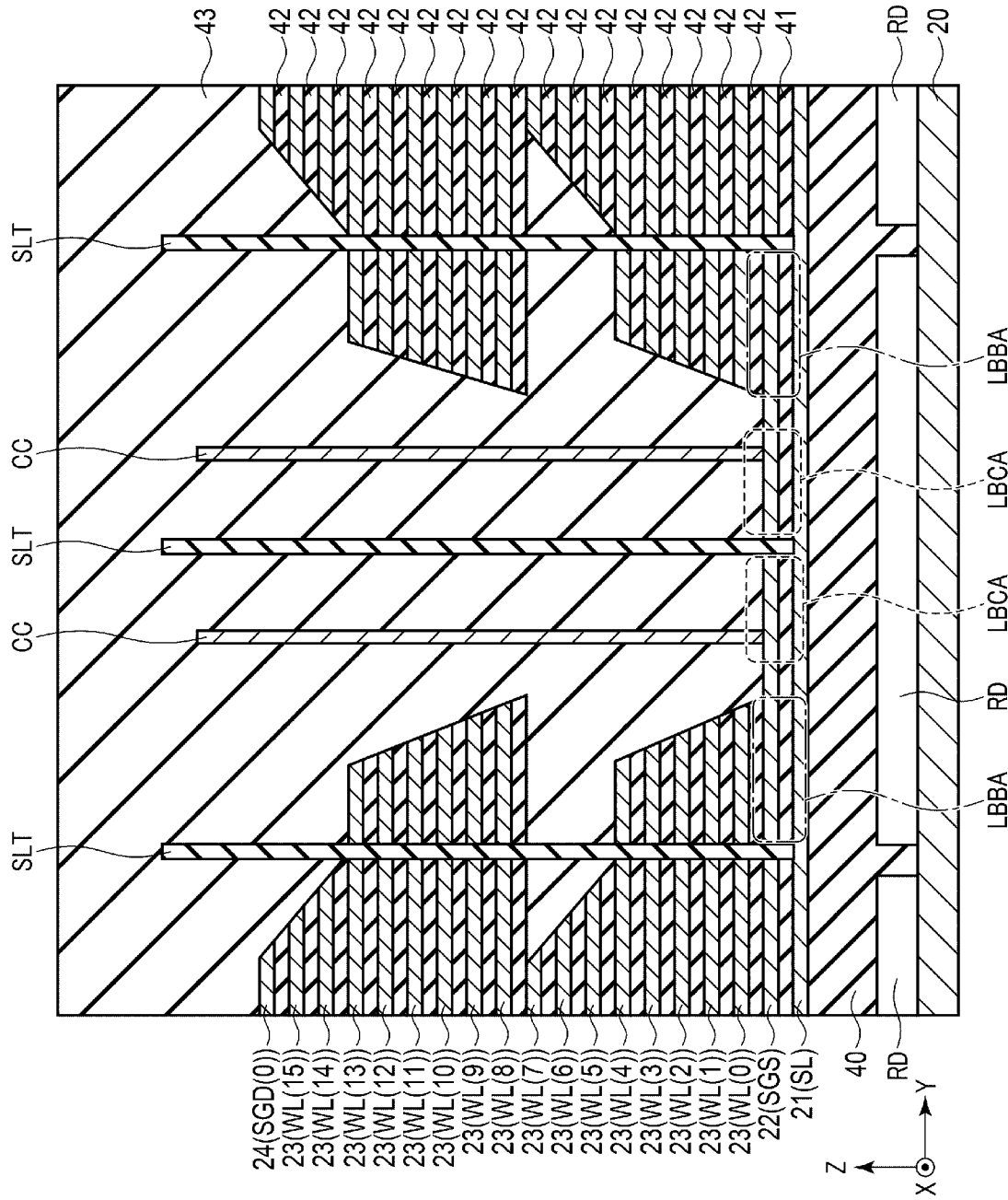
FIG. 30 is a cross-sectional view taken along line H-H in FIG. 26, and illustrates an example of a cross-sectional structure of a lower bridge region and a lower subway connection region.

FIG. 30 is a cross-sectional view taken along line H-H in FIG. 26, and illustrates an example of a cross-sectional structure of the lower bridge region LBBA and the lower subway connection region LBCA. More specifically, FIG. 30 illustrates an example of a cross-sectional structure of the terrace portion relating to the select gate line SGS of the block BLK(n) and the block BLK(n−1) and the lower bridge region LBBA for the select gate line SGS.

Figure 31:
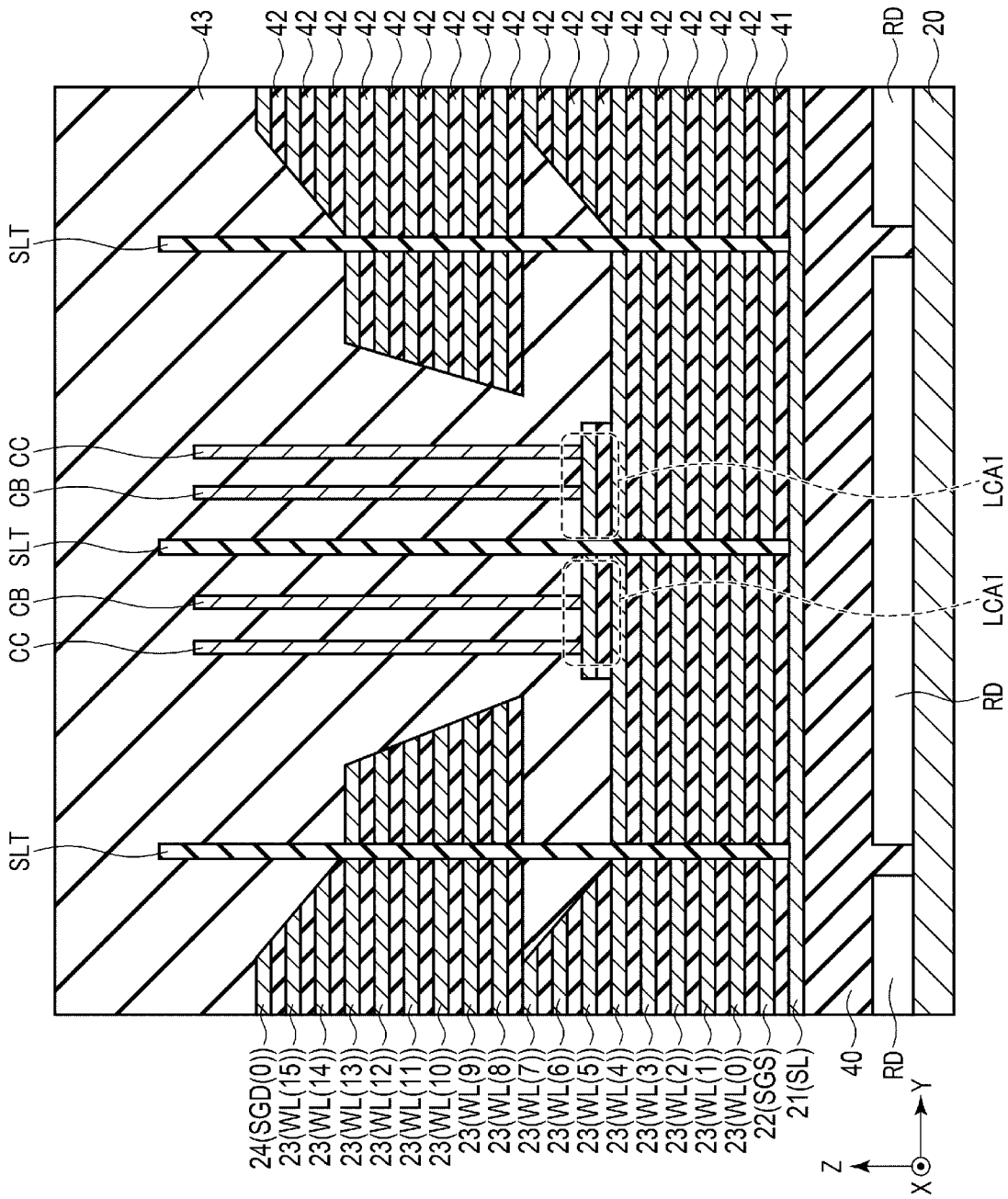
FIG. 31 is a cross-sectional view taken along line J-J of FIG. 26, and illustrates an example of a cross-sectional structure of a first lower connectable region.

FIG. 31 is a cross-sectional view taken along line J-J of FIG. 26, and illustrates an example of the cross-sectional structure of the first lower connectable region LCA1. More specifically, FIG. 31 illustrates a terrace portion relating to the word line WL(5) of the block BLK(n) and the block BLK(n−1), and contact plugs CC and CB provided in the terrace portion.

Figure 32:
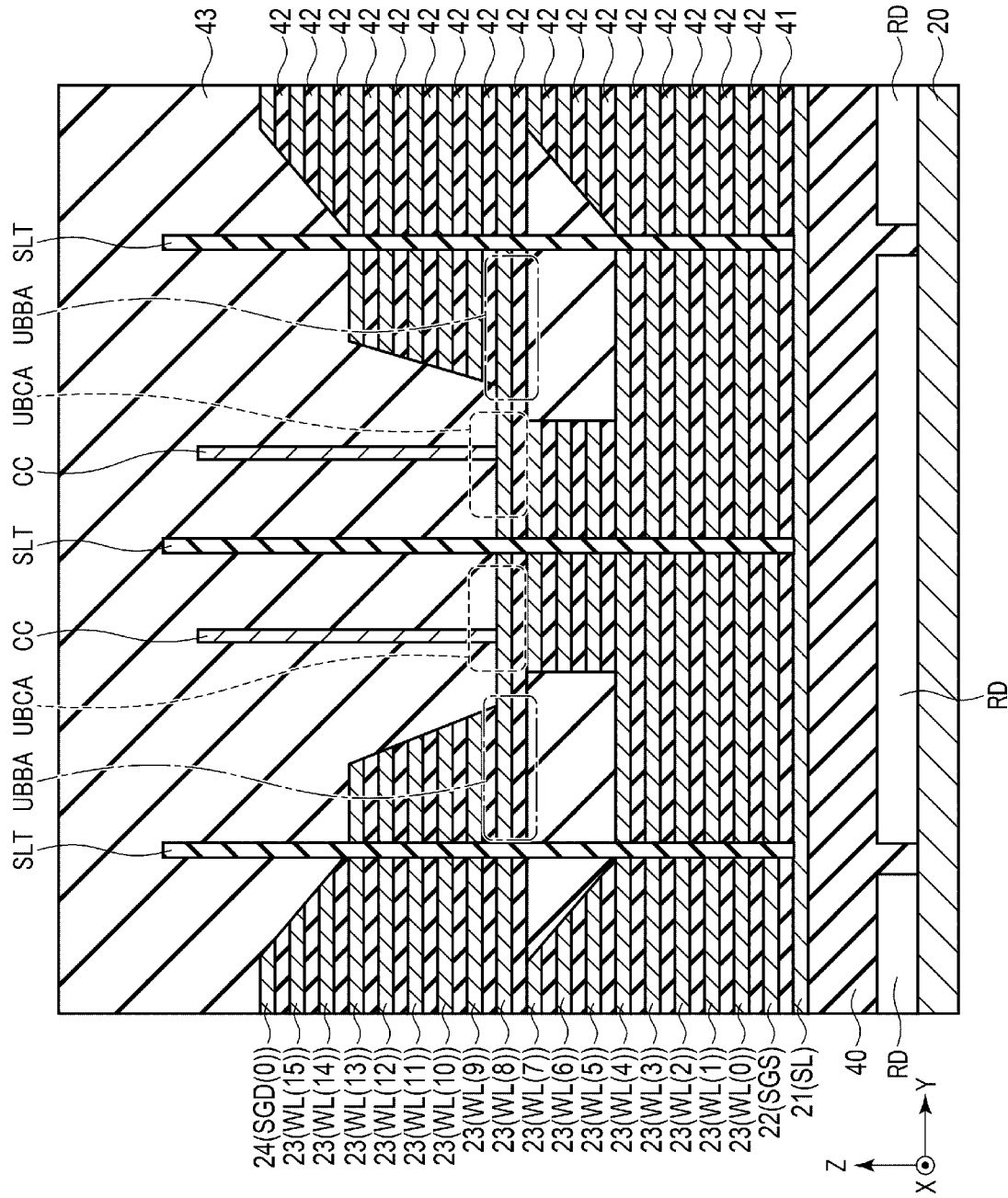
FIG. 32 is a cross-sectional view taken along line K-K of FIG. 26, and illustrates another example of the cross-sectional structure of the lower bridge region and the lower subway connection region.

FIG. 32 is a cross-sectional view taken along line K-K of FIG. 26 and illustrates an example of a cross-sectional structure of the upper bridge region UBBA and the upper subway connection region UBCA. More specifically, FIG. 32 illustrates an example of a cross-sectional structure of the terrace portion relating to the word line WL(8) of the block BLK(n) and the block BLK(n−1) and the upper bridge region UBBA relating to the word line WL(8).

Figure 33:
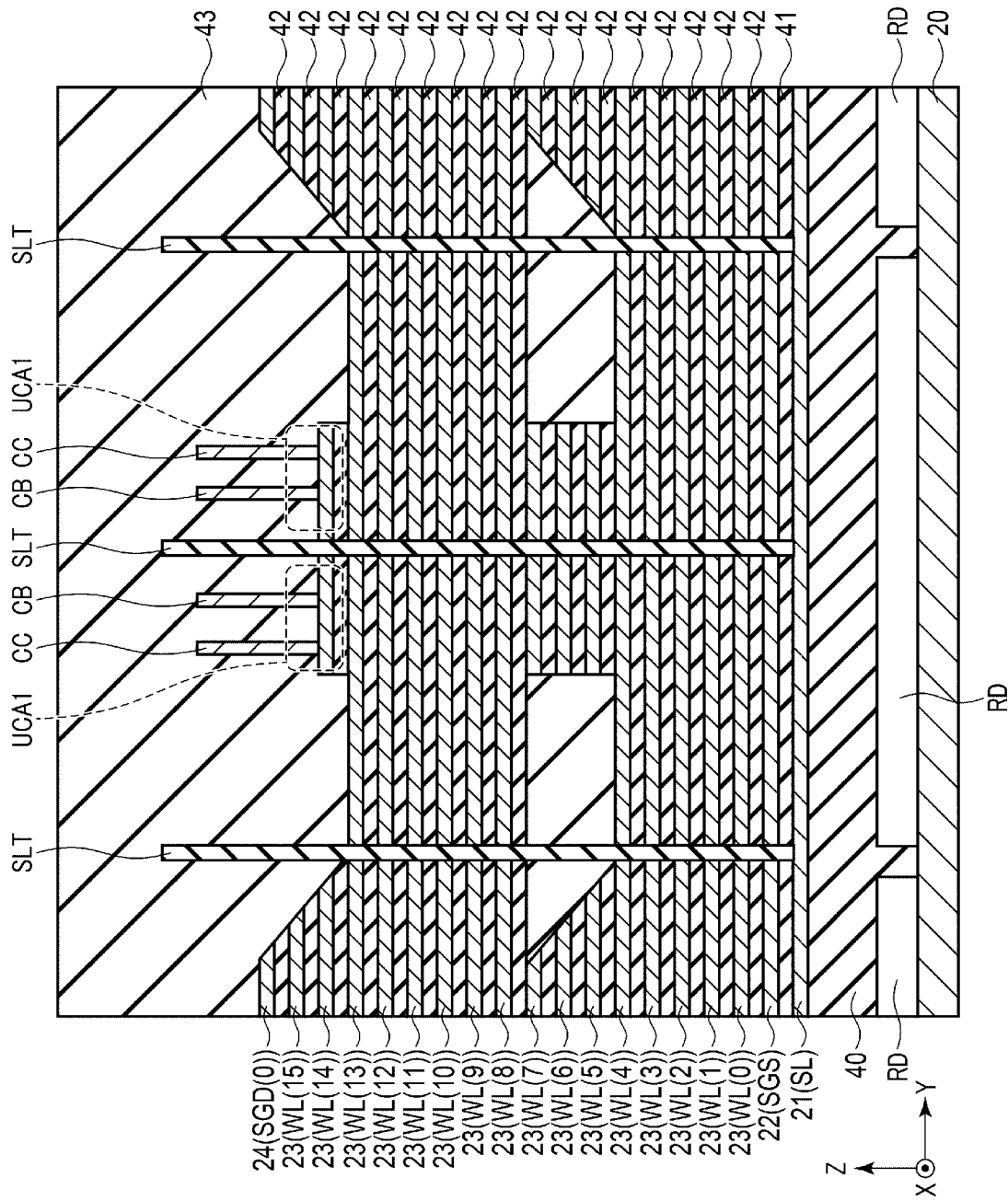
FIG. 33 is a cross-sectional view taken along line L-L in FIG. 26 and illustrates an example of a cross-sectional structure of a first upper connectable region.

FIG. 33 is a cross-sectional view taken along line L-L in FIG. 26, and illustrates an example of the cross-sectional structure of the first upper connectable region UCA1. More specifically, FIG. 33 illustrates a terrace portion relating to the word line WL(14) of the block BLK(n) and the block BLK(n−1), and the contact plugs CC and CB provided in the terrace portion.

Figure 34:
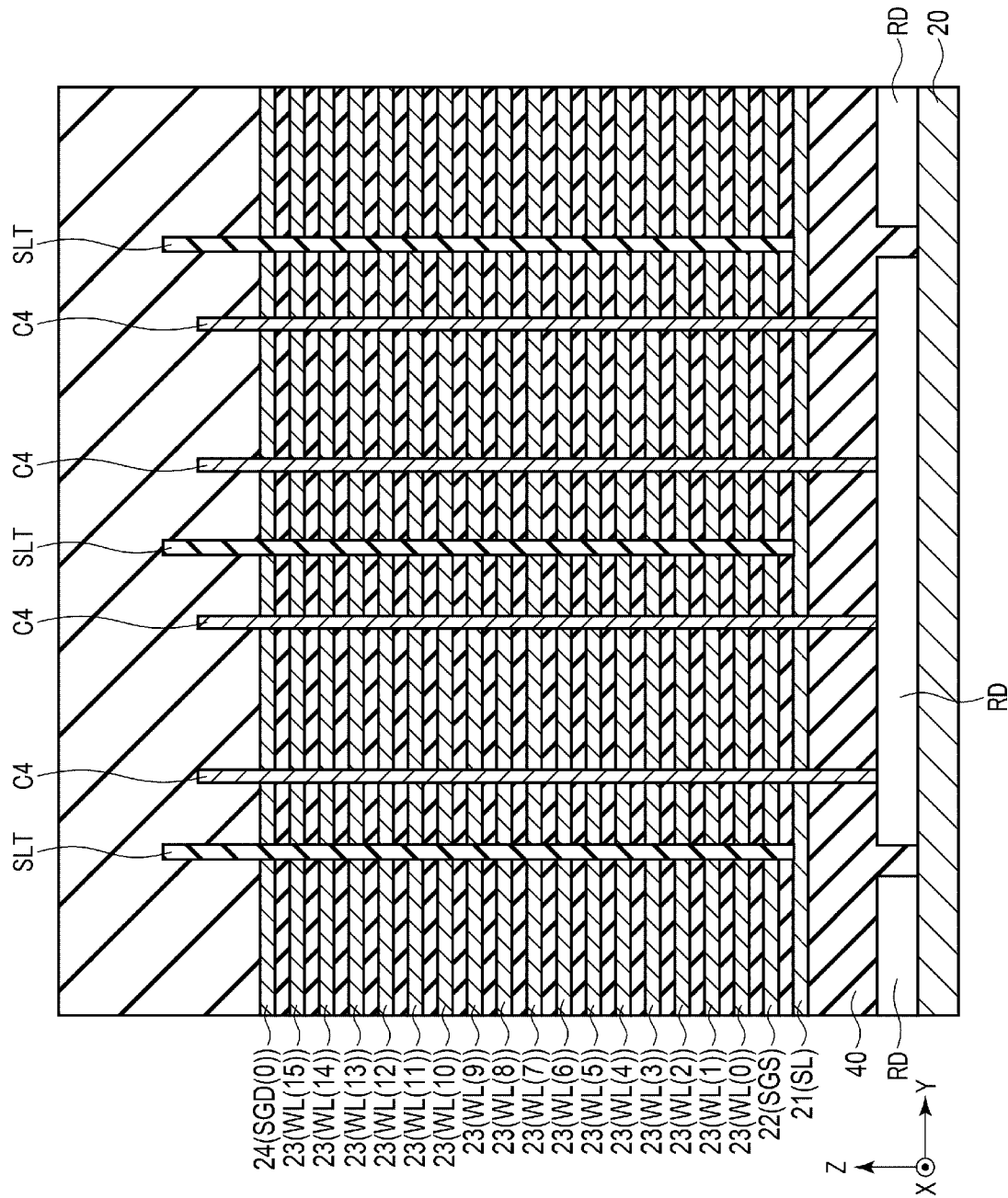
FIG. 34 is a cross-sectional view taken along line M-M in FIG. 26 and illustrates an example of a cross-sectional structure of the subway connection region.

FIG. 34 is a cross-sectional view taken along line M-M in FIG. 26, and illustrates an example of the cross-sectional structure of the subway connection region. More specifically, FIG. 34 illustrates the contact plug C4 provided in the subway connection region.

As illustrated in FIGS. 26, 27, and 34, the contact plugs CC are, for example, located in the same straight line in the X-direction. The contact plug C4 penetrates subway region (lower) SBA-L and the subway region (upper) SBA-U and is connected to the row decoder RD.

Similarly, as illustrated in FIGS. 26 and 28, the contact plugs CB are located, for example, in the same straight line in the X-direction. In particular, as illustrated in FIG. 28, the positions (that is, height from a semiconductor substrate) of the first lower connectable region LCA1 and the second lower connectable region LCA2 in the Z-direction are the same.

As illustrated in FIG. 29, the select gate line SGS and the word lines WL(0) to WL(4) are connected to the lower subway connection region LBCA via the lower bridge region LBBA. Similarly, the word lines WL(8) to WL(13) are connected to the upper subway connection region UBCA via the upper bridge region UBBA. On the other hand, the word lines WL(5) to WL(7) are not provided with the lower bridge region LBBA. The word line WL(14), the word line WL(15), and the select gate line SGD are not provided with the upper bridge region UBBA.

As illustrated in FIG. 30, the select gate line SGS is connected to the lower bridge region LBBA via the lower subway connection region LBCA. The same applies to the word lines WL(0) to WL(4). With this configuration, the select gate lines SGS and the word lines WL(0) to WL(4) of two blocks BLK(n) sandwiching the connection region 101 are connected to each other. Similarly, the select gate lines SGS and the word lines WL(0) to WL(4) of the two blocks BLK(n−1) sandwiching the connection region 101 are connected to each other.

As illustrated in FIG. 31, the word line WL(5) is not provided with the lower bridge region LBBA. For that reason, the contact plug CB is provided in the terrace portion of the first lower connectable region LCA1, and is connected to the contact plug CB (see FIG. 26) of the second lower connectable region LCA2 via the lower connection wiring LCL. With this configuration, the word lines WL(5) to WL(7) of the two blocks BLK(n) sandwiching the connection region 101 are connected to each other. Similarly, the word lines WL(5) to WL(7) of the two blocks BLK(n−1) sandwiching the connection region 101 are connected to each other.

As illustrated in FIG. 32, the word line WL(8) is connected to the upper bridge region UBBA via the upper subway connection region UBCA. The same applies to the word lines WL(9) to WL(13). With this configuration, the word lines WL(8) to WL(13) of the two blocks BLK(n) sandwiching the connection region 101 are connected to each other. Similarly, the word lines WL(8) to WL(13) of the two blocks BLK(n−1) sandwiching the connection region 101 are connected to each other.

As illustrated in FIG. 33, the word line WL(14) is not provided with the upper bridge region UBBA. For that reason, the contact plug CB is provided in the terrace portion of the first upper connectable region UCA1, and is connected to the contact plug CB (see FIG. 26) of the second upper connectable region UCA2 via the upper connection wiring UCL. With this configuration, the word line WL(14), the word line WL(15), and the select gate line SGD of the two blocks BLK(n) sandwiching the connection region 101 are connected to each other. Similarly, the word line WL(14), the word line WL(15), and the select gate line SGD of the two blocks BLK(n−1) sandwiching the connection region 101 are connected to each other.

1-3. Effect

According to the embodiment described above, a lead-out region for applying a voltage to the select gate line and the word line is provided in the middle of the memory cell array 10. In the lead-out region, the select gate line and the word line in the two cell regions sandwiching the lead-out region are short-circuited. For that reason, a voltage is propagated to the select gate line and word line, which are in the two cell regions sandwiching the lead-out region, through the lead-out region.

Figure 35:
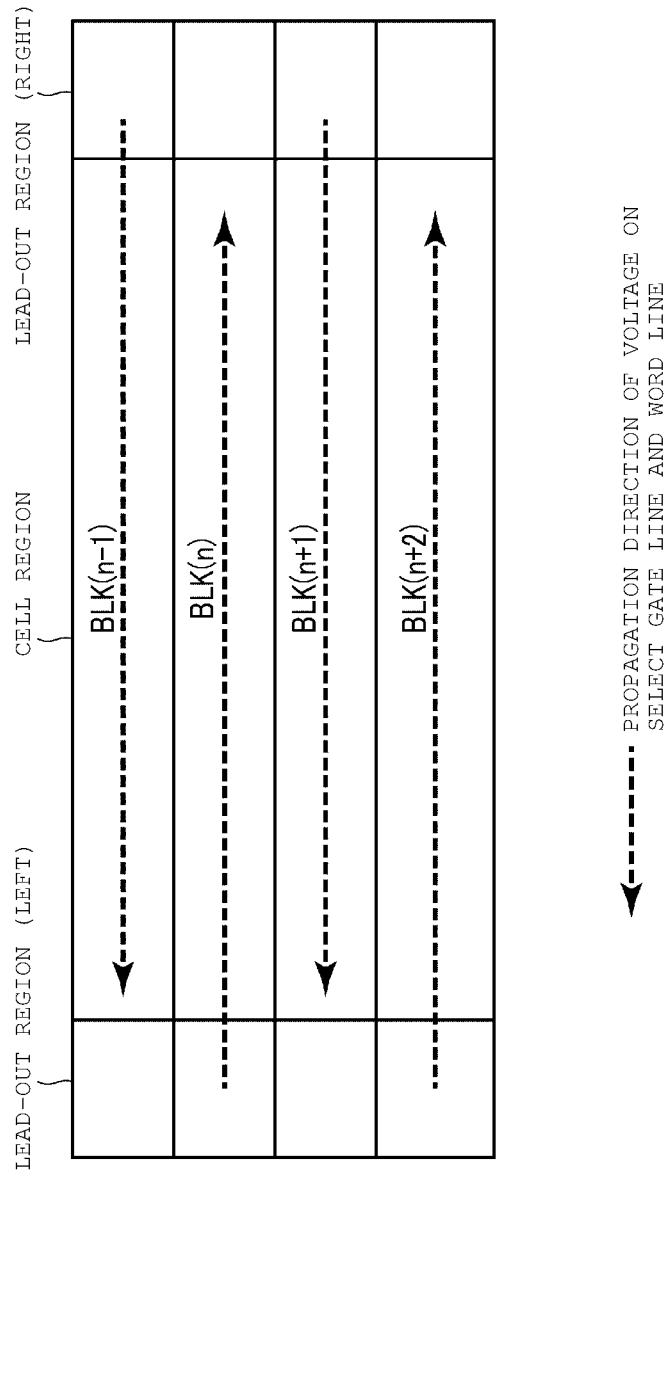
FIG. 35 is a diagram illustrating a propagation direction of a voltage to a cell region according to a comparative example.

In order to explain the effect of this embodiment, a comparative example will be described. FIG. 35 illustrates a part of the cell region and the lead-out region for applying a voltage to the select gate line and the word line in the comparative example.

For example, in the comparative example, lead-out regions are provided at both ends in the X-direction of the cell region. The lead-out region provided on the left side in the paper surface of FIG. 35 is described as a lead-out region (left), and the lead-out region provided on the right side is described as a lead-out region (right).

In the comparative example, for example, even-numbered blocks BLK(BLK(n), BLK(n+2) . . . ) are connected to the lead-out region (left) and odd-numbered blocks BLK(BLK(n−1), BLK(n+1) . . . ) are connected to the lead-out region (right). That is, the select gate lines and the word lines of each block BLK are supplied with (see arrows in the figure) a voltage from one lead-out region (see arrows in the figure).

In recent years, there has been a demand for improvement in write performance and read performance of memory cell transistors while the miniaturization and increases in density of the memory cell transistors proceed. In particular, wiring resistances may increase when wiring widths of the select gate lines and word lines, for example, are reduced.

In the comparative example, a voltage is applied from one side of the select gate line and the word line. For that reason, a voltage propagation speed may be slow due to the relatively high wiring resistance. As a result, the write performance and read performance of the memory cell transistor may be degraded.

Figure 37:
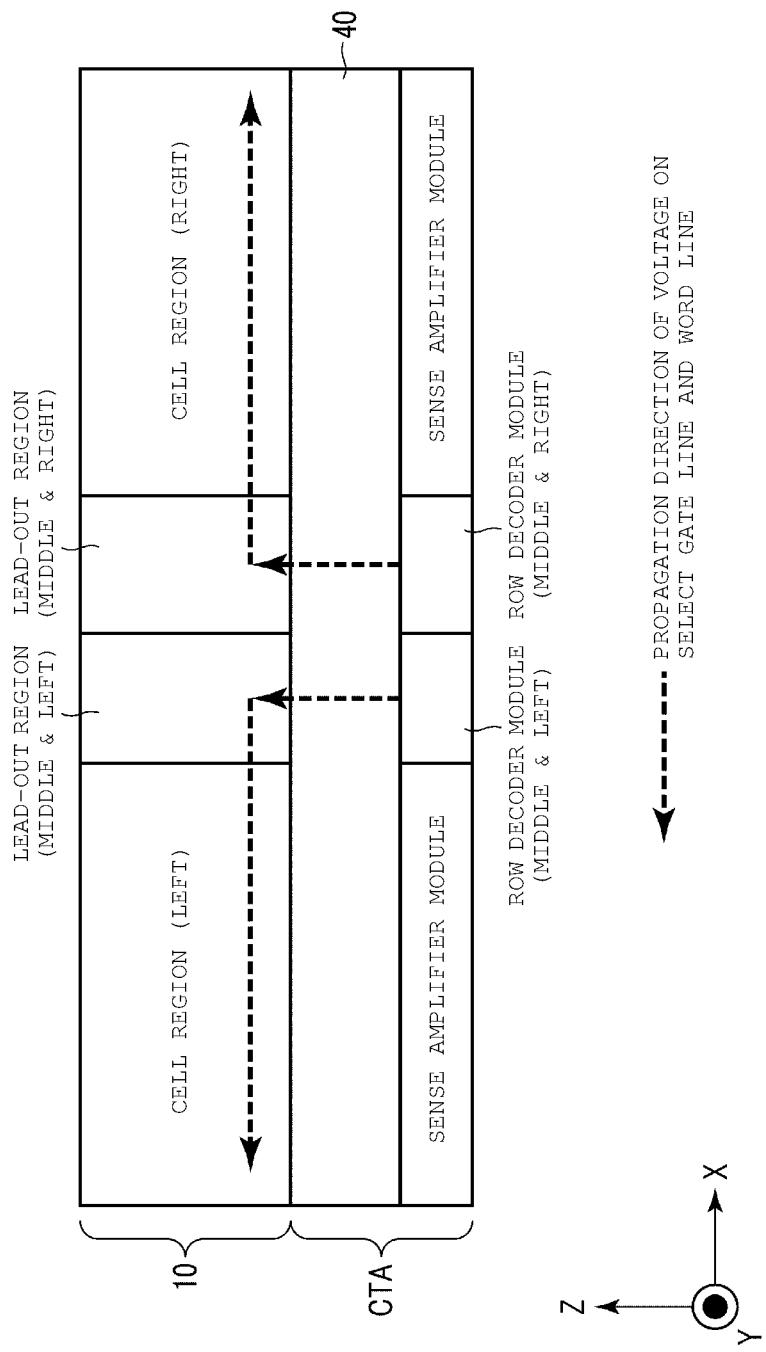
FIG. 37 is another diagram illustrating the propagation direction of the voltage to the cell region according to the comparative example.

In view of this, it may be considered potentially advantageous to provide a lead-out region in the middle of the cell region, such as illustrated in FIG. 36. In the comparative example depicted in FIG. 36, the cell region is divided into left and right portions. The lead-out region is provided between the left cell region and the right cell region. The lead-out region includes a lead-out region (middle & left) relating to a left cell region. The lead-out also includes a lead-out region (middle & right) relating to a right cell region. In this case, as illustrated in FIG. 37, it is necessary to provide a row decoder module (middle & left) for the left cell region and a row decoder module (middle & right) for the cell region.

On the other hand, as illustrated in FIG. 38, in the first embodiment, the connection region 101 is provided between two cell regions 100. The connection region 101 connects the two cell regions 100 and may provide the same voltage to the two cell regions 100 simultaneously. For that reason, as illustrated in FIG. 39, the row decoder module can be shared by the two different cell regions 100. For that reason, the wiring length of the select gate line and the word lines can be halved while also reducing the area required to be occupied by the row decoder module. As a result, it is possible to prevent an increase in resistance in the select gate line and the word lines while preventing an increase in the area occupied by the row decoder module. For that reason, the voltage propagation speed in the first embodiment can be higher than in the comparative example (s). As a result, the semiconductor memory device according to the first embodiment can improve write performance and read performance of the memory cell transistor.

1-4. Modification Example 1

Modification example 1 of the first embodiment will be described. As Modification example 1 of the first embodiment, a connection between the subway region SBA and the staircase region SSA will be described with reference to FIG. 40.

Figure 40:
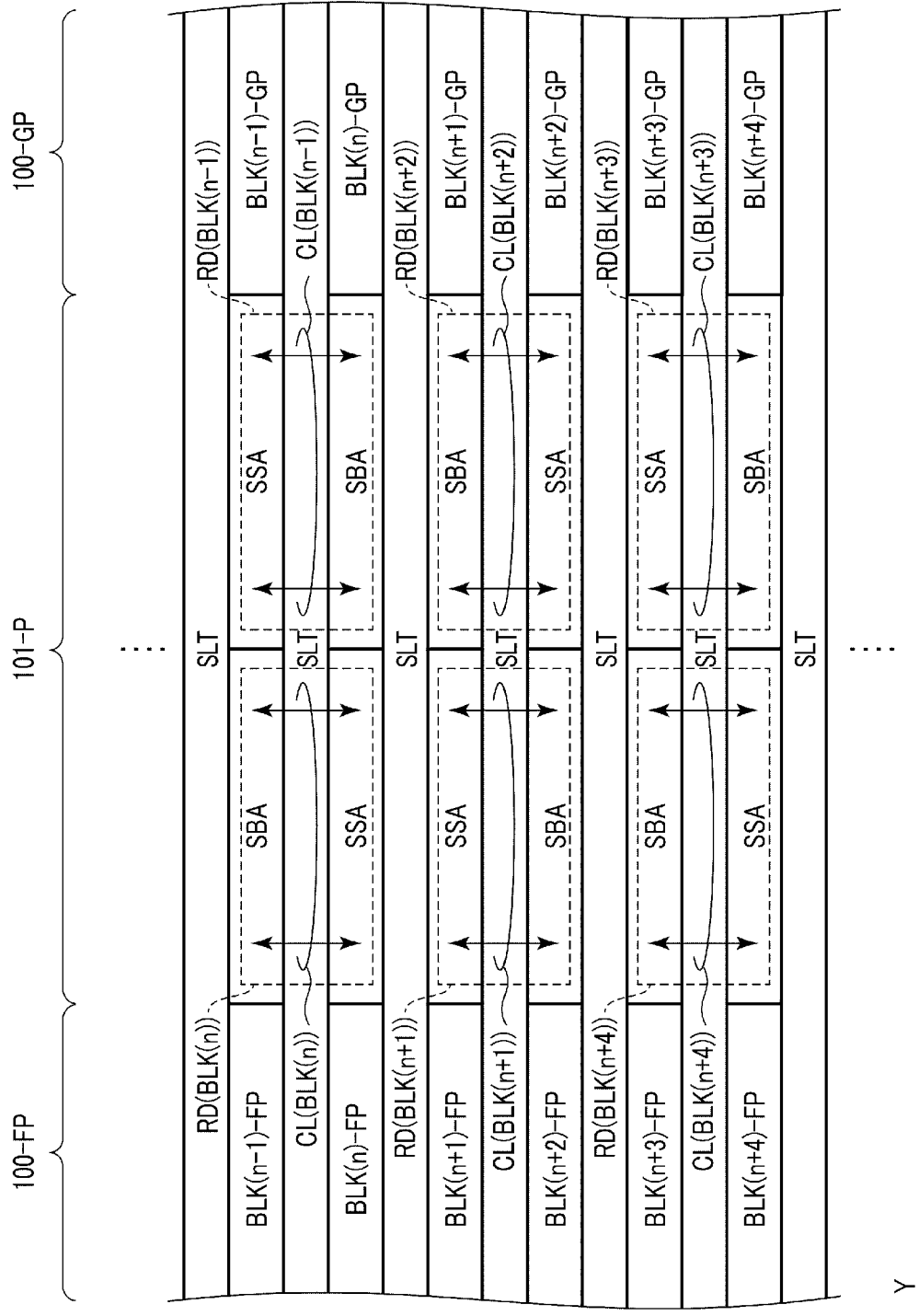
FIG. 40 illustrates a layout example of the connection region and the cell regions sandwiching the connection region.

In FIG. 40, directions of the first contact wiring CL1, which connects the contact plug CC provided in the staircase region SSA and the contact plug C4 provided in the subway region, the second contact wiring CL2, third contact wiring CL3, and fourth contact wiring CL4 (hereinafter denoted as contact wiring CL) and the position of the row decoder RD provided below the connection region in the Z-direction (see the broken line) are illustrated. FIG. 40 specifically illustrates a part of the cell region (upper left) 100-FP, the cell region (upper right) 100-GP, and the connection region (upper) 101-P.

The contact wiring CL for the block BLK(v) is denoted as a CL (BLK(v)). The block BLK(v) belonging to the cell region 100-FP is denoted as a BLK(v)-FP. Furthermore, the block BLK(v) belonging to the cell region 100-GP is denoted as a BLK(v)-GP. A contact plug C4 for the block BLK(v) is denoted as a C4 (BLK(v)). A contact plug CC for the block BLK(v) is denoted as a CC (BLK(v)). The staircase region SSA for the block BLK(v) is denoted as an SSA (BLK(v)). The subway region SBA for the block BLK(v) is denoted as an SBA (BLK(v)).

As illustrated in FIG. 40, the row decoder RD(BLK(n−1)) for the block BLK(n−1) is provided below the staircase region SSA for the block BLK(n−1) and the subway region SBA for the block BLK(n) in the Z-direction.

As described above, a contact plug CC is provided in the staircase region SSA. The subway region SSA is provided with a contact plug C4 that penetrates the subway region SSA and is connected to the row decoder RD provided below the subway region SSA in the Z-direction.

As described above, the subway region SSA has two functions: connecting the blocks BLK adjacent in the X-direction and connecting the select gate line SGS, the word lines WL0 to WL15, and the select gate line SGD of the block BLK to the row decoder RD provided below subway region SSA.

In this modification example, in the X-direction, the subway region SSA (BLK(v)) sandwiched between the two blocks BLK(v) connects two blocks BLK(v) adjacent in the X-direction. Then, the subway region SSA (BLK(v)) includes the contact plug C4(BLK(v±1)) for connecting the select gate line SGS, word lines WL0 to WL15, and select gate line SGD of the block BLK(v±1) adjacent to the block BLK(v) in the Y-direction to the row decoder RD(BLK(v±1)) for the block BLK(v±1). The contact plug C4 (BLK(v±1)) is connected to a contact plug CC(BLK(v±1)) provided in the staircase region SSA(BLK(v±1)) relating to the block BLK(v±1) via the wiring CL BLK(v±1)) extending in the Y-direction. As a result, the subway region SSA(BLK(v)) can connect the select gate line SGS, word lines WL0 to WL15, and select gate line SGD of the block BLK(v±1) to the row decoder RD(BLK(v±1)) for the block BLK(v±1).

Specifically, the select gate line SGS, word lines WL0 to WL15, and select gate line SGD of the block BLK(n−1) are connected to the row decoder RD(BLK(n−1)) for the block BLK(n−1) via the staircase region SSA(BLK(n−1)), the contact plug CC(BLK(n−1)) provided in the staircase region SSA(BLK(n−1)), the contact plug C4 (BLK(n−1)) for the block BLK(n−1) penetrating the subway region SBA(BLK(n)) relating to the block BLK(n), and the wiring CL(BLK(n−1)) for connecting the contact plug CC(BLK(n−1)) and the contact plug C4 (BLK(n−1).

Specifically, the select gate line SGS, word lines WL0 to WL15, and select gate line SGD of the block BLK(n) are connected to the row decoder RD(BLK(n)) for the block BLK(n) via the staircase region SSA(BLK(n)), the contact plug CC(BLK(n)) provided in the staircase region SSA (BLK(n)), the contact plug C4(BLK(n)) for the block BLK(n) penetrating the subway region SBA(BLK(n−1)) for the block BLK(n−1), and the wiring CL(BLK(n)) for connecting the contact plug CC(BLK(n)) and the contact plug C4(BLK(n)).

Similarly, the select gate line SGS, word lines WL0 to WL15, and select gate line SGD of the block BLK(n+1) are connected to the row decoder RD(BLK(n+1)) for the block BLK(n+1) via the staircase region SSA(BLK(n+1)), the contact plug CC(BLK(n+1)) provided in the staircase region SSA(BLK(n+1)), the contact plug C4(BLK(n+1)) for the block BLK(n+1) penetrating the subway region SBA(BLK(n+2)) relating to the block BLK(n+2), and the wiring CL(BLK(n+1)) for connecting the contact plug CC(BLK(n+1)) and the contact plug C4(BLK(n+1).

The select gate line SGS, word lines WL0 to WL15, and select gate line SGD of the block BLK(n+2) are connected to the row decoder RD(BLK(n+2)) for the block BLK(n+2) via the staircase region SSA(BLK(n+2)), the contact plug CC(BLK(n+2)) provided in the staircase region SSA(BLK (n+2)), the contact plug C4(BLK(n+2)) for the block BLK (n+2) penetrating the subway region SBA(BLK(n+1)) relating to the block BLK(n+1), and the wiring CL(BLK(n+2)) for connecting the contact plug CC(BLK(n+2)) and the contact plug C4(BLK(n+2).

Similarly, the select gate line SGS, word lines WL0 to WL15, and select gate line SGD of the block BLK(n+3) are connected to the row decoder RD(BLK(n+3)) for the block BLK(n+3) via the staircase region SSA(BLK(n+3)), the contact plug CC(BLK(n+3)) provided in the staircase region SSA(BLK(n+3)), the contact plug C4(BLK(n+3)) for the block BLK(n+3) penetrating the subway region SBA(BLK (n+4)) relating to the block BLK(n+4), and the wiring CL(BLK(n+3)) for connecting the contact plug CC(BLK(n+ 3)) and the contact plug C4(BLK(n+3).

The select gate line SGS, word lines WL0 to WL15, and select gate line SGD of the block BLK(n+4) are connected to the row decoder RD(BLK(n+4)) for the block BLK(n+4) via the staircase region SSA(BLK(n+4)), the contact plug CC(BLK(n+4)) provided in the staircase region SSA(BLK (n+4)), the contact plug C4(BLK(n+4)) for the block BLK (n+4) penetrating the subway region SBA(BLK(n+3)) relating to the block BLK(n+3), and the wiring CL(BLK(n+4)) for connecting the contact plug CC(BLK(n+4)) and the contact plug C4(BLK(n+4).

1-5. Modification Example 2

Figure 41:
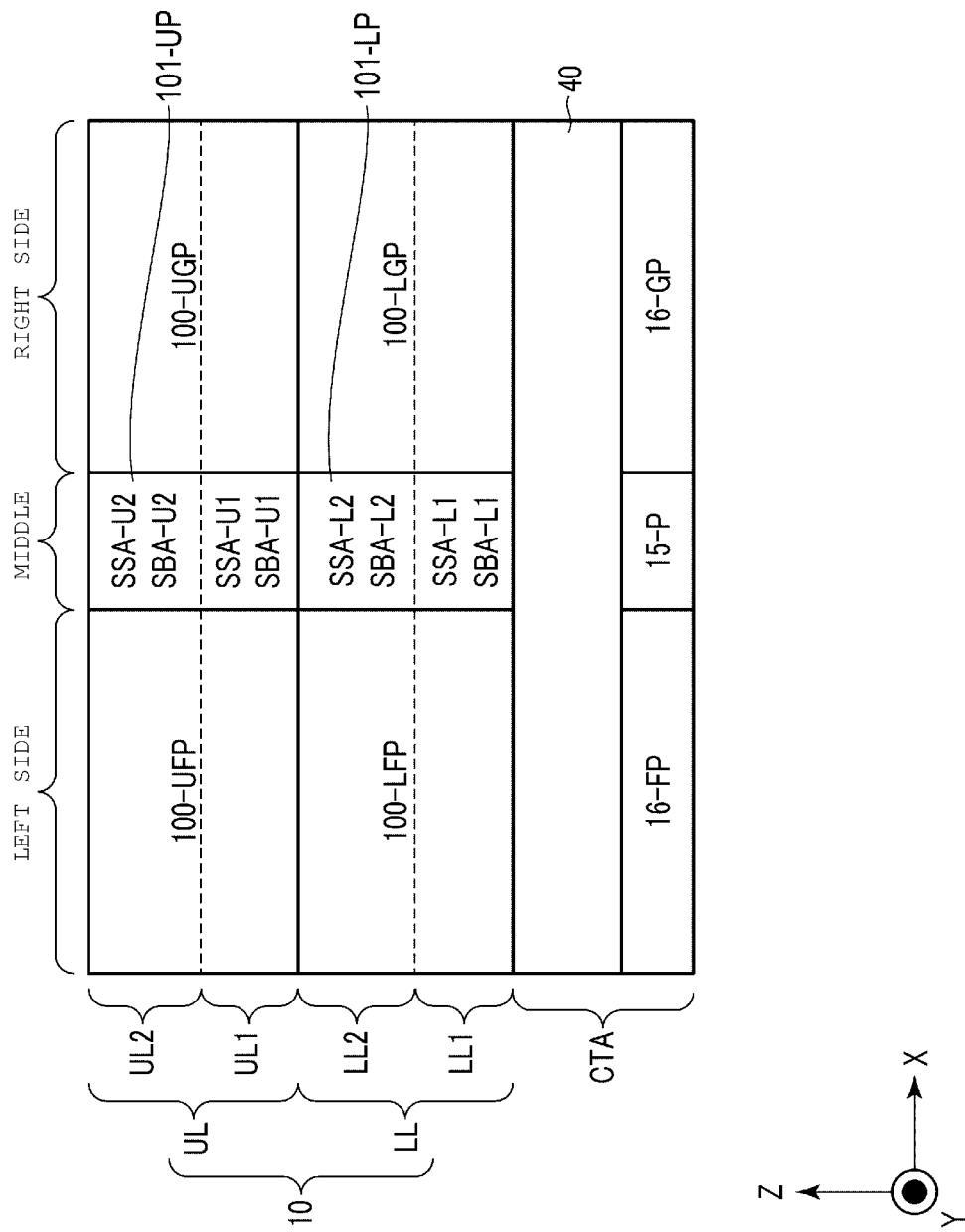
FIG. 41 illustrates a layout of the circuit region and the memory cell array in the semiconductor memory device according to the first embodiment.
Figure 42:
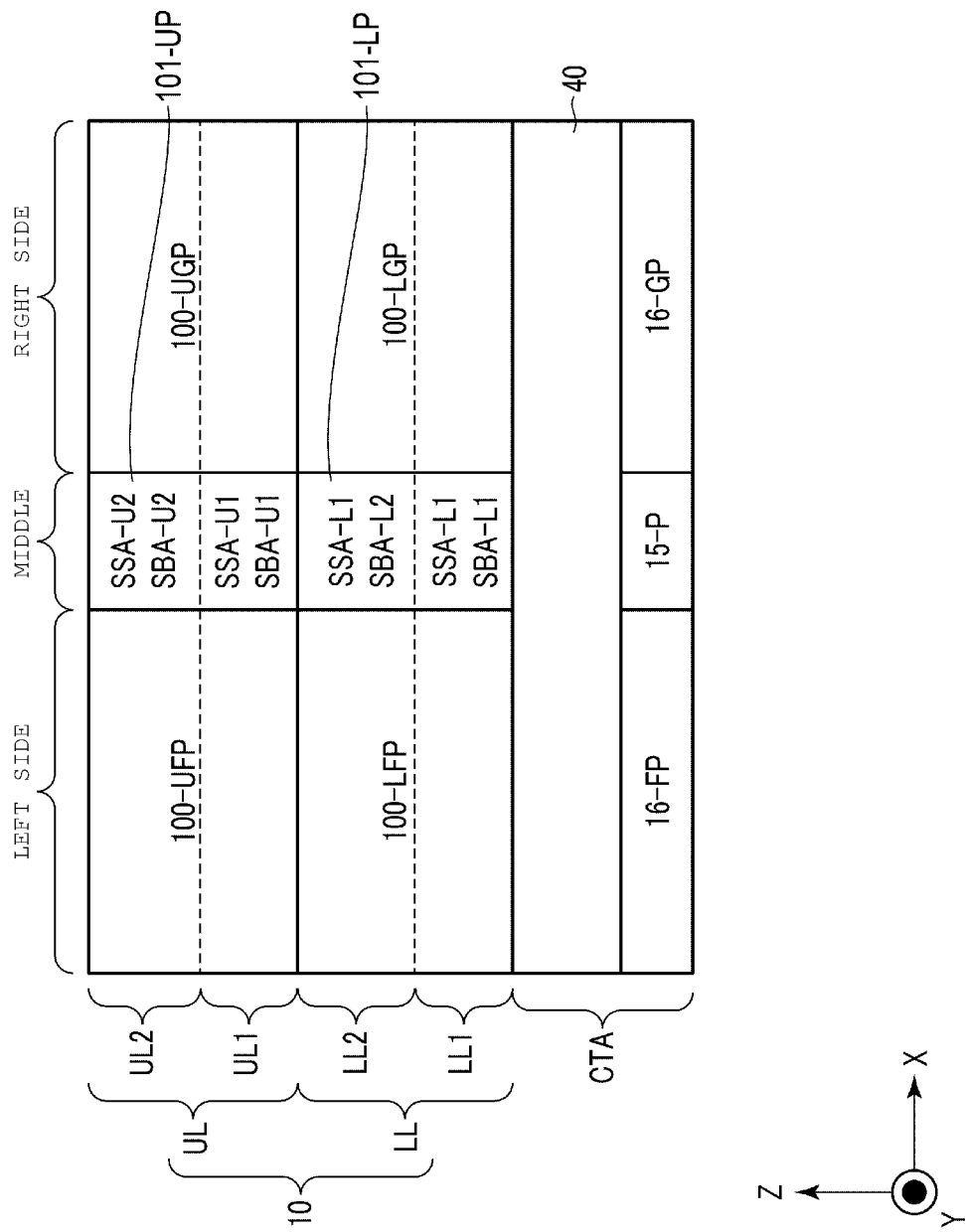
FIG. 42 illustrates a layout of a circuit region and a memory cell array in a semiconductor memory device according to Modification Example 2 of the first embodiment.
Figure 43:
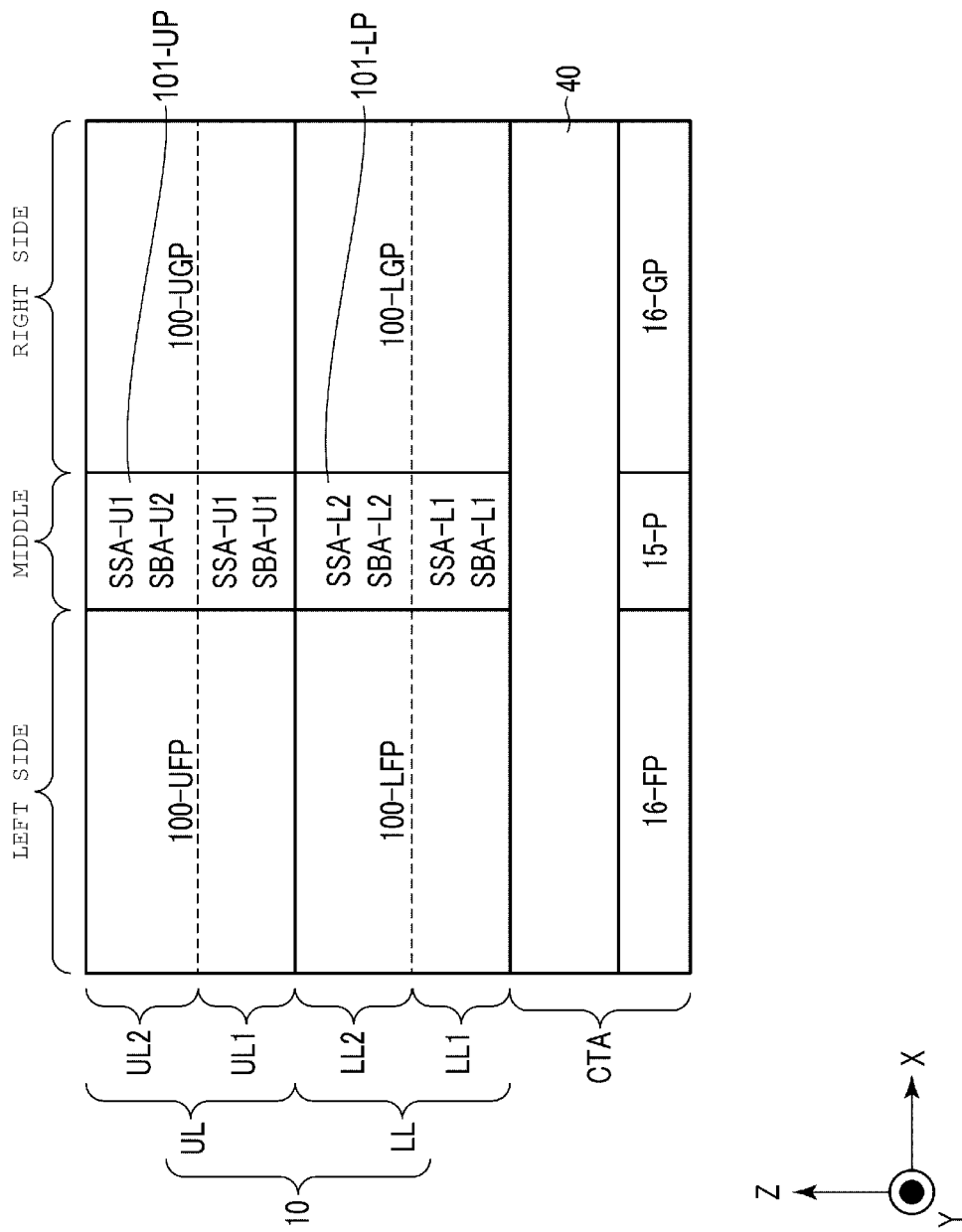
FIG. 43 illustrates a layout of a circuit region and a memory cell array in the semiconductor memory device according to Modification Example 2 of the first embodiment.

Modification example 2 of the first embodiment will be described. In Modification example 2 of the first embodiment, an example in which connection regions are different will be described. FIG. 41 illustrates a layout of the circuit region CTA and the memory cell array 10 in the semiconductor memory device 1 according to the first embodiment. FIG. 42 illustrates a layout of the circuit region CTA and the memory cell array 10 in the semiconductor memory device 1 according to Modification example 2 of the first embodiment. FIG. 43 illustrates a layout of the circuit region CTA and the memory cell array 10 in the semiconductor memory device 1 according to Modification example 2 of the first embodiment.

As illustrated in FIG. 41, in the first embodiment, the connection region (lower & upper) 101-LP in the first lower layer LL1 includes a staircase region (first lower) SSA-L1 and a subway region (first lower) SBA-L1. The connection region (lower & upper) 101-LP in the second lower layer LL2 includes a staircase region (second lower) SSA-L2 and a subway region (second lower) SBA-L2.

However, as illustrated in FIG. 42, the connection region (lower & upper) 101-LP in the second lower layer LL2 may include a staircase region having the same structure as the staircase region (first lower) SSA-L1 (for convenience, described as SSA-L1 in the drawing) instead of the staircase region (second lower) SSA-L2.

As illustrated in FIG. 41, in the first embodiment, the connection region (upper & upper) 101-UP in the first upper layer UL1 includes a staircase region (first upper) SSA-U1 and a subway region (first Upper) SBA-U1. The connection region (upper & upper) 101-UP in the second upper layer UL2 includes a staircase region (second upper) SSA-U2 and a subway region (second upper) SBA-U2.

However, as illustrated in FIG. 43, the connection region (upper & upper) 101-UP in the second upper layer UL2 may include a staircase region having the same structure as (for convenience, described as SSA-U1 in the drawing) the staircase region (first upper) SSA-U1 instead of the staircase region (second upper) SSA-U2.

The layout illustrated in FIG. 42 and the layout illustrated in FIG. 43 may be combined.

2. Second Embodiment

A second embodiment will be described. In the second embodiment, a case in which the row decoder for the select gate line SGD is disposed at a different position from the row decoder for the select gate line SGS and the word lines WL0 to WL15 will be described.

2-1. Circuit Region Layout

A layout focusing on a plane composed of the X-direction and the Y-direction of the circuit region CTA will be described.

Figure 44:
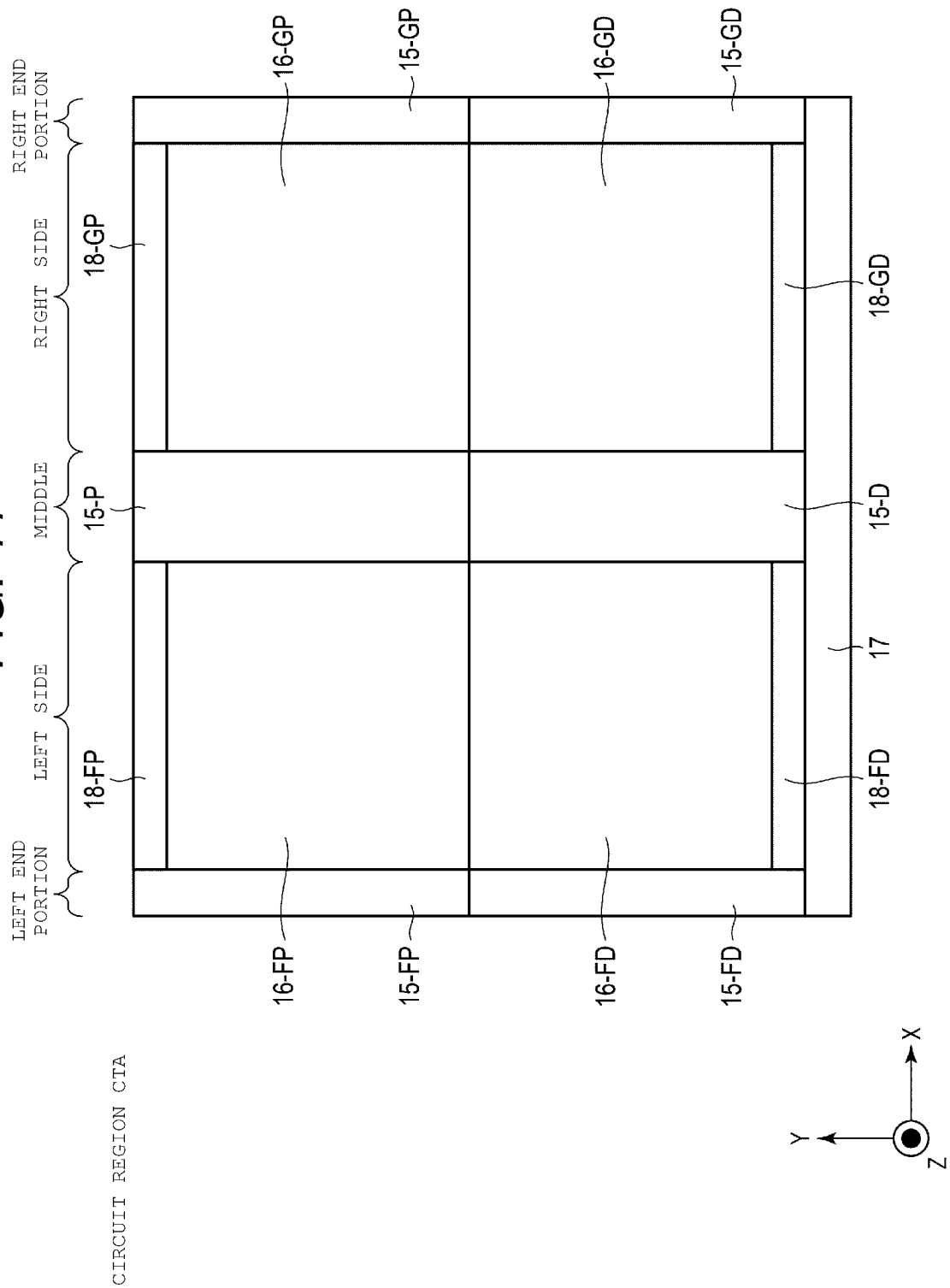
FIG. 44 illustrates a planar layout example of the circuit region.

As illustrated in FIG. 44, as compared to the circuit region CTA described with reference to FIG. 19, a row decoder module for the select gate line SGD is further provided at the end portion of the sense amplifier module 16. Hereinafter, the row decoder module 15 for the select gate line SGD is described as a row decoder module (SGD) 15 or the like.

Specifically, the row decoder module for the select gate line SGD is located on the left side of the sense amplifier module (upper left) 16-FP on the paper surface of FIG. 44. The row decoder module is denoted as a row decoder module (SGD & upper left) 15-LU. As such, the sense amplifier module (upper left) 16-FP is sandwiched between the row decoder module (upper) 15-P and the row decoder module (SGD & upper left) 15-LU in the X-direction. The row decoder module (upper) 15-P includes the row decoder for the select gate line SGD as in the first embodiment.

The row decoder module for the select gate line SGD is located on the right side of the sense amplifier module (upper right) 16-GP on the paper surface of FIG. 44. The row decoder module is denoted as a row decoder module (SGD & upper right) 15-RU. As such, the sense amplifier module (upper right) 16-GP is sandwiched between the row decoder module (upper) 15-P and the row decoder module (SGD & upper right) 15-RU in the X-direction.

The row decoder module for the select gate line SGD is located on the left side of the sense amplifier module (lower left) 16-FD on the paper surface of FIG. 44. The row decoder module is denoted as a row decoder module (SGD & lower left) 15-LD. As such, the sense amplifier module (lower left) 16-FD is sandwiched between the row decoder module (lower) 15-D and the row decoder module (SGD & lower left) 15-LD in the X-direction. The row decoder module (lower) 15-D includes the row decoder for the select gate line SGD, similarly as in the first embodiment.

The row decoder module for the select gate line SGD is located on the right side of the sense amplifier module (lower right) 16-GD on the paper surface of FIG. 44. The row decoder module is denoted as a row decoder module (SGD & lower right) 15-RD. As such, the sense amplifier module (lower right) 16-GD is sandwiched between the row decoder module (lower) 15-D and the row decoder module (SGD & lower right) 15-RD in the X-direction.

A region where the row decoder module (SGD & upper left) 15-LU and the row decoder module (SGD & lower left) 15-LD are provided is also denoted as a "left end portion".

A region where the row decoder module (SGD & upper right) 15-RU and the row decoder module (SGD & lower right) 15-RD are provided is also denoted as a "right end portion".

2-2. Layout of Memory Cell Array

Next, a layout focusing on a plane composed of the X-direction and the Y-direction of the memory cell array 10 will be described.

Figure 45:
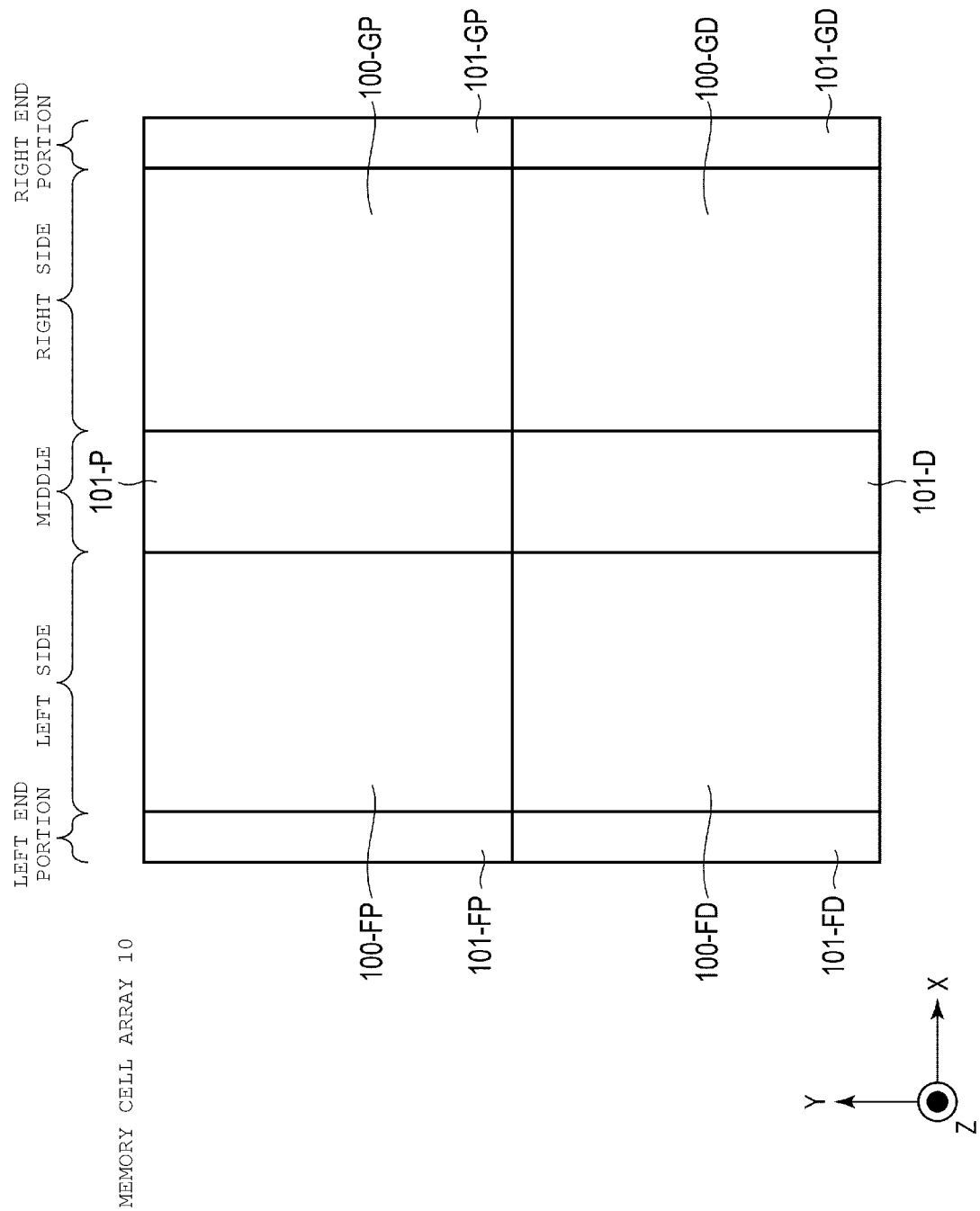
FIG. 45 illustrates a planar layout example of the memory cell array.

FIG. 45 illustrates a planar layout example of the memory cell array 10. For simplicity, in FIG. 45, a rough layout including the first lower layer LL1, the second lower layer LL2, the first upper layer UL1, and the second upper layer UL2 are illustrated.

As illustrated in FIG. 45, as compared to the memory cell array 10 described with reference to FIG. 4, a connection region 101 for connecting the select gate line SGD and the row decoder module (SGD) 15 is further provided at the end portion of the cell region 100. Hereinafter, the connection region 101 for the select gate line SGD is denoted as a connection region (SGD) 101 or the like.

Specifically, the connection region for the select gate line SGD is located on the left side of the cell region (upper left) 100-FP on the paper surface of FIG. 45. This connection region is denoted as a connection region (SGD & upper left) 101-LU. As such, the cell region (upper left) 100-FP is sandwiched between the connection region (upper) 101-P and the connection region (SGD & upper left) 101-LU in the X-direction. The connection region (upper) 101-P includes the connection region for the select gate line SGD similarly as in the first embodiment.

The connection region for the select gate line SGD is located on the right side of the cell region (upper right) 100-GP in the paper surface of FIG. 45. This connection region is denoted as a connection region (SGD & upper right) 101-RU. As such, the cell region (upper right) 100-GP is sandwiched between the connection region (upper) 101-P and the connection region (SGD & upper right) 101-RU in the X-direction.

The connection region for the select gate line SGD is located on the left side of the cell region (lower left) 100-FD on the paper surface of FIG. 45. This connection region is denoted as a connection region (SGD & lower left) 101-LD. As such, the cell region (lower left) 100-FD is sandwiched between the connection region (lower) 101-D and the connection region (SGD & lower left) 101-LD in the X-direction. The connection region (lower) 101-D includes the connection region for the select gate line SGD, similarly as in the first embodiment.

The connection region for the select gate line SGD is located on the right side of the cell region (lower right) 100-GD on the paper surface of FIG. 45. This connection region is denoted as a connection region (SGD & lower right) 101-RD. As such, the cell region (lower right) 100-GD is sandwiched between the connection region (lower) 101-D and the connection region (SGD & lower right) 101-RD in the X-direction.

A region where the connection region (SGD & upper left) 101-LU and the connection region (SGD & lower left) 101-LD are provided is also denoted as a "left end portion". A region where the connection region (SGD & upper right) 101-RU and the connection region (SGD & lower right) 101-RD are provided is also denoted as a "right end portion".

The row decoder module (SGD & upper left) 15-LU is located below the connection region (SGD & upper left) 101-LU in the Z-direction. The row decoder module (SGD & upper right) 15-RU is located below the connection region (SGD & upper right) 101-RU in the Z-direction. The row decoder module (SGD & lower left) 15-LD is located below the connection region (SGD & lower left) 101-LD in the Z-direction. The row decoder module (SGD & lower right) 15-RD is located below the connection region (SGD & lower right) 101-RD in the Z-direction.

2-3. Effect

According to the second embodiment described above, in contrast to the configuration of the first embodiment, a configuration in which the voltage is propagated to the select gate line SGD not only from the middle of the memory cell array 10 but also from both ends (left end portion and right end portion) is adopted.

Figure 46:
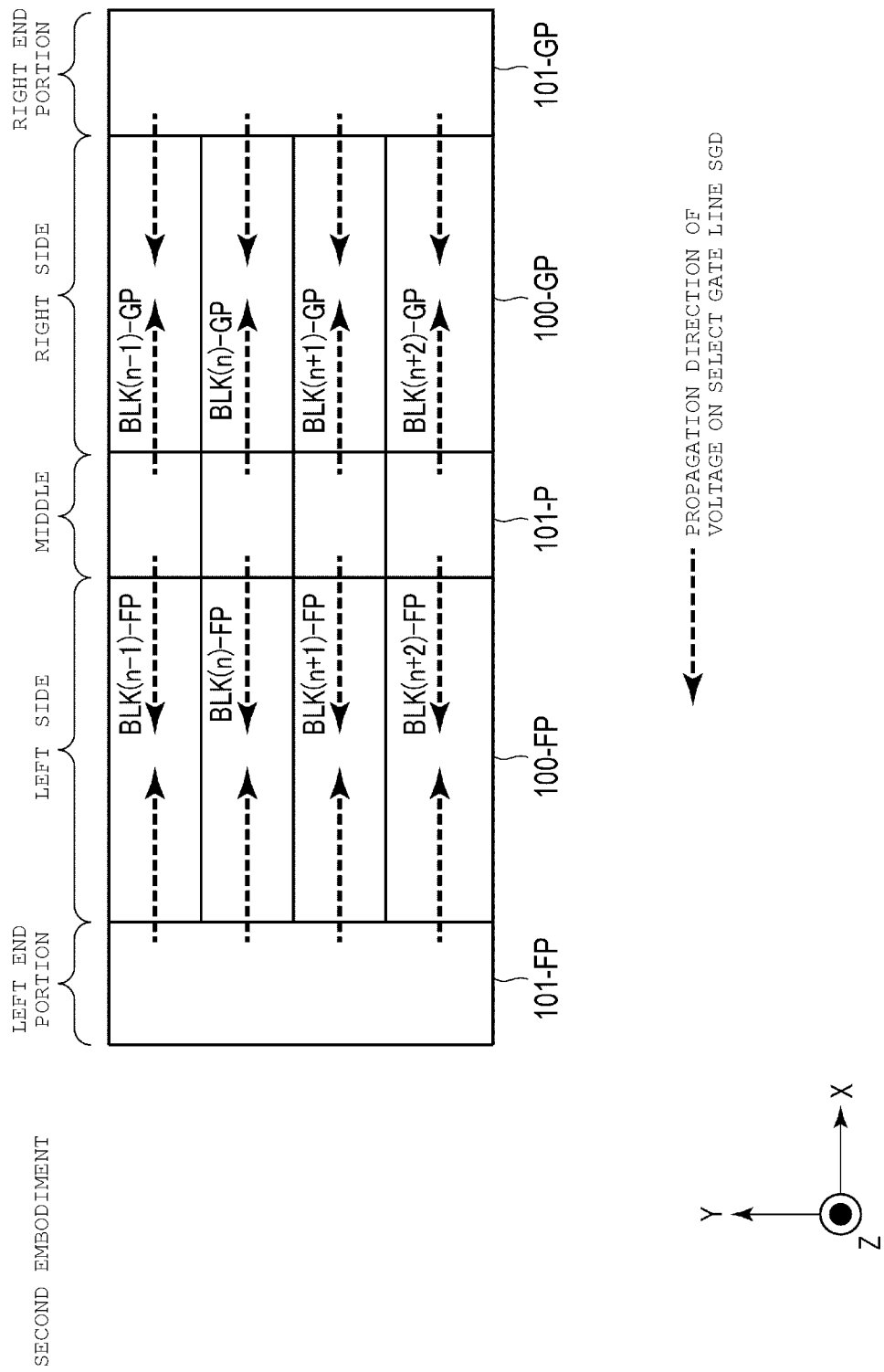
FIG. 46 is a diagram illustrating a propagation direction of a voltage to a cell region according to a second embodiment.
Figure 47:
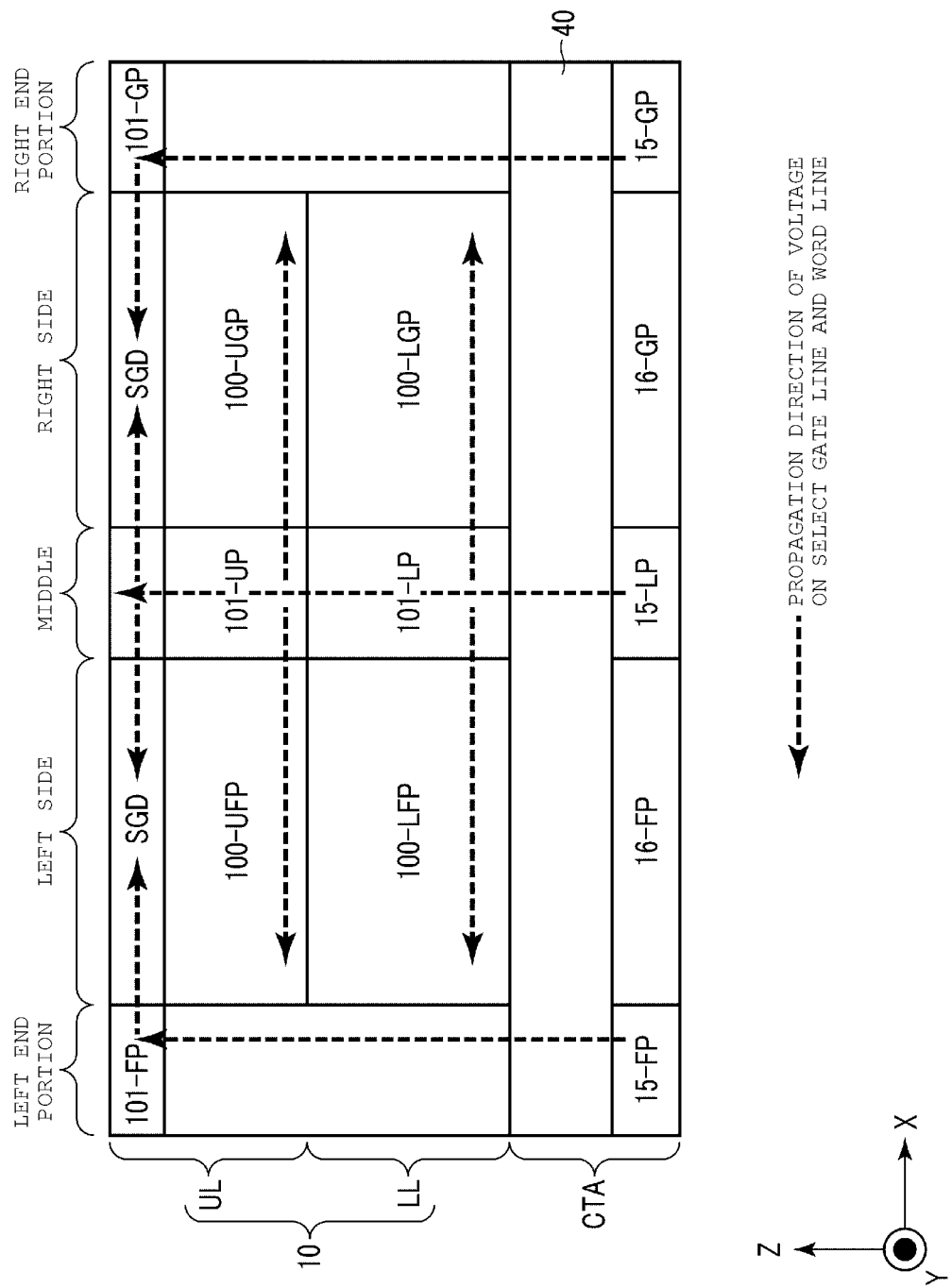
FIG. 47 is another diagram illustrating the propagation direction of the voltage to the cell region according to the second embodiment.

Since the select gate line SGD is divided by the slit SHE or the like, the width of the wiring may be narrowed. In this case, a resistance value of the wiring of the select gate line SGD may be increased. Accordingly, as illustrated in FIGS. 46 and 47, a configuration in which the voltage is propagated to the select gate line SGD not only from the middle of the memory cell array 10 but also from both ends is adopted. For that reason, even when the resistance value of the wiring of the select gate line SGD is increased, the effect described in the first embodiment can be obtained.

In the second embodiment, Modification example 2 of the first embodiment may be applied.

3. Third Embodiment

A third embodiment will be described. In the third embodiment, a case where the row decoder module relating to the lower layer LL is laid out in the center in the X-direction, and the row decoder module relating to the upper layer UL is laid out at the left end portion and the right end portion in the X-direction will be described.

3-1. Circuit Region Layout

A layout focusing on a plane composed of the X-direction and the Y-direction of the circuit region CTA will be described.

Figure 48:
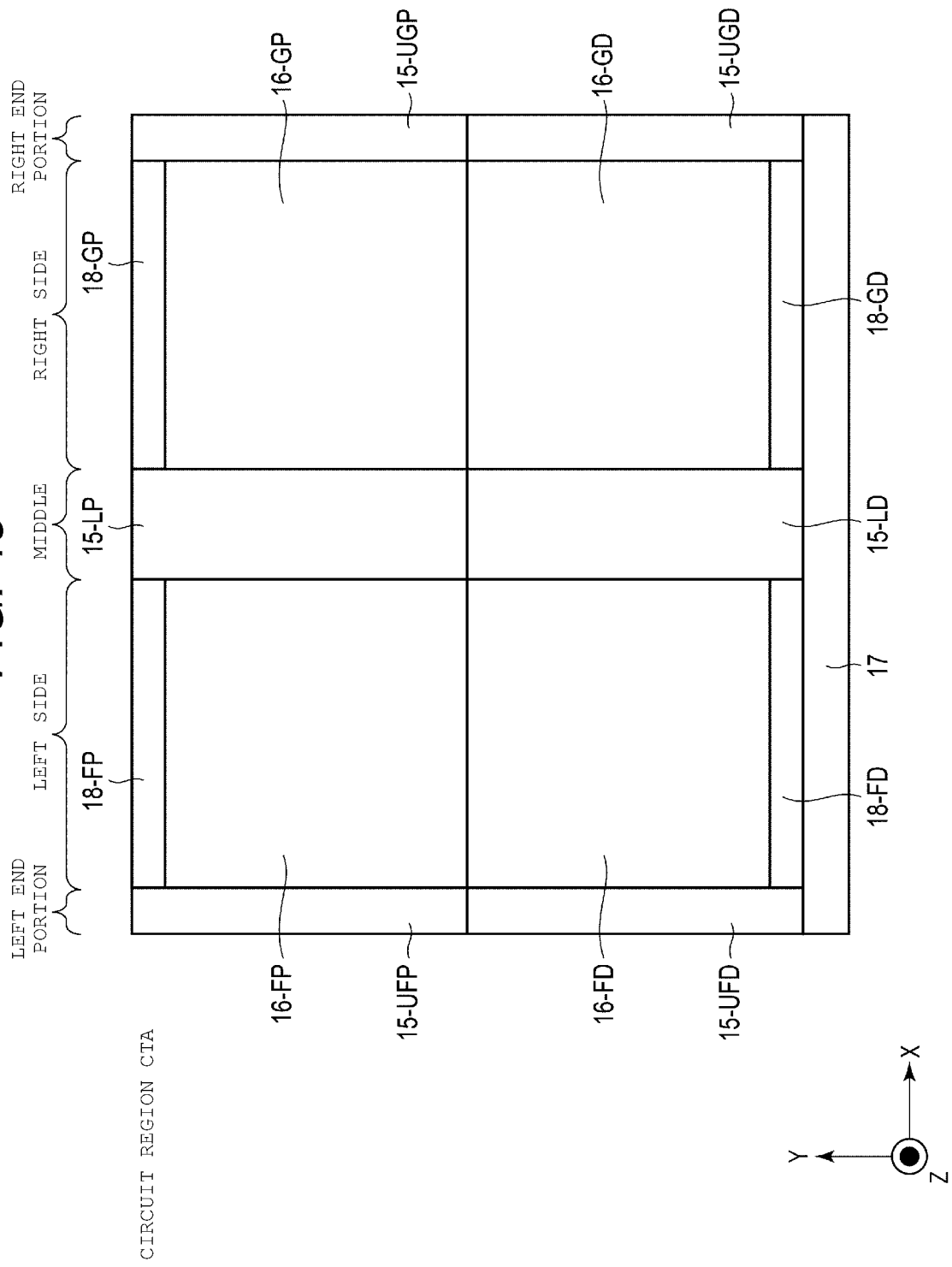
FIG. 48 illustrates another planar layout example of the circuit region.

As illustrated in FIG. 48, the row decoder module (upper) and the row decoder module (lower) (which were denoted as 15-P and 15-D, respectively, in FIG. 19) are now a row decoder module (lower & upper) 15-LP and a row decoder module (lower & lower) 15-LD, respectively.

The row decoder module for the upper layer UL is located on the left side of the sense amplifier module (upper left) 16-FP. This row decoder module is denoted as a row decoder module (upper & upper left) 15-UFP. The sense amplifier module (upper left) 16-FP is sandwiched between the row decoder module (lower & upper) 15-LP and the row decoder module (upper & upper left) 15-UFP in the X-direction.

The row decoder module for the upper layer UL is located on the right side of the sense amplifier module (upper right) 16-GP. This row decoder module is denoted as a row decoder module (upper & upper right) 15-UGP. The sense amplifier module (upper right) 16-GP is sandwiched between the row decoder module (lower & upper) 15-LP and the row decoder module (upper & upper right) 15-UGP in the X-direction.

The row decoder module for the upper layer UL is located on the left side of the sense amplifier module (lower left) 16-FD. This row decoder module is denoted as a row decoder module (upper & lower left) 15-UFD. The sense amplifier module (lower left) 16-FD is sandwiched between the row decoder module (lower & lower) 15-LD and the row decoder module (upper & lower left) 15-UFD in the X-direction.

The row decoder module for the upper layer UL is located on the right side of the sense amplifier module (lower right) 16-GD. This row decoder module is denoted as a row decoder module (upper & lower right) 15-UGD. The sense amplifier module (lower right) 16-GD is sandwiched between the row decoder module (lower & lower) 15-LD and the row decoder module (upper & lower right) 15-UGD in the X-direction.

A region where the row decoder module (upper & upper left) 15-UFP and the row decoder module (upper & lower left) 15-UFD are provided is also referred to as a "left end portion". A region where the row decoder module (upper & upper right) 15-UGP and the row decoder module (upper & lower right) 15-UGD are provided is also referred to as a "right end portion".

3-2. Layout of Memory Cell Array

Next, a layout focusing on a plane composed of the X-direction and the Y-direction of the memory cell array 10 will be described.

Figure 49:
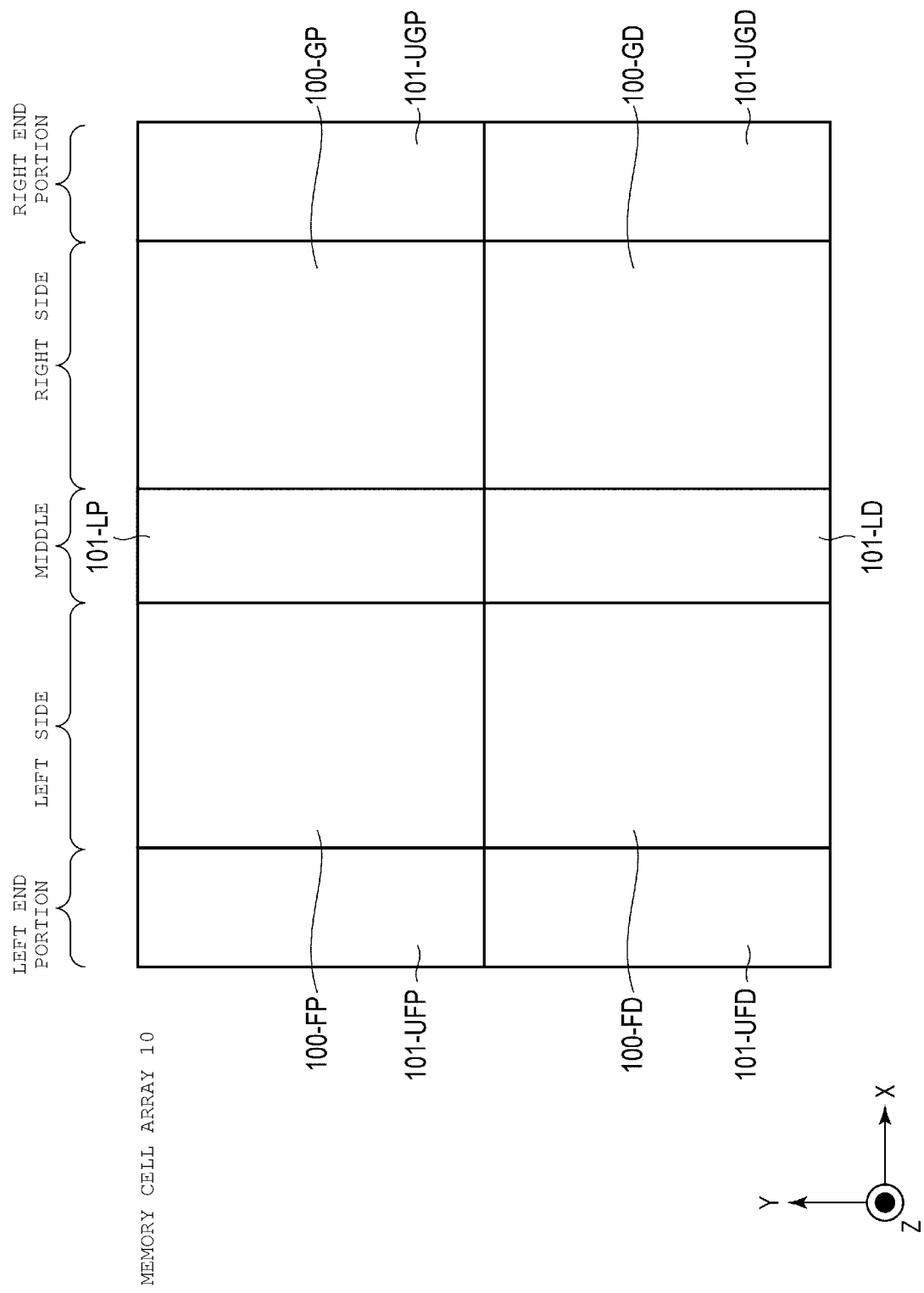
FIG. 49 illustrates another planar layout example of the memory cell array.

FIG. 49 illustrates a planar layout example of the memory cell array 10. For simplicity, in FIG. 49, a rough layout including the first lower layer LL1, the second lower layer LL2, the first upper layer UL1, and the second upper layer UL2 is illustrated.

As illustrated in FIG. 49, as compared to the memory cell array 10 described in FIG. 4, a connection region (upper) 101 for connecting the upper layer UL and the row decoder module (upper) 15 is further provided at the end portion of the cell region 100.

As illustrated in FIG. 49, the connection region (upper) 101-P and connection region (lower) 101-D in FIG. 19 are denoted as a connection region (lower & upper) 101-LP and a connection region (lower & lower) 101-LD, respectively. In the third embodiment, the connection region (upper) 101-P and the connection region (lower) 101-D do not include the connection region (upper) 101.

The connection region (upper) 101 is located on the left side of the cell region (upper left) 100-FP on the paper surface of FIG. 49. The connection region (upper) 101 is denoted as a connection region (upper & upper left) 101-UFP. As such, the cell region (upper left) 100-FP is sandwiched between the connection region (lower & upper) 101-LP and the connection region (upper & upper left) 101-UFP in the X-direction.

The connection region (upper) 101 is located on the right side of the cell region (upper right) 100-GP on the paper surface of FIG. 49. The connection region (upper) 101 is denoted as a connection region (upper & upper right) 101-UGP. As such, the cell region (upper right) 100-GP is sandwiched between the connection region (lower & upper) 101-LP and the connection region (upper & upper right) 101-UGP in the X-direction.

The connection region (upper) 101 is located on the left side of the cell region (lower left) 100-FD on the paper surface of FIG. 49. The connection region (upper) 101 is denoted as a connection region (upper & lower left) 101-UFD. As such, the cell region (lower left) 100-FD is sandwiched between the connection region (lower & lower) 101-LD and the connection region (upper & lower left) 101-UFD in the X-direction.

The connection region (upper) 101 is located on the right side of the cell region (lower right) 100-GD on the paper surface of FIG. 49. The connection region (upper) 101 is denoted as a connection region (upper & lower right) 101-UGD. As such, the cell region (lower right) 100-GD is sandwiched between the connection region (lower & lower) 101-LD and the connection region (upper & lower right) 101-UGD in the X-direction.

A region where the connection region (upper & upper left) 101-UFP and the connection region (upper & lower left) 101-UFD are provided is also denoted as a "left end portion". A region where the connection region (upper & upper right) 101-UGP and the connection region (upper & lower right) 101-UGD are provided is also referred to as a "right end portion".

The row decoder module (upper & upper left) 15-UFP is located below the connection region (upper & upper left) 101-UFP in the Z-direction. The row decoder module (upper & upper right) 15-UGP is located below the connection region (upper & upper right) 101-UGP in the Z-direction. The row decoder module (upper & lower left) 15-UFD is located below the connection region (upper & lower left) 101-UFD in the Z-direction. The row decoder module (upper & lower right) 15-UGD is located below the connection region (upper & lower right) 101-UGD in the Z-direction.

Here, the connection region (upper) 101 will be described.

Figure 50:
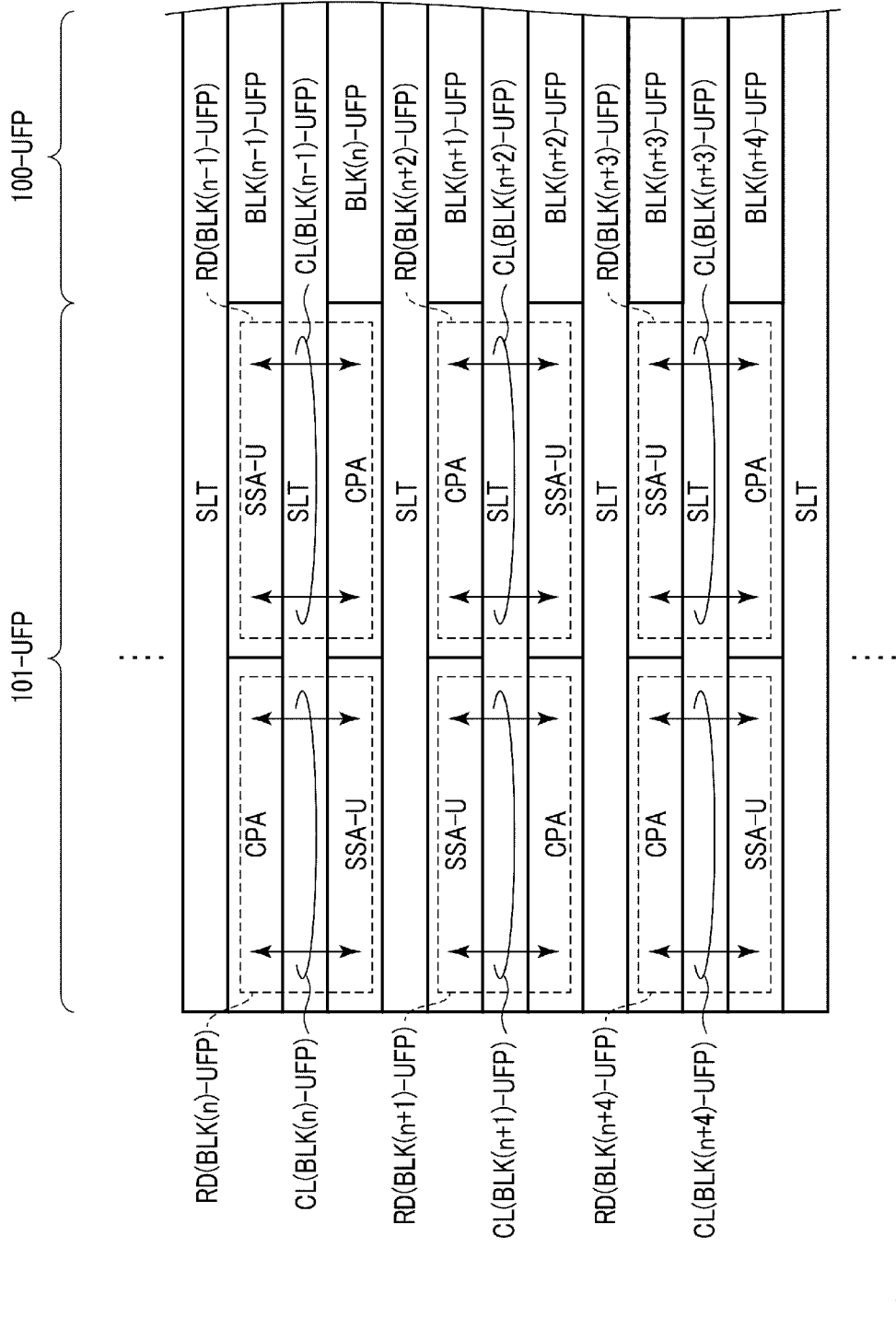
FIG. 50 illustrates a layout example of the connection region and the cell region adjacent to the connection region.

The relationship of the XY plane between the connection region (upper) 101 and the row decoder module (upper) 15 will be described with reference to FIG. 50. In FIG. 50, specifically, a part of the cell region (upper & upper left) 100-UFP, the connection region (upper & upper left) 101-UFP, and the row decoder module (upper & upper left) 15-UFP is illustrated. In FIG. 50, the row decoder RD in the row decoder module (upper & upper left) 15-UFP is indicated by a broken line.

For convenience, the row decoder RD for the block (upper & upper left) BLK(v)-UFP is denoted as a RD(BLK(v)-UFP). The second contact wiring CL2 for the block (upper & upper left) BLK(v)-UFP is denoted as a CL2(BLK(v)-UFP). The contact plug region CPA for the block (upper & upper left) BLK(v)-UFP is denoted as a CPA(BLK(v)-UFP).

As illustrated in FIG. 50, the connection region (upper & upper left) 101-UFP includes a set of the staircase region (upper) SSA-U and the contact plug region CPA for each block. Since the staircase region (upper) SSA-U is the same as that described in the first embodiment, a description thereof will be omitted. The contact plug region CPA is a region for connecting the staircase region (upper) SSA-U and the row decoder RD. Specifically, in the contact plug region CPA, the contact plug C4 for connecting the row decoder DC formed below the connection region (upper & upper left) 101-UFP in the Z direction and the contact plug CC is formed. The upper ends of the contact plug CC and the contact plug C4 are connected by the second contact wiring CL2. The second contact wiring CL2 extends in the Y-direction.

In the third embodiment, the contact plug region CPA (BLK(v)) includes the contact plug C4 (BLK(v±1))-UFP) for connecting the word lines WL8 to WL15 and the select gate line SGD of the block BLK(v±1)-UFP adjacent to the block BLK(v)-UFP in the Y-direction to the row decoder RD(BLK(v±1)-UFP) for the block BLK(v±1)-UFP. The contact plug C4 (BLK(v±1)-UFP) is connected to the contact plug CC(BLK(v±1)-UFP) provided in the staircase region SSA(BLK(v±1)-UFP) for the block BLK(v±1)-UFP via the second contact wiring CL2 (BLK(v±1)-UFP) extending in the Y direction. As a result, the subway region SSA(BLK(v)-UFP) can connect the word lines WL8 to WL15 of the block BLK(v±1)-UFP and the select gate line SGD to the row decoder RD(BLK(v±1)-UFP) for the block BLK(v±1)-UFP.

Specifically, the word lines WL8 to WL15 and the select gate line SGD of the block BLK(n−1)-UFP are connected to the row decoder RD(BLK(n−1)-UFP) for the block BLK(n−1)-UFP via the staircase region SSA(BLK(n−1)-UFP), the contact plug CC(BLK(n−1)-UFP) provided in the staircase region SSA(BLK(n−1)-UFP), the contact plug C4 (BLK(n−1)-UFP) for the block BLK(n−1)-UFP penetrating the subway region SBA(BLK(n)-UFP) for the block BLK(n)-UFP, and the second contact wiring CL2 (BLK(n−1)-UFP) for connecting the contact plug CC(BLK(n−1)-UFP) and the contact plug C4(BLK(n−1)-UFP).

The word lines WL8 to WL15 and the select gate line SGD of the block BLK(n)-UFP are connected to the row decoder RD(BLK(n)-UFP) for the block BLK(n)-UFP via the staircase region SSA(BLK(n)-UFP), the contact plug CC(BLK(n)-UFP) provided in the staircase region SSA(BLK(n)-UFP), the contact plug C4(BLK(n)-UFP) for the block BLK(n)-UFP penetrating the subway region SBA(BLK(n−1)-UFP) for the block BLK(n−1)-UFP, and the second contact wiring CL2(BLK(n)-UFP) for connecting the contact plug CC(BLK(n)-UFP) and the contact plug C4(BLK(n)-UFP).

Similarly, the word lines WL8 to WL15 and the select gate line SGD of the block BLK(n+1)-UFP are connected to the row decoder RD(BLK(n+1)-UFP) for the block BLK(n+1)-UFP via the staircase region SSA(BLK(n+1)-UFP), the contact plug CC(BLK(n+1)-UFP) provided in the staircase region SSA(BLK(n+1)-UFP), the contact plug C4(BLK(n+1)-UFP) for the block BLK(n+1)-UFP penetrating the subway region SBA(BLK(n+2)-UFP) for the block BLK(n+2)-UFP, and the wiring CL(BLK(n+1)-UFP) for connecting the contact plug CC(BLK(n+1)-UFP) and the contact plug C4(BLK(n+1)-UFP).

The word lines WL8 to WL15 and the select gate line SGD of the block BLK(n+2)-UFP are connected to the row decoder RD(BLK(n+2)-UFP) for the block BLK(n+2)-UFP via the staircase region SSA(BLK(n+2)-UFP), the contact plug CC(BLK(n+2)-UFP) provided in the staircase region SSA(BLK(n+2)-UFP), the contact plug C4(BLK(n+2)-UFP) for the block BLK(n+2)-UFP penetrating the subway region SBA(BLK(n+1)-UFP) for the block BLK(n+1)-UFP, and the second contact wiring CL2 (BLK(n+2)-UFP) for connecting the contact plug CC(BLK(n+2)-UFP) and the contact plug C4 (BLK(n+2)-UFP).

Similarly, the word lines WL8 to WL15 and the select gate line SGD of the block BLK(n+3)-UFP are connected to the row decoder RD(BLK(n+3)-UFP) for the block BLK(n+3)-UFP via the staircase region SSA(BLK(n+3)-UFP), the contact plug CC(BLK(n+3)-UFP) provided in the staircase region SSA(BLK(n+3)-UFP), the contact plug C4 (BLK(n+3)-UFP) for the block BLK(n+3)-UFP penetrating the subway region SBA(BLK(n+4)-UFP) for the block BLK(n+4)-UFP, and the second contact wiring CL2 (BLK(n+3)-UFP) for connecting the contact plug CC(BLK(n+3)-UFP) and the contact plug C4(BLK(n+3)-UFP).

Figure 51:
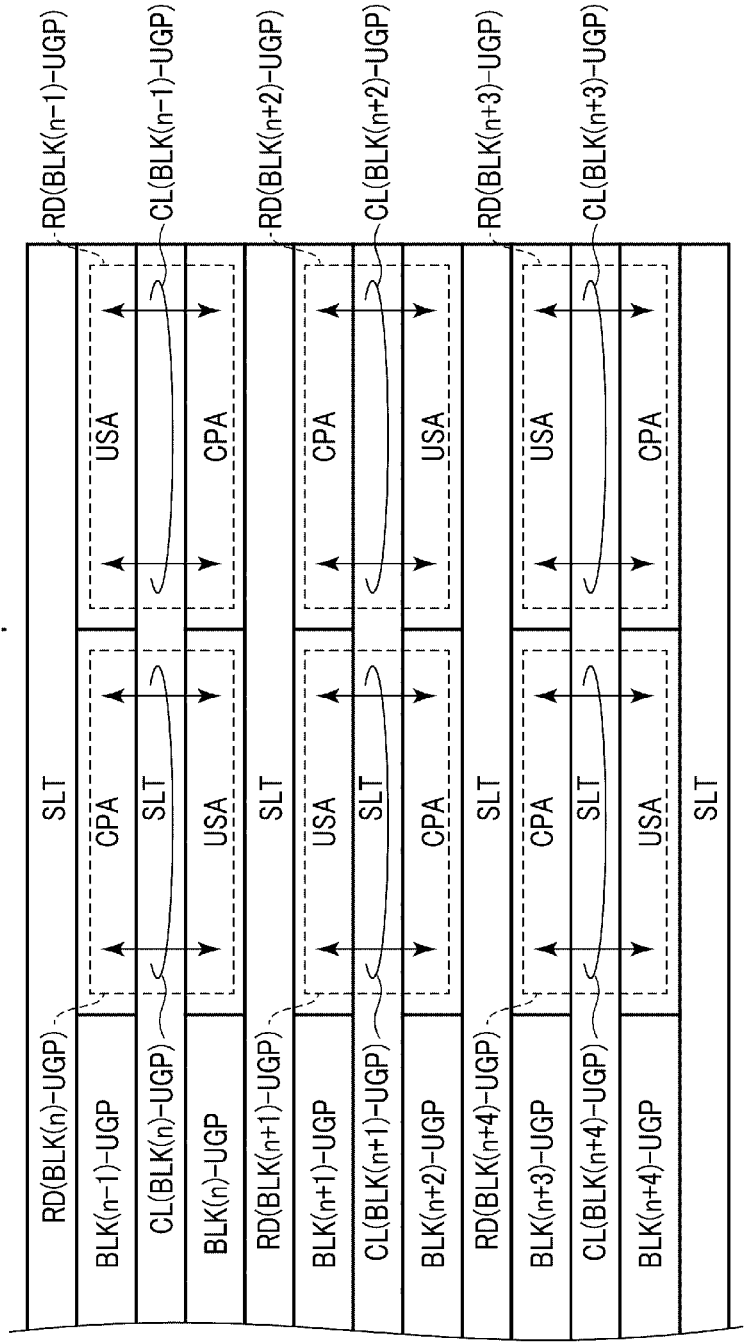
FIG. 51 illustrates another layout example of the connection region and the cell region adjacent to the connection region.

The word lines WL8 to WL15 and the select gate line SGD of the block BLK(n+4)-UFP are connected to the row decoder RD(BLK(n+4)-UFP) for the block BLK(n+4)-UFP via the staircase region SSA(BLK(n+4)-UFP), the contact plug CC(BLK(n+4)-UFP) provided in the staircase region SSA(BLK(n+4)-UFP), the contact plug C4(BLK(n+4)-UFP) for the block BLK(n+4)-UFP penetrating the subway region SBA(BLK(n+3)-UFP) for the block BLK(n+3)-UFP, and the second contact wiring CL2(BLK(n+4)-UFP) for connecting the contact plug CC(BLK(n+4)-UFP) and the contact plug C4(BLK(n+4)-UFP). With reference to FIG. 51, the relationship of the XY plane between the connection region (upper) 101 and the row decoder module (upper) 15 will be described. In FIG. 51, specifically, a part of the cell region (upper & upper right) 100-UGP, the connection region (upper & upper right) 101-UGP, and the row decoder module (upper & upper right) 15-UGP is illustrated. In FIG. 51, the row decoder RD in the row decoder module (upper & upper right) 15-UGP is indicated by a broken line.

For convenience, the row decoder RD for the block (upper & upper right) BLK(v)-UGP is denoted as a RD(BLK(v)-UGP). The second contact wiring CL2 for the block (upper & upper right) BLK(v)-UGP is denoted as a CL2 (BLK(v)-UGP). The contact plug region CPA for the block (upper & upper right) BLK(v)-UGP is denoted as a CPA (BLK(v)-UGP).

As illustrated in FIG. 51, the connection region (upper & upper right) 101-UGP includes a set of the staircase region (upper) SSA-U and the contact plug region CPA for each block. Since the staircase region (upper) SSA-U is the same as that described in the first embodiment, a description thereof will be omitted. The contact plug region CPA is a region for connecting the staircase region (upper) SSA-U and the row decoder RD. Specifically, in the contact plug region CPA, a contact plug C4 (for connecting the row decoder DC formed below the connection region (upper & upper right) 101-UGP in the Z direction) and a contact plug CC is formed. The upper ends of the contact plug CC and the contact plug C4 are connected by the second contact wiring CL2. The second contact wiring CL2 extends in the Y-direction.

In the third embodiment, the contact plug region CPA (BLK(v)) includes the contact plug C4(BLK(v±1)-UGP) for connecting the word lines WL8 to WL15 and the select gate line SGD of the block BLK(v±1)-UGP adjacent to the block BLK(v)-UGP in the Y-direction to the row decoder RD(BLK(v±1)-UGP) for the block BLK(v±1)-UGP. The contact plug C4(BLK(v±1)-UGP) is connected to the contact plug CC(BLK(v±1)-UGP) provided in the staircase region SSA(BLK(v±1)-UGP) for the block BLK(v±1)-UGP via the second contact wiring CL2 (BLK(v±1)-UGP) extending in the Y direction. As a result, the subway region SSA(BLK (v)-UGP) can connect the word lines WL8 to WL15 of the block BLK(v±1)-UGP and the select gate line SGD to the row decoder RD(BLK(v±1)-UGP) for the block BLK(v±1)-UGP.

Specifically, the word lines WL8 to WL15 and the select gate line SGD of the block BLK(n−1)-UGP are connected to the row decoder RD(BLK(n−1)-UGP) for the block BLK(n−1)-UGP via the staircase region SSA(BLK(n−1)-UGP), the contact plug CC(BLK(n−1)-UGP) provided in the staircase region SSA(BLK(n−1)-UGP), the contact plug C4(BLK(n−1)-UGP) for the block BLK(n−1)-UGP penetrating the subway region SBA(BLK(n)-UGP) for the block BLK(n)-UGP, and the second contact wiring CL2(BLK(n−1)-UGP) for connecting the contact plug CC(BLK(n−1)-UGP) and the contact plug C4(BLK(n−1)-UGP).

The word lines WL8 to WL15 and the select gate line SGD of the block BLK(n)-UGP are connected to the row decoder RD(BLK(n)-UGP) for the block BLK(n)-UGP via the staircase region SSA(BLK(n)-UGP), the contact plug CC(BLK(n)-UGP) provided in the staircase region SSA (BLK(n)-UGP), the contact plug C4(BLK(n)-UGP) for the block BLK(n)-UGP penetrating the subway region SBA (BLK(n−1)-UGP) for the block BLK(n−1)-UGP, and the second contact wiring CL2(BLK(n)-UGP) for connecting the contact plug CC(BLK(n)-UGP) and the contact plug C4(BLK(n)-UGP).

Similarly, the word lines WL8 to WL15 and the select gate line SGD of the block BLK(n+1)-UGP are connected to the row decoder RD(BLK(n+1)-UGP) for the block BLK(n+1)-UGP via the staircase region SSA(BLK(n+1)-UGP), the contact plug CC(BLK(n+1)-UGP) provided in the staircase region SSA(BLK(n+1)-UGP), the contact plug C4(BLK(n+1)-UGP) for the block BLK(n+1)-UGP penetrating the subway region SBA(BLK(n+2)-UGP) for the block BLK(n+2)-UGP, and the wiring CL(BLK(n+1)-UGP) for connecting the contact plug CC(BLK(n+1)-UGP) and the contact plug C4(BLK(n+1)-UGP).

The word lines WL8 to WL15 and the select gate line SGD of the block BLK(n+2)-UGP are connected to the row decoder RD(BLK(n+2)-UGP) for the block BLK(n+2)-UGP via the staircase region SSA(BLK(n+2)-UGP), the contact plug CC(BLK(n+2)-UGP) provided in the staircase region SSA(BLK(n+2)-UGP), the contact plug C4(BLK(n+2)-UGP) for the block BLK(n+2)-UGP penetrating the subway region SBA(BLK(n+1)-UGP) for the block BLK(n+1)-UGP, and the second contact wiring CL2 (BLK(n+2)-UGP) for connecting the contact plug CC(BLK(n+2)-UGP) and the contact plug C4(BLK(n+2)-UGP).

Similarly, the word lines WL8 to WL15 and the select gate line SGD of the block BLK(n+3)-UGP are connected to the row decoder RD(BLK(n+3)-UGP) for the block BLK(n+3)-UGP via the staircase region SSA(BLK(n+3)-UGP), the contact plug CC(BLK(n+3)-UGP) provided in the staircase region SSA(BLK(n+3)-UGP), the contact plug C4(BLK(n+3)-UGP) for the block BLK(n+3)-UGP penetrating the subway region SBA(BLK(n+4)-UGP) for the block BLK(n+4)-UGP, and the second contact wiring CL2 (BLK(n+3)-UGP) for connecting the contact plug CC(BLK(n+3)-UGP) and the contact plug C4(BLK(n+3)-UGP).

The word lines WL8 to WL15 and the select gate line SGD of the block BLK(n+4)-UGP are connected to the row decoder RD(BLK(n+4)-UGP) for the block BLK(n+4)-UGP via the staircase region SSA(BLK(n+4)-UGP), the contact plug CC(BLK(n+4)-UGP) provided in the staircase region SSA(BLK(n+4)-UGP), the contact plug C4(BLK(n+4)-UGP) for the block BLK(n+4)-UGP penetrating the subway region SBA(BLK(n+3)-UGP) for the block BLK(n+3)-UGP, and the second contact wiring CL2 (BLK(n+4)-UGP) for connecting the contact plug CC(BLK(n+4)-UGP) and the contact plug C4(BLK(n+4)-UGP).

3-3. Circuit Region and Memory Cell Array Layout

Next, a layout of the semiconductor memory device 1 as viewed from a cross-section parallel to the XZ plane will be described with reference to FIG. 52.

Figure 52:
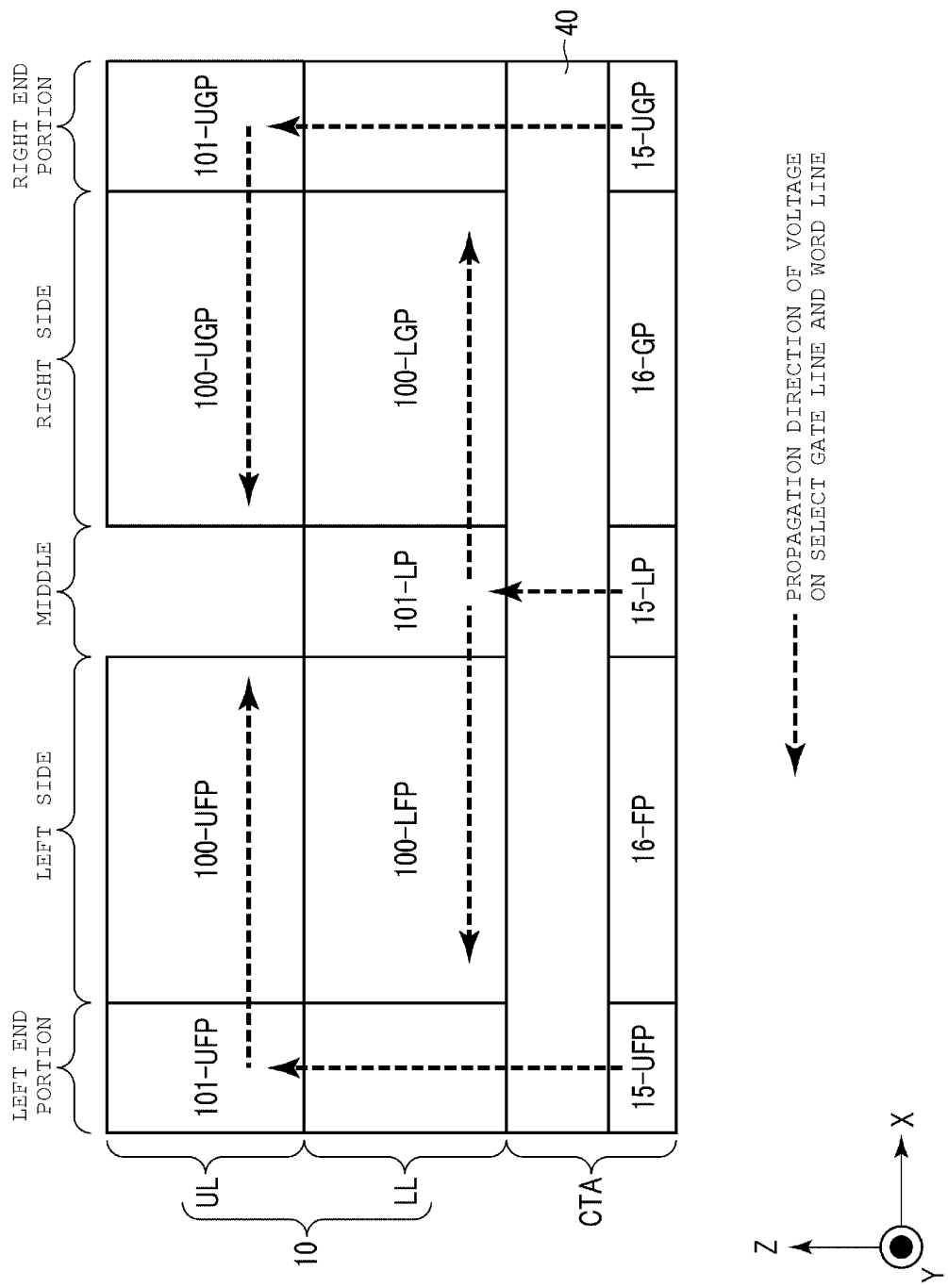
FIG. 52 illustrates a layout of a circuit region and a memory cell array of the semiconductor memory device according to a third embodiment.

FIG. 52 illustrates a cross-sectional view of the circuit region CIA and the memory cell array 10. Specifically, in FIG. 52, as the circuit region CTA, the row decoder module (upper & upper left) 15-UFP, the row decoder module (upper & upper right) 15-UGP, the row decoder module (lower & upper) 15-LP, the sense amplifier module (upper left) 16-FP, and the sense amplifier module (upper right) 16-GP are illustrated. In FIG. 52, as the lower layer LL of the memory cell array 10, the cell region (lower & upper left) 100-LFP, the cell region (lower & upper right) 100-LGP, and the connection region (lower & upper) 101-LP are illustrated. In FIG. 52, as the upper layer UL of the memory cell array 10, the cell region (upper & upper left) 100-UFP, the cell region (upper & upper right) 100-UGP, the connection region (upper & upper left) 101-UFP, and the connection Region (upper & upper right) 101-UGP are illustrated.

As illustrated in FIG. 52, the cell region (lower & upper left) 100-LFP and the cell region (upper & upper left) 100-UFP are provided above the sense amplifier module (upper left) 16-FP in the Z-direction. The sense amplifier module (upper left) 16-FP, the cell region (lower & upper left) 100-LFP, and the cell region (upper & upper left) 100-UFP are connected by wirings (though, these are not specifically illustrated in the figure).

The connection region (lower & upper) 101-LP is provided above the row decoder module (lower & upper) 15-LP in the Z-direction. The row decoder module (lower & upper) 15-LP and the connection region (lower & upper) 101-LP are connected by a wiring.

The connection region (upper & upper left) 101-UFP is provided above the row decoder module (upper & upper left) 15-UFP in the Z-direction. The row decoder module (upper & upper left) 15-UFP and the connection region (upper & upper left) 101-UFP are connected by a wiring.

Furthermore, the connection region (upper & upper right) 101-UGP is provided above the row decoder module (upper & upper right) 15-UGP in the Z-direction. The row decoder module (upper & upper right) 15-UGP and the connection region (upper & upper right) 101-UGP are connected by a wiring.

That is, as illustrated in FIG. 52, the cell region (lower & upper left) 100-LFP and the cell region (lower & upper right) 100-LGP receive a voltage from the row decoder module (lower & upper) 15-LP via the connection region (lower & upper) 101-LP.

The cell region (upper & upper left) 100-UFP receives a voltage from the row decoder module (upper & upper left) 15-UFP via the connection region (upper & upper left) 101-UFP.

The cell region (upper & upper right) 100-UGP receives a voltage from the row decoder module (upper & upper right) 15-UGP via the connection region (upper & upper right) 101-UGP.

Figure 53:
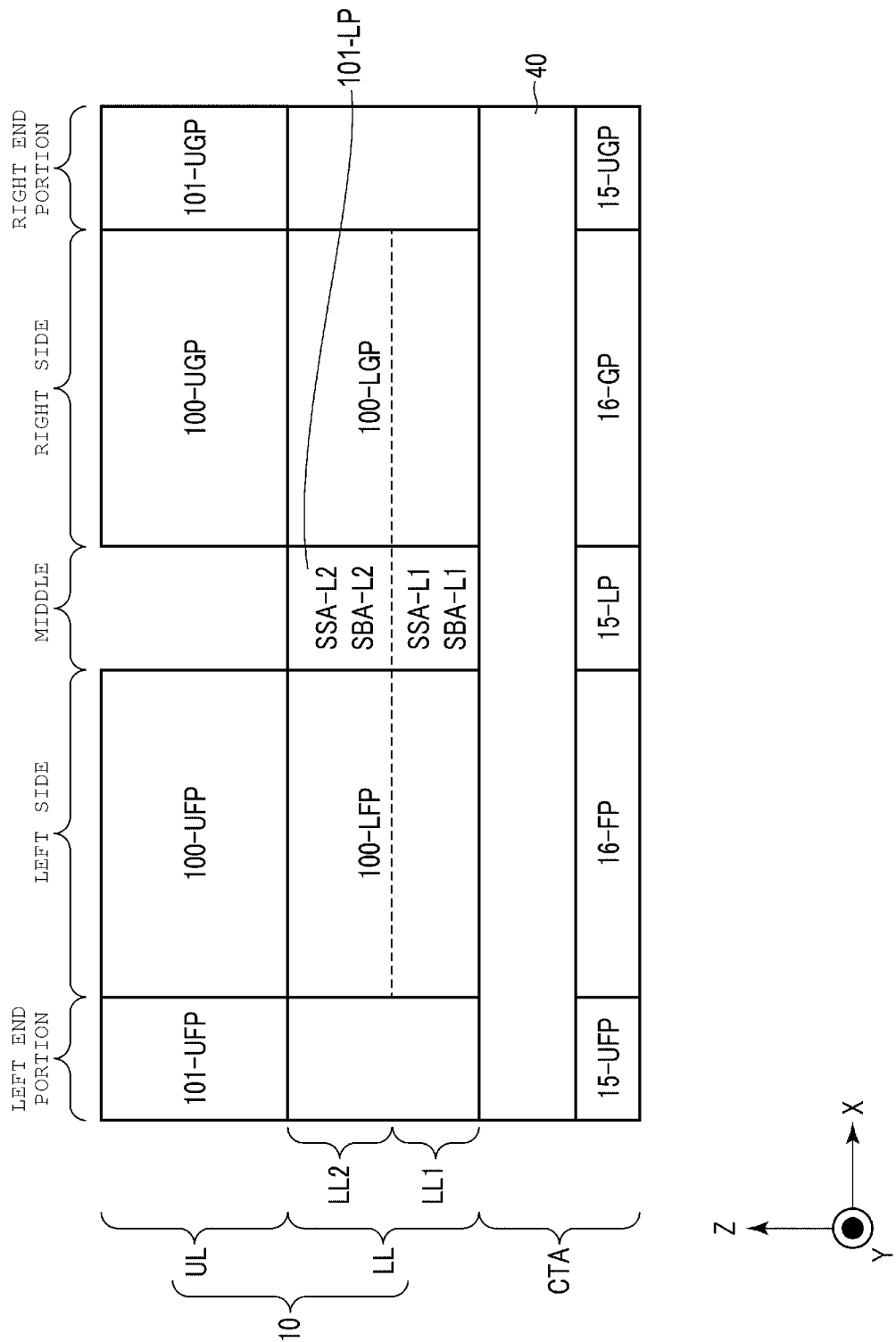
FIG. 53 illustrates another layout of the circuit region and the memory cell array in the semiconductor memory device according to the third embodiment.

As illustrated in FIG. 53, in the third embodiment, the connection region (lower & upper) 101-LP in the first lower layer LL1 includes the staircase region (first lower) SSA-L1, and the subway region (first Lower) SBA-L1. The connection region (lower & upper) 101-LP in the second lower layer LL2 includes the staircase region (second lower) SSA-L2 and the subway region (second lower) SBA-L2.

Figure 54:
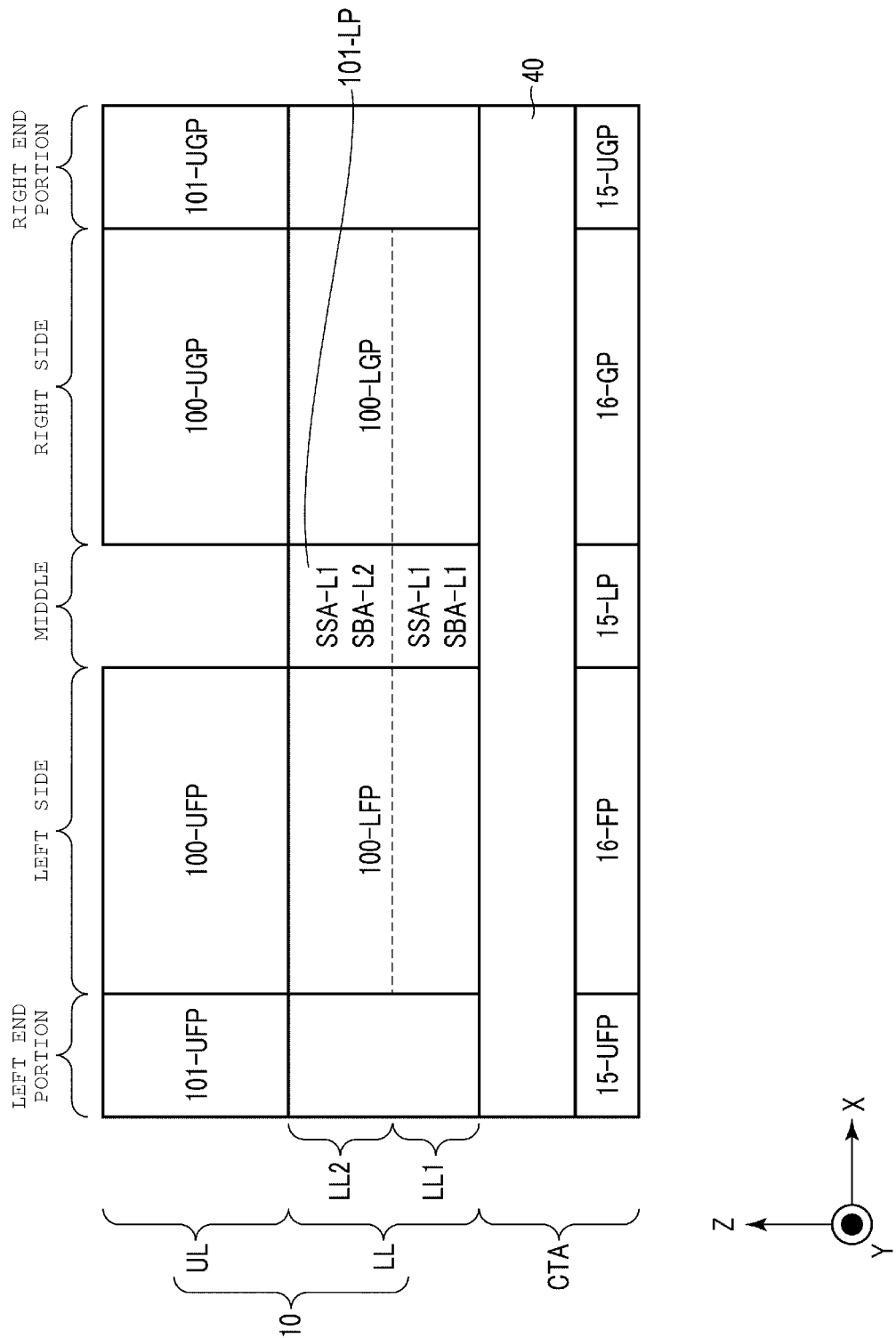
FIG. 54 illustrates another layout of the circuit region and the memory cell array in the semiconductor memory device according to the third embodiment.

However, as illustrated in FIG. 54, the connection region (lower & upper) 101-LP in the second lower layer LL2 may include a staircase region (for convenience, denoted as SSA-L1 in the drawing) having the same structure as the staircase region (first lower) SSA-L1 instead of the staircase region (second lower) SSA-L2.

Figure 55:
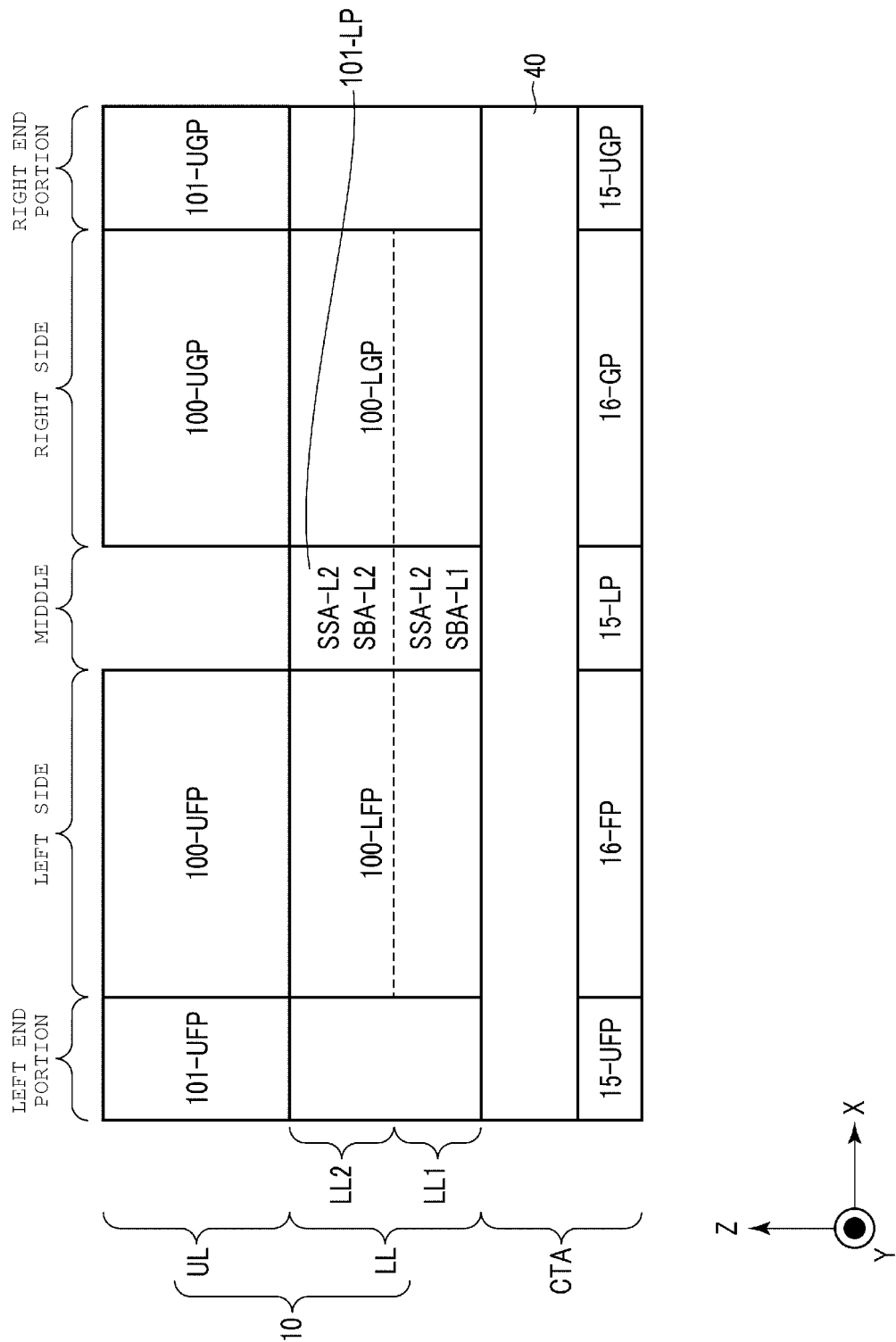
FIG. 55 illustrates another layout of the circuit region and the memory cell array in the semiconductor memory device according to the third embodiment.

As illustrated in FIG. 55, the connection region (lower & upper) 101-LP in the first lower layer LL1 may include a staircase region (for convenience, denoted as SSA-L2 in the drawing) having the same structure as the staircase region (second lower) SSA-L2 instead of the staircase region (first lower) SSA-L1.

4. Fourth Embodiment

A fourth embodiment will be described. In the fourth embodiment, another structure of the staircase region will be described.

4-1. Overview

Figure 56:
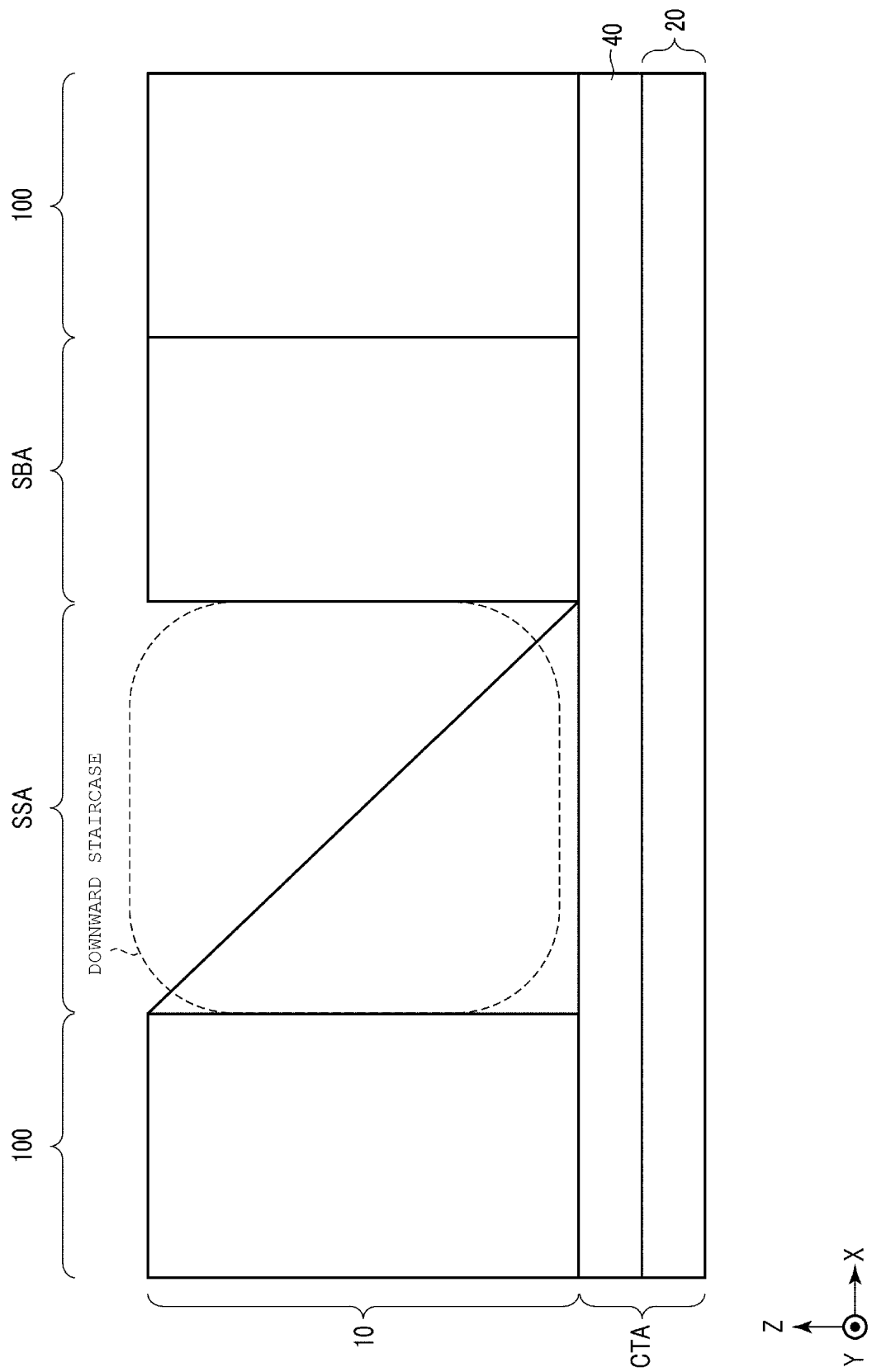
FIG. 56 is a diagram illustrating an outline of a staircase region.
Figure 57:
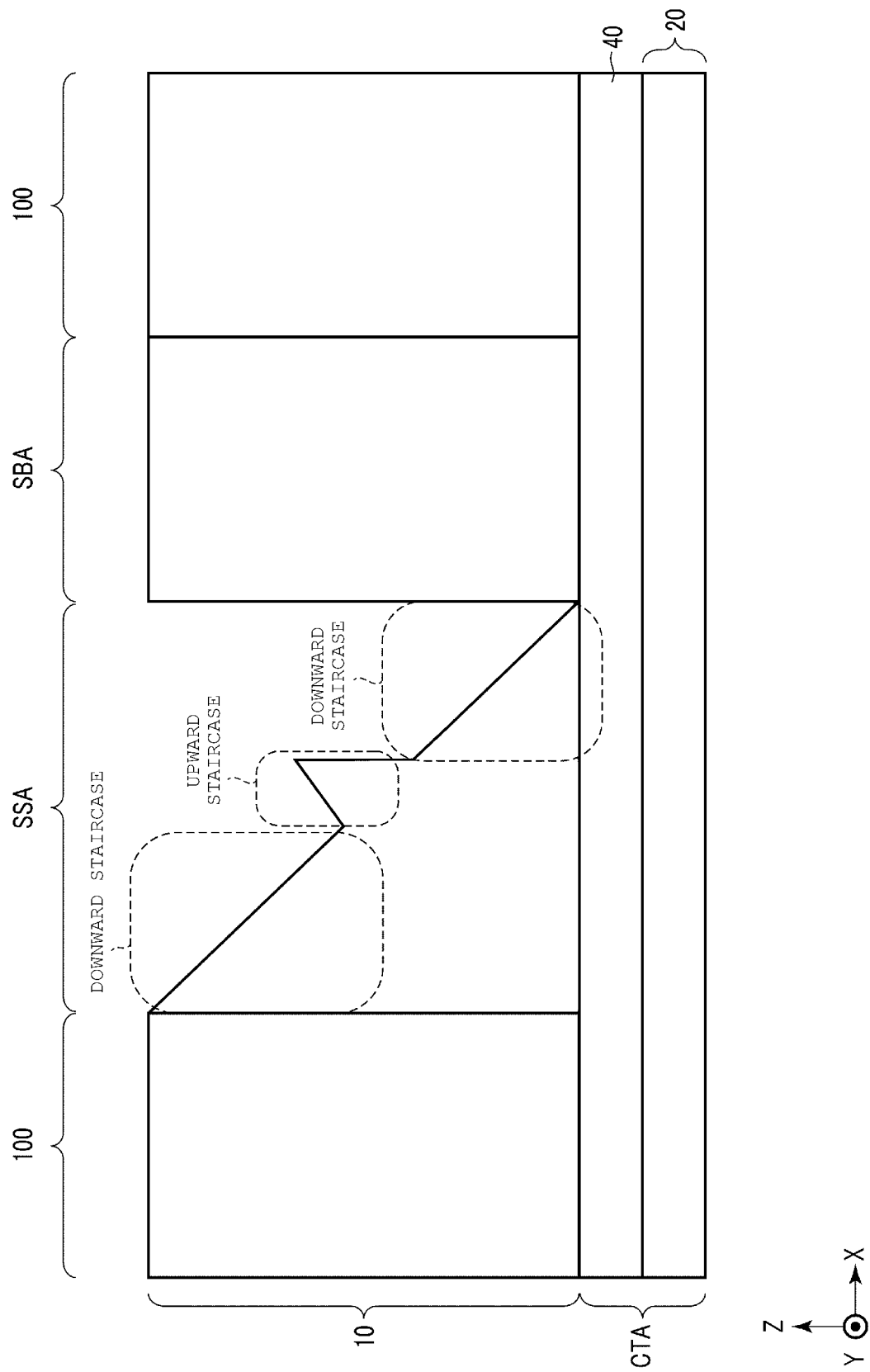
FIG. 57 is another diagram illustrating an outline of a staircase region.

In each of the embodiments described above, as illustrated in FIG. 56, the staircase region SSA is provided with a staircase (downward staircase) that goes down to the select gate line SGD, the word lines WL15 to WL0, and the select gate line SGS in the Z-direction. However, in each of the embodiments described above, as illustrated in FIG. 57, the staircase region SSA may be provided with a staircase (downward staircase) that goes down to the select gate line SGD, word lines WL15 to WL0, and select gate line SGS in the Z-direction, and a staircase (upward staircase) that goes up in the Z-direction. The upward staircase may be a dummy staircase in which no contact plug is provided, or a contact plug may be provided.

Here, the downward staircase means a staircase directing from the cell region 100 toward the direction in which the semiconductor substrate is provided, in the direction in which the subway region SBA is provided. The upward staircase means a staircase directing from the cell region 100 in the direction in which the subway region SBA is provided, in the direction opposite to the direction in which the semiconductor substrate is provided.

4-2. Specific Example

Hereinafter, a specific example of the staircase region SSA according to the fourth embodiment will be described.

Figure 58:
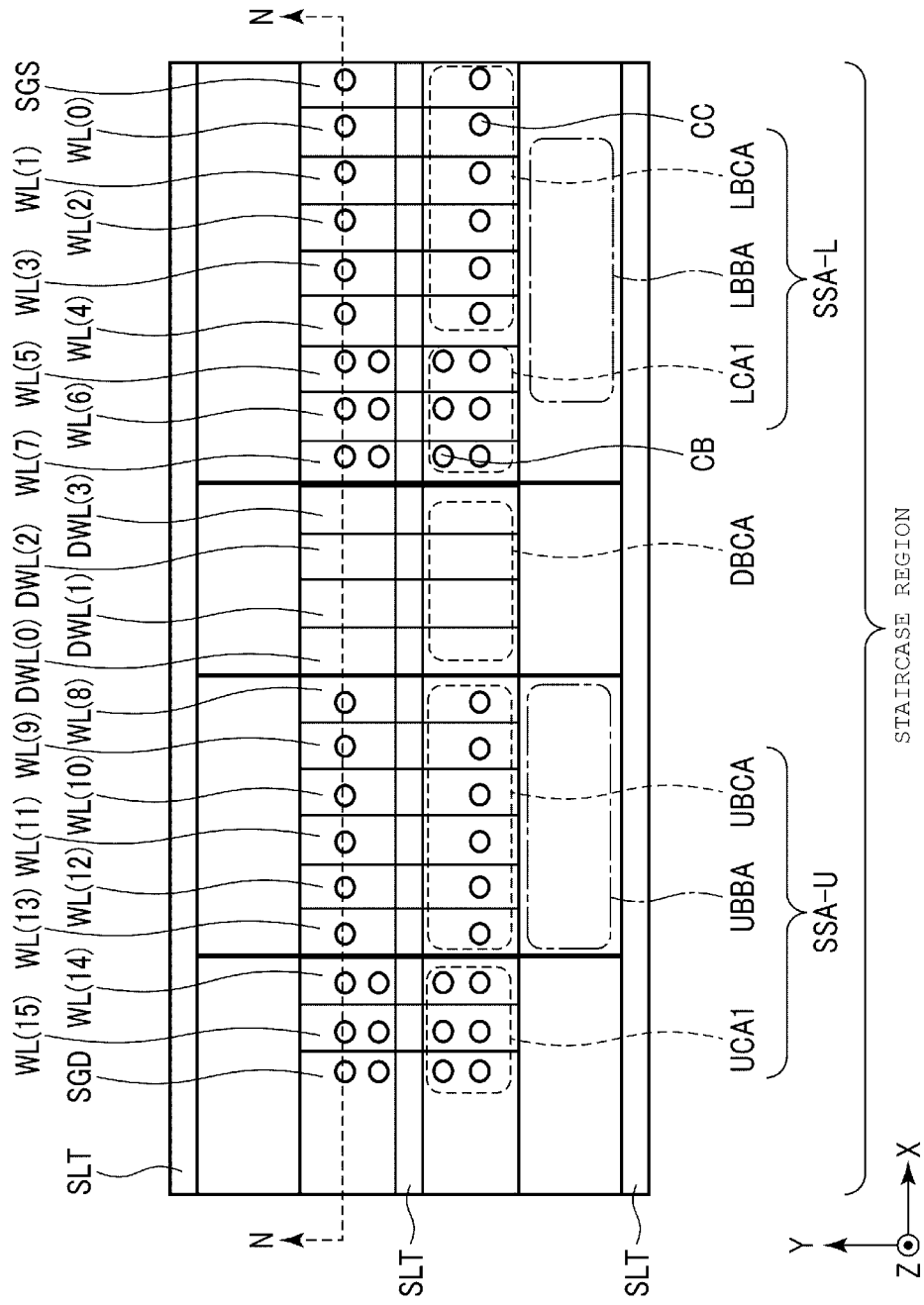
FIG. 58 is an example of a planar layout of a staircase region of a semiconductor memory device according to a fourth embodiment, and illustrates extracted two staircase regions adjacent in the Y-direction.

FIG. 58 is an example of a planar layout of the staircase region SSA of the semiconductor memory device 1 according to the fourth embodiment, and illustrates extracted two staircase regions SSA that are adjacent in the Y-direction. More specifically, FIG. 58 illustrates the staircase regions provided between the block BLK(n) and the block BLK(n−1) illustrated in FIG. 8 and FIG. 11.

Figure 59:
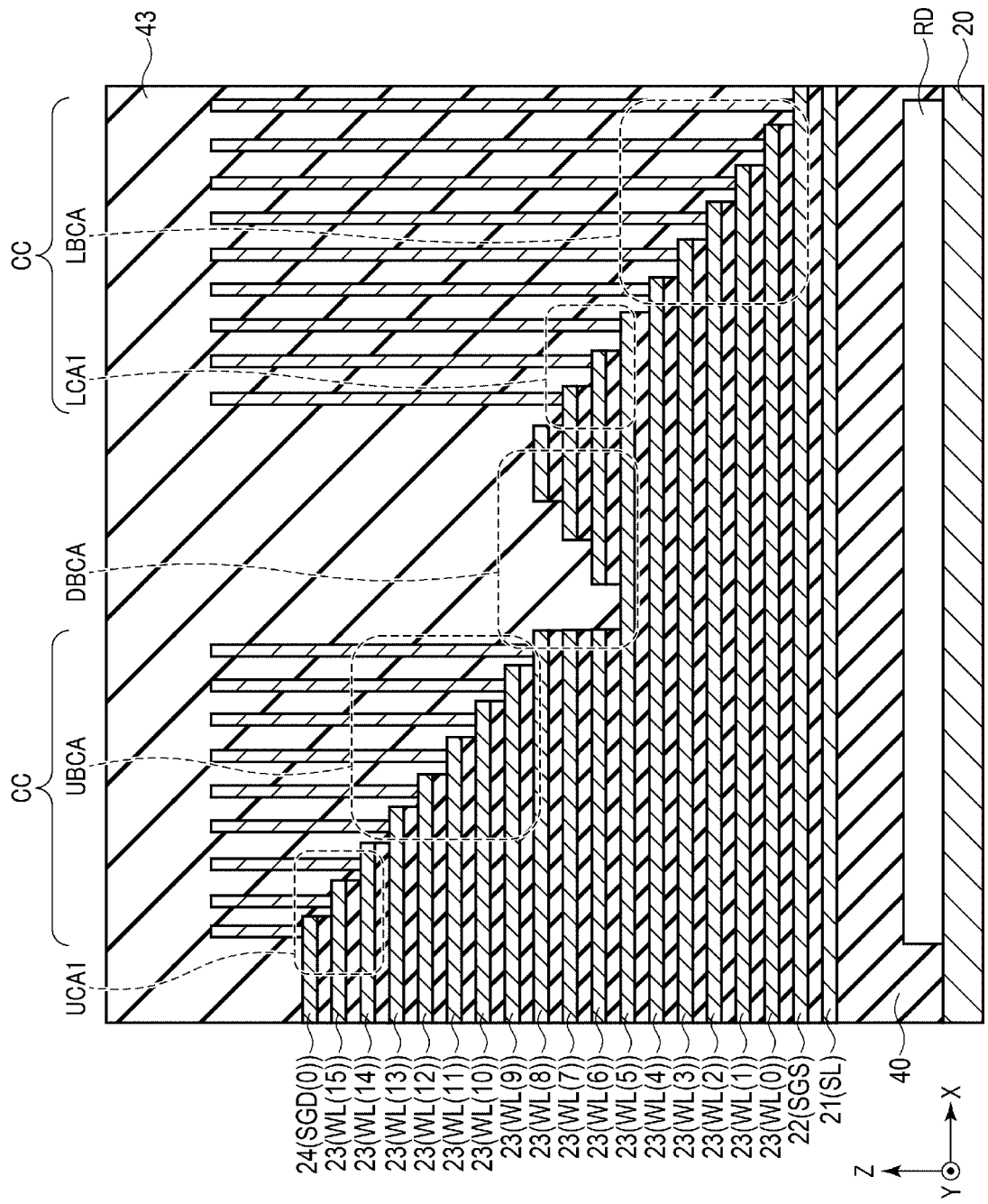
FIG. 59 is a cross-sectional view taken along line N-N in FIG. 58 and illustrates an example of the cross-sectional structure of a staircase region.

FIG. 59 is a cross-sectional view taken along line N-N in FIG. 58 and illustrates an example of the cross-sectional structure of the staircase regions.

As illustrated in FIGS. 58 and 59, the staircase region (lower) SSA-L and the staircase region (upper) SSA-U are downward staircases, respectively. A dummy staircase region DBCA is provided between the staircase region (lower) SSA-L and the staircase region (upper) SSA-U. This dummy staircase region DBCA is an upward staircase.

The dummy staircase region DBCA is provided between the staircase region (lower) SSA-L and the staircase region (upper) SSA-U, but may be provided at any place. For example, the dummy staircase region DBCA is in the staircase region (lower) SSA-L or the staircase region (upper) SSA-U. The dummy staircase region DBCA may be connected to the lower bridge region LBBA or the upper bridge region UBBA adjacent in the Y-direction. In that case, the dummy staircase region DBCA may be connected to each block via the lower bridge region LBBA or the upper bridge region UBBA. For that reason, a contact plug may be provided in the dummy staircase region DBCA.

The number of steps of the dummy staircase region DBCA may be changed as appropriate. The number of steps of the dummy staircase region DBCA may also be changed as appropriate.

5. Other Modification Examples and the Like

In the example embodiments described above, the case where the structure between two adjacent slits SLT corresponds to one string unit SU was exemplified, but the present disclosure is not limited thereto. For example, a plurality of string units SU may be formed between two adjacent slits SLT by providing a slit that divides the select gate line SGD between two adjacent slits SLT. The number of string units SU between the adjacent slits SLT changes based on the number of slits that divide the select gate line SGD.

In the embodiments described above, each of the memory pillar MP and the contact plugs CP, CV, V0, V1, and V2 may have a tapered shape or an inverted tapered shape, or may have a shape in which an intermediate portion is swollen (enlarged) with respect to end portions thereof. Similarly, the slit SLT may have a tapered shape or an inverted tapered shape, or may have a shape in which the intermediate portion is swollen with respect to end portions thereof. Although a case in which the cross-sectional structures of the memory pillar MP and the transistor TR are circular was exemplified, these cross-sectional structures may instead, or in addition, be elliptical or, in general, may be designed in any arbitrary shape without departing from the present disclosure.

In the example embodiments described above, the case where the stacked wiring such as the word line WL forms a staircase structure having a step in the X-direction in the connection region was exemplified, but the present disclosure is not limited thereto. For example, steps may be formed at the end portions of the stacked word lines WL and select gate lines SGD and SGS in the Y-direction. The end portions of the stacked word lines WL and select gate lines SGD and SGS in the connection region may be designed in a staircase shape having any number of columns. The formed staircase structure may be different among the select gate line SGS, the word line WL, and the select gate line SGD.

In this specification, the term of "connection" indicates that the different elements are electrically connected to each and does not exclude, for example, that another conductive element may be interposed therebetween. An element may be "electrically connected" by interposing an insulator as long as it can operate in the same manner as an electrically connected one. In general, the phrase "columnar shape" refers to a structure that would be provided by filling a hole formed in the manufacturing process of the semiconductor memory device 1.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
   a first memory cell region that includes a plurality of first conductor layers stacked at intervals along a first direction and a first semiconductor layer extending in the first direction through the plurality of first conductor layers;
   a second memory cell region that includes a plurality of second conductor layers stacked at intervals along the first direction and a second semiconductor layer extending in the first direction through the plurality of second conductor layers; and
   a first connection region that is between the first memory cell region and the second memory cell region in a second direction intersecting the first direction, the first connection region including:

a first bridge region in which each of a plurality of third conductor layers are stacked at intervals along the first direction and electrically connects one layer in the plurality of first conductor layers to one layer in the plurality of second conductor layers, and a first staircase region including a terrace for a first contact plug in each of the plurality of third conductor layers.

2. The semiconductor memory device according to claim 1, wherein the first staircase region is connected to the first bridge region in a third direction intersecting the first direction and the second direction.

3. The semiconductor memory device according to claim 2, wherein the first connection region further includes a first subway region adjacent to the first bridge region and the first staircase region in the second direction, the first subway region includes a second contact plug extending in the first direction through the plurality of third conductor layers.

4. The semiconductor memory device according to claim 3, wherein, in the first subway region, each of the plurality of third conductor layers electrically connects one layer of the plurality of first conductor layers to one layer of the plurality of second conductor layers.

5. The semiconductor memory device according to claim 4, further comprising:

a first slit that is adjacent to the first memory cell region, the first connection region, and the second memory cell region in the third direction;

a third memory cell region that is adjacent to the first memory cell region via the first slit in the third direction and includes a plurality of fourth conductor layers stacked at intervals along the first direction and a third semiconductor layer extending in the first direction through the plurality of fourth conductor layers;

a fourth memory cell region that is adjacent to the second memory cell region via the first slit in the third direction and includes a plurality of fifth conductor layers stacked at intervals along the first direction and a fourth semiconductor layer extending in the first direction through the plurality of fifth conductor layers; and a second connection region between the third memory cell region and the fourth memory cell region in the second direction and including:

a second bridge region in which each of a plurality of sixth conductor layers is stacked at intervals along the first direction, the second bridge region electrically connecting one layer of the plurality of fourth conductor layers to one layer of the plurality of fifth conductor layers, a second staircase region including a terrace for a third contact plug in each of the plurality of sixth conductor layers and connected to the second bridge region in the third direction, and a second subway region that is adjacent to the second bridge region and the second staircase region in the second direction with a fourth contact plug extending in the first direction through the plurality of sixth conductor layers.

6. The semiconductor memory device according to claim 5, wherein the fourth, fifth, and sixth conductor layers are the same conductor layer.

7. The semiconductor memory device according to claim 5, wherein the fourth, fifth, and sixth conductor layers are word lines or select gate lines.

8. The semiconductor memory device according to claim 5, further comprising:

a third staircase region that sandwiches the first memory cell region with the first connection region in the second direction and includes a terrace for a fifth contact plug in each of a plurality of seventh conductor layers which are stacked at intervals along the first direction;

a third connection region that is adjacent to the third staircase region in the second direction and includes a first contact region with a sixth contact plug extending in the first direction through the plurality of seventh conductor layers;

a fourth staircase region that sandwiches the third memory cell region with the second connection region in the second direction and includes a terrace for a seventh contact plug in each of a plurality of eighth conductor layers which are stacked at intervals along the first direction; and a fourth connection region that is adjacent to the fourth staircase region in the second direction and includes a second contact region with an eighth contact plug extending in the first direction through the plurality of eighth conductor layers.

9. The semiconductor memory device according to claim 8, wherein the third staircase region is adjacent to the second contact region in the third direction via the first slit, and the fourth staircase region is adjacent to the first contact region via the first slit in the third direction.

10. The semiconductor memory device according to claim 9, further comprising:

a third row decoder for the first memory cell region below the third staircase region and the second contact region in the first direction, wherein the first memory cell region and the third row decoder are connected via the fifth contact plug, the eighth contact plug, and the third staircase region; and a fourth row decoder for the third memory cell region below the fourth staircase region and the first contact region in the first direction, wherein the third memory cell region and the fourth row decoder are connected via the sixth contact plug, the seventh contact plug, and the fourth staircase region.

11. The semiconductor memory device according to claim 10, further comprising:

a third wiring connecting the fifth contact plug and the eighth contact plug; and a fourth wiring connecting the sixth contact plug and the seventh contact plug.

12. The semiconductor memory device according to claim 8, wherein the first, second, third, and seventh conductor layers are the same conductor layer.

13. The semiconductor memory device according to claim 8, wherein the first, second, third, and seventh conductor layers are word lines or select gate lines.

14. The semiconductor memory device according to claim 8, wherein the fourth, fifth, sixth, and eighth conductor layers are the same conductor layer.

15. The semiconductor memory device according to claim 5, wherein the first bridge region and the first staircase region are adjacent to the second subway region via the first slit in the third direction, and the second bridge region and the second staircase region are adjacent to the first subway region via the first slit in the third direction.

16. The semiconductor memory device according to claim 15, further comprising:
- a first row decoder for the first memory cell region and the second memory cell region below the first bridge region, the first staircase region, and the second subway region in the first direction, wherein
- the first memory cell region, the second memory cell region, and the first row decoder are connected via the fourth contact plug, the first contact plug, the first staircase region, and the first bridge region; and
- a second row decoder for the third memory cell region and the fourth memory cell region below the second bridge region, the second staircase region, and the first subway region in the first direction, wherein
- the third memory cell region, the fourth memory cell region, and the second row decoder are connected via the third contact plug, the second contact plug, the second staircase region, and the second bridge region.

17. The semiconductor memory device according to claim 16, further comprising:
- a first wiring connecting the fourth contact plug and the first contact plug; and
- a second wiring connecting the third contact plug and the second contact plug.

18. The semiconductor memory device according to claim 1, wherein the first, second, and third conductor layers are the same conductor layer.

19. The semiconductor memory device according to claim 1, wherein the first, second, and third conductor layers are word lines or select gate lines.

20. A semiconductor memory device, comprising:
- a first memory cell region that includes a plurality of first conductor layers stacked in a first direction, a first semiconductor layer extending in the first direction through the plurality of first conductor layers;
- a second memory cell region that is disposed in a second direction intersecting the first direction of the first memory cell region, and includes a plurality of second conductor layers stacked along the first direction, a second semiconductor layer extending in the first direction through the plurality of second conductor layers;
- a connection region that is disposed between the first memory cell region and the second memory cell region and includes a plurality of third conductor layers stacked in the first direction and a first contact plug electrically insulated from the plurality of third conductor layers and extending in the first direction, each of the plurality of third conductor layers electrically connecting one layer of the plurality of first conductor layers and one layer of the plurality of second conductor layers; and
- a row decoder that is disposed below the connection region and is configured to propagate a voltage to word lines of the first and second memory cell regions via the connection region electrically connected to the first contact plug of the connection region.

* * * * *